US010692688B2

(12) United States Patent
Tomimatsu et al.

(10) Patent No.: US 10,692,688 B2
(45) Date of Patent: Jun. 23, 2020

(54) CHARGED PARTICLE BEAM APPARATUS

(71) Applicant: HITACHI HIGH-TECH SCIENCE CORPORATION, Minato-ku, Tokyo (JP)

(72) Inventors: Satoshi Tomimatsu, Tokyo (JP); Makoto Sato, Tokyo (JP); Masato Suzuki, Tokyo (JP)

(73) Assignee: HITACHI HIGH-TECH SCIENCE CORPORATION (JP)

( * ) Notice: Subject to any disclaimer, the term of this patent is extended or adjusted under 35 U.S.C. 154(b) by 0 days.

(21) Appl. No.: 15/871,767

(22) Filed: Jan. 15, 2018

(65) Prior Publication Data

US 2018/0204705 A1 Jul. 19, 2018

(30) Foreign Application Priority Data

Jan. 19, 2017 (JP) .................................. 2017-007564

(51) Int. Cl.
*H01J 37/20* (2006.01)
*G01N 1/28* (2006.01)

(52) U.S. Cl.
CPC ...... *H01J 37/20* (2013.01); *G01N 2001/2873* (2013.01); *H01J 2237/208* (2013.01); *H01J 2237/221* (2013.01); *H01J 2237/28* (2013.01); *H01J 2237/31745* (2013.01); *H01J 2237/31749* (2013.01)

(58) Field of Classification Search
None
See application file for complete search history.

(56) References Cited

U.S. PATENT DOCUMENTS

| | | | | |
|---|---|---|---|---|
| 6,452,174 | B1 * | 9/2002 | Hirose | H01J 37/304 250/306 |
| 8,222,618 | B2 * | 7/2012 | Tokuda | G01N 23/225 250/492.1 |
| 9,330,883 | B2 * | 5/2016 | Nanri | H01J 37/244 |
| 9,362,088 | B2 * | 6/2016 | Sato | G01N 1/286 |
| 10,088,401 | B2 * | 10/2018 | Uemoto | G01N 1/28 |

(Continued)

FOREIGN PATENT DOCUMENTS

| | | | |
|---|---|---|---|
| JP | 5052721 | 3/1993 | |
| JP | 2008153239 | 7/2008 | |
| WO | WO-2016002719 A1 * | 1/2016 | ............... G01N 1/28 |

*Primary Examiner* — Michael J Logie
(74) *Attorney, Agent, or Firm* — Adams & Wilks

(57) ABSTRACT

A charged particle beam apparatus automatically prepares a sample piece from a sample. The apparatus includes a charged particle beam irradiation optical system that emits a charged particle beam. A sample stage with a sample placed thereon is movable relative to the charged particle beam irradiation optical system. A sample piece transferring device holds and transports a sample piece separated and extracted from the sample, and a holder fixing base holds a sample piece holder to which the sample piece is to be transferred. An electrical conduction sensor detects electrical conduction between the sample piece transferring device and an object, and a computer sets a time management mode when electrical conduction between the sample piece transferring device and the sample piece is not detected when the sample piece transferring device and the sample piece are connected to each other.

8 Claims, 22 Drawing Sheets

(56) References Cited

U.S. PATENT DOCUMENTS

| | | | |
|---|---|---|---|
| 2006/0043287 A1* | 3/2006 | Munekane | G01N 23/04 |
| | | | 250/307 |
| 2007/0089528 A1* | 4/2007 | Moore | G01L 5/226 |
| | | | 73/795 |
| 2009/0320624 A1* | 12/2009 | Amador | H01J 37/20 |
| | | | 73/866.5 |
| 2015/0255250 A1* | 9/2015 | Sato | G01N 1/286 |
| | | | 250/307 |
| 2017/0122852 A1* | 5/2017 | Uemoto | G01N 1/28 |
| 2018/0204705 A1* | 7/2018 | Tomimatsu | H01J 37/20 |

* cited by examiner

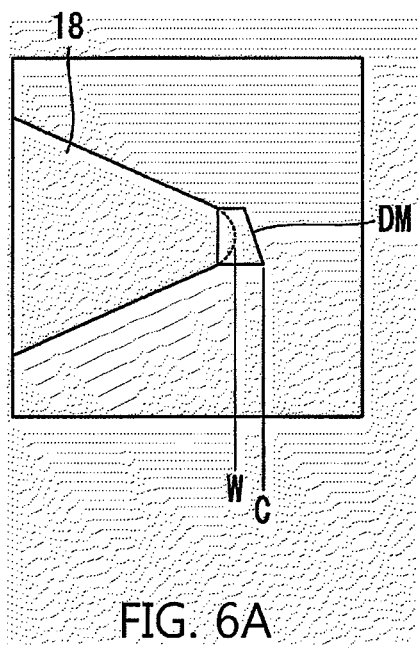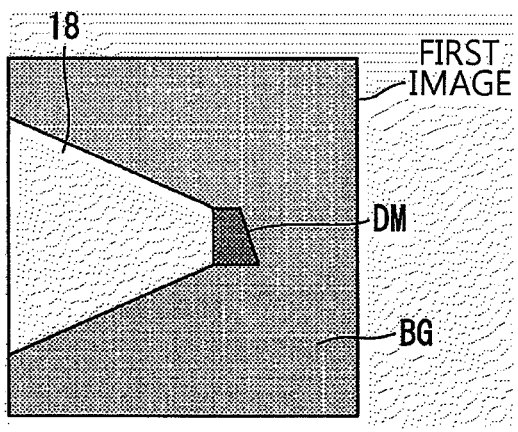
FIG. 6A  FIG. 6B
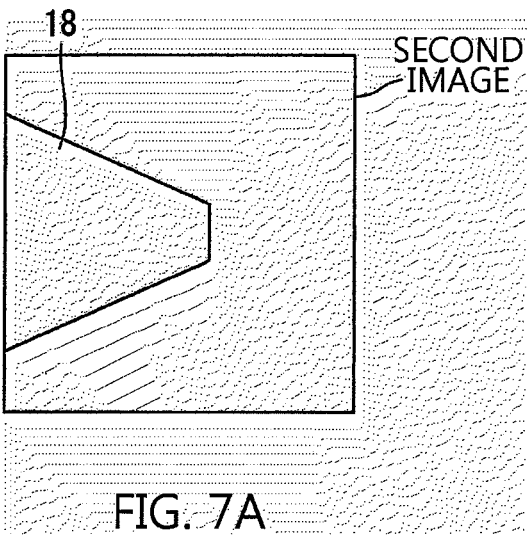
FIG. 7A

CHARGED PARTICLE BEAM APPARATUS

CROSS REFERENCE TO RELATED APPLICATION(S)

This application claims the benefit of Japanese Patent Application No. 2017-007564, filed Jan. 19, 2017, which is hereby incorporated by reference in its entirety into this application.

BACKGROUND OF THE INVENTION

1. Technical Field

The present invention generally relates to a charged particle beam apparatus.

2. Description of the Related Art

There is a known apparatus that extracts a sample piece formed by irradiating a sample with a charged particle beam composed of electrons or ions and which processes the sample piece into a suitable shape for various processes, such as observation, analysis, and measurement by a scanning electron microscope (SEM) or a transmission electron microscope (TEM) (for example, refer to Patent Documents 1 and 2).

DOCUMENTS OF RELATED ART

Patent Document (Patent Document 1) Japanese Patent Application Publication No. H5-052721
(Patent Document 2) Japanese Patent Application Publication No. 2008-153239

SUMMARY OF THE INVENTION

In the present specification, the term 'sampling' refers to a process of extracting a sample piece by irradiating a sample with a charged particle beam and processing the sample piece to have a suitable form for various processes such as observation, analysis, and measurement, and, more specifically, refers to a process of transferring a sample piece prepared by irradiating a sample with a focused ion beam (FIB) to a sample piece holder.

To date, a technology for automatically sampling sample pieces has not been sufficiently established.

A cause of obstructing automatic continuous sampling will be described below. When it is not confirmed whether a sample piece is conductive or non-conductive in a process of extracting a sample piece using a needle which is typically used for extraction or transportation of a sample piece and in a process of transferring the extracted sample piece to a columnar portion of a sample piece holder, each of the processes cannot be appropriately and efficiently completed.

For example, when determining whether connection or separation of a needle and a sample piece is completed or whether connection or separation of a sample piece held by a needle and a columnar portion of a sample piece holder is completed, it is difficult to obtain a reliable determination result only by determining conduction or non-conduction between the needle and the sample piece or between the needle and the columnar portion in the case where it is not confirmed whether the sample piece is conductive or non-conductive. Furthermore, when the determination on the connection or the separation is made only based on a determination result of whether or not a predetermined process time has elapsed without considering a determination result of whether the needle and the sample piece are actually electrically connected or disconnected, it is difficult to reduce a time required for the determination on the connection or the separation and the reliability of the determination result is deteriorated. This situation obstructs repetitive automatic continuous sampling that is originally intended.

The present invention has been made in view of the above problems, and an objective of the present invention is to provide a charged particle beam apparatus capable of automatically performing an operation of extracting a sample piece formed by processing a sample with an ion beam and of transferring the sample piece to a sample piece holder.

(a) According to one aspect of the present invention, there is provided a charged particle beam apparatus for automatically preparing a sample piece from a sample, the charged particle beam apparatus including: a charged particle beam irradiation optical system configured to emit a charged particle beam; a sample stage configured to move with the sample placed thereon; a sample piece transferring device configured to hold and transport the sample piece separated and extracted from the sample; a holder fixing base configured to hold a sample piece holder to which the sample piece is to be transferred; an electrical conduction sensor configured to detect electrical conduction between the sample piece transferring device and an object; and a computer configured to set a time management mode in which whether or not a predetermined process time for which a predetermined process is continued has elapsed is determined, as a determination of whether or not the sample piece transferring device and the sample piece are connected to each other or separated from each other in a process in which the sample piece transferring device and the sample piece are connected to each other or separated from each other, and as a determination of whether or not the sample piece held by the sample piece transferring device and the sample piece holder are connected to each other or separated from each other in a process in which the sample piece held by the sample piece transferring device and the sample piece holder are connected to each other or separated from each other, in a case where electrical conduction between the sample piece transferring device and the sample piece is not detected by the electrical conduction sensor when the sample piece transferring device and the sample piece are connected to each other.

(2) According to one aspect of the present invention, in the charged particle beam apparatus described in (1), wherein the computer cancels the time management mode in a case where electrical conduction between the sample piece transferring device and the sample piece holder is detected by the electrical conduction sensor, when the sample piece held by the sample piece transferring device and the sample piece holder are connected to each other in a state in which the time management mode is set.

(3) According to one aspect of the present invention, in the charged particle beam apparatus described in (1) or (2), wherein the computer sets the time management mode in a case where electrical conduction between the sample piece transferring device and the sample piece holder is not detected by the electrical conduction sensor, when the sample piece held by the sample pieced transferring device and the sample piece holder are connected to each other in a state in which the time management is not set.

(4) According to one aspect of the present invention, in the charged particle beam apparatus described in any one of (1) to (3), wherein when an image of the sample piece or the sample piece holder is acquired by irradiating the sample piece or the sample piece holder with the charged particle beam in a state in which the time management mode is set, the computer enhances contrast of the image as compared with an image acquired in a state in which the time management mode is not set.

(5) According to one aspect of the present invention, in the charged particle beam apparatus described in any one of (1) to (4), wherein when the time management mode is set, the computer at least stores or outputs information indicating the state in which the time management mode is set, or records the information on an object by irradiating the object with the charged particle beam.

(6) According to one aspect of the present invention, in the charged particle beam apparatus described in any one of (1) to (5), wherein when connecting the sample piece transferring device and the object, in a case where electrical conduction between the sample piece transferring device and the object is detected by the electrical conduction sensor, the computer sets a conduction management mode in which whether or not the sample piece transferring device and the object are connected to each other or whether or not the sample piece transferring device and the object are separated from each other is determined by determining whether or not electrical conduction is detected between the sample piece transferring device and the object during the process in which the sample piece transferring device and the object are connected to each other or during the process in which the sample pieced transferring device and the object are separated from each other.

(7) According to one aspect of the present invention, in the charged particle beam apparatus described in any one of (1) to (6), wherein: the sample piece transferring device includes a needle configured to hold and transport the sample piece separated and extracted from the sample and a needle driving mechanism configured to drive the needle; and the electrical conduction sensor detects at least any one among electrical resistance, current, and electrical potential as an electrical characteristic between the needle and the sample piece holder or an electrical characteristic between the needle and the columnar portion.

(8) According to one aspect of the present invention, the charged particle beam apparatus described in (7) further includes a gas supply unit configured to supply gas for formation of a deposition film so that the deposition film is formed through irradiation of the charged particle beam, wherein: the computer controls the charged particle beam irradiation optical system, the needle driving mechanism, and the gas supply unit such that the needle is first brought close to the sample piece, and the needle and the sample piece are then connected by the deposition film when the sample piece transferring device and the sample piece are connected to each other; and the computer controls the charged particle beam irradiation optical system, the needle driving mechanism, and the gas supply unit such that the sample piece held by the needle is first brought close to the sample piece holder, and the sample piece held by the needle and the sample piece holder are then connected by the deposition film when the sample piece held by the sample piece transferring device and the sample piece holder are connected to each other.

As described above, according to the present invention, since the time management mode is set when electrical conduction between the sample piece transferring device and the sample piece is not detected, even when it is not confirmed whether the sample piece is conductive or nonconductive, it is possible to appropriately and effectively perform the process of connecting or separating the sample piece transferring device and the sample piece and the process of connecting or separating the sample piece held by the sample piece transferring device and the sample piece holder. Thereby, it is possible to perform the automatic continuous sampling operation of extracting the sample piece formed by processing the sample with the focused ion beam and transferring the sample piece to the sample piece holder.

BRIEF DESCRIPTION OF THE DRAWINGS

FIGS. 6A and 6B are schematic diagrams used to describe the tip (actual tip) of a needle repeatedly used in the charged particle beam apparatus according to the embodiment of the present invention, in which FIG. 6A is a schematic diagram illustrating the actual tip of the needle and FIG. 6B is a schematic diagram illustrating a first image obtained based on an absorption current signal;

FIGS. 7A and 7B are schematic diagrams of a secondary electron image formed by an electron beam irradiated from the tip of the needle of the charged particle beam apparatus according to the embodiment of the present invention, in which FIG. 7A is a schematic diagram illustrating a second image acquired by extracting a brighter region than the background from an image and FIG. 7B is a schematic diagram illustrating a third image acquired by extracting a darker region than the background;

DESCRIPTION OF THE PREFERRED EMBODIMENTS

Hereinafter, a charged particle beam apparatus capable of automatically preparing a sample piece, according to one embodiment of the present invention, will be described with reference to the accompanying drawings.

Figure 1:
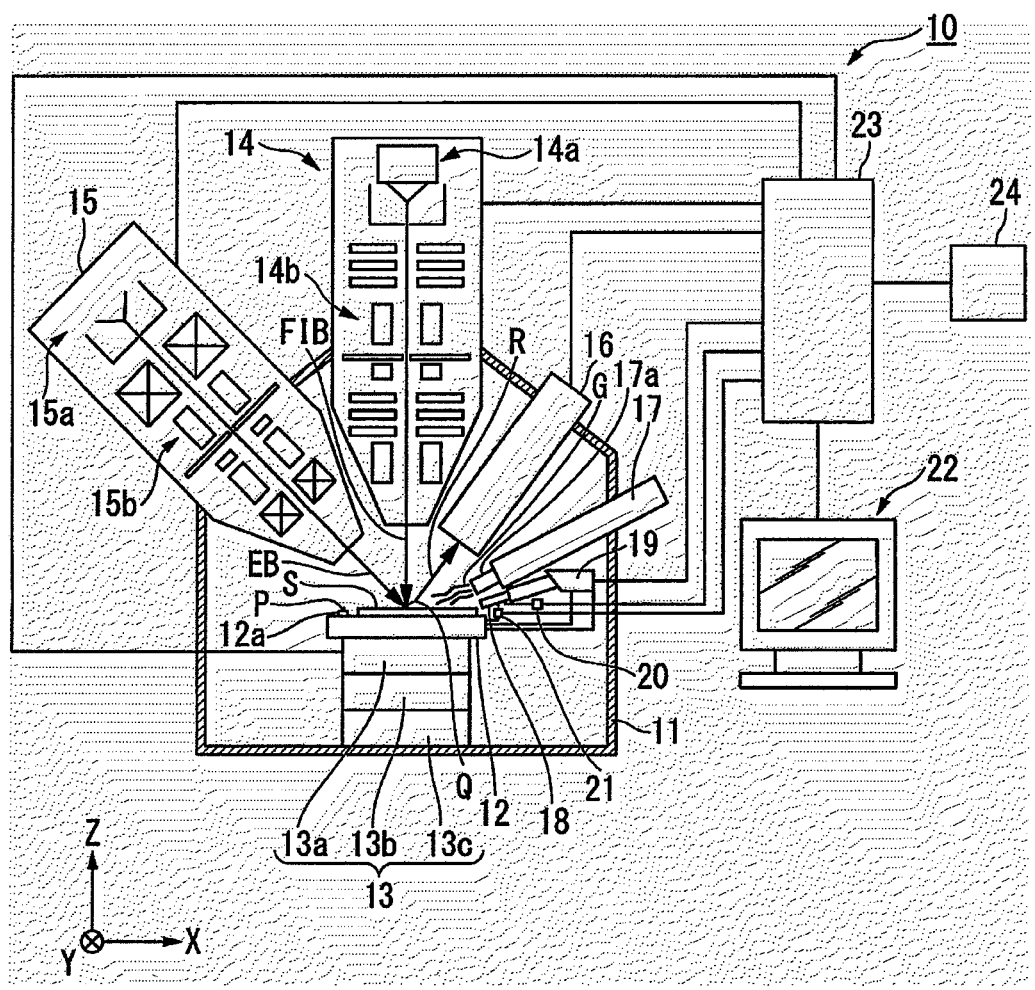
FIG. 1 is a diagram illustrating the construction of a charged particle beam apparatus according to one embodiment of the present invention.

FIG. 1 is a diagram illustrating the construction of a charged particle beam apparatus 10 according to one embodiment of the present invention. As illustrated in FIG. 1, the charged particle beam apparatus 10 according to the embodiment of the present invention includes a sample chamber 11 that can maintain the inside space of the charged particle beam apparatus in a vacuum state, a stage 12 that can fix a sample S and a sample piece holder P inside the sample chamber 11, and a stage driving mechanism 13 that drives the stage 12. The charged particle beam apparatus 10 is equipped with a focused ion beam irradiation optical system 14 that irradiates an irradiation target disposed within a predetermined irradiation region (i.e. scanning range) in the sample chamber 11, with a focused ion beam (FIB). The charged particle beam apparatus 10 is equipped with an electron beam irradiation optical system 15 that irradiates an irradiation target disposed within a predetermined irradiation region in the sample chamber 11, with an electron beam (EB). The charged particle beam apparatus 10 is equipped with a detector 16 that detects secondary charged particles (secondary electrons, secondary ions, or the like) R generated from the irradiation target when the irradiation target is irradiated with a focused ion beam or an electron beam. The charged particle beam apparatus 10 is equipped with a gas supply unit 17 that supplies gas G to the surface of the irradiation target. The gas supply unit 17 is specifically a nozzle 17a having an outer diameter of about 200 μm. The charged particle beam apparatus 10 includes: a needle 18 that extracts a fine sample piece Q from the sample S fixed to the stage 12, holds the sample piece Q, and transfers the sample piece Q to the sample piece holder P; a needle driving mechanism 19 that drives the needle 18 to transport the sample piece Q; and an absorption current detector 20 that detects an inflow current (also referred to as an absorption current) of a charged particle beam flowing into the needle 18, and transmits an inflow current signal to a computer 23 so as to be imaged as an image. The charged particle beam apparatus 10 includes a needle electrical conduction sensor 21 detecting an electrical characteristic associated with electrical conduction between the needle 18 and the stage 12. The needle electrical conduction sensor 21 includes, for example, an ohmmeter or the like installed between the needle 18 and the stage 12, detects an electrical resistance value as the electrical characteristic associated with electrical conduction between the needle 18 and the sample piece holder P or between the needle 18 and the sample S fixed to the stage 12, and transmits an electrical resistance value signal to the computer 23. When the electrical resistance value detected by the electrical conductance sensor 21 is greater than a predetermined electrical resistance value, the computer 23 determines that electrical conduction does not occur between the needle 18 and the sample S fixed to the stage 12 or between the needle 18 and the sample piece holder P. When the electrical resistance value detected by the electrical conductance sensor 21 is equal to or less than the predetermined electrical resistance value, the computer 23 determines that the needle 18 and the sample S fixed to the stage 12 or the sample piece holder P are electrically connected with each other.

Here, the needle electrical conduction sensor 21 may not be limited to the ohmmeter detecting electrical resistance but may be any device that can detect any electrical characteristic such as current or voltage between the needle 18 and the sample S fixed to the stage 12 or the sample piece holder P.

The needle 18 and the needle driving mechanism 19 can be collectively referred to as a sample piece transferring device. The charged particle beam apparatus 10 includes a display device 22 that displays image data or the like based on the secondary charged particles R detected by the detector 16, the computer 23, and an input device 24.

The irradiation targets of the focused ion beam irradiation optical system 14 and the electron beam irradiation optical system 15 are the sample S fixed to the stage 12, the sample piece Q, and the sample piece holder P or the needle 18 disposed in an irradiation region.

The charged particle beam apparatus 10 according to the embodiment can perform various processes (etching, trimming, or the like) through imaging or sputtering an irradiation target and form a deposition film or the like by irradiating the surface of the irradiation target with a focused ion beam. The charged particle beam apparatus 10 can perform a process of forming a sample piece Q (for example, a lamella, a needle-like sample, or the like) for transmission electron microscopic observation or forming an analysis sample piece for analysis using an electron beam, from a sample S. The charged particle beam apparatus 10 can perform a process of transforming the sample piece Q transferred to the sample piece holder P into a thin film having a desired thickness (for example, 5 to 100 nm, etc.) suitable for transmission electron microscopic observation. The charged particle beam apparatus 10 can perform a process of observing the surface of an irradiation target by irradiating the surface of the irradiation target such as the sample piece Q and the needle 18 with a focused ion beam or an electron beam while scanning the focused ion beam or the electron beam.

The absorption current detector 20 includes a preamplifier to amplify the inflow current flowing into the needle and transmits the amplified inflow current to the computer 23. A needle-shaped absorption current image can be displayed on the display device 22, based on the inflow current flowing into the needle and detected by the absorption current detector 20 and based on a signal synchronized with the scanning of the charged particle beam so that the shape of the needle or the position of the tip of the needle can be determined.

Figure 2:
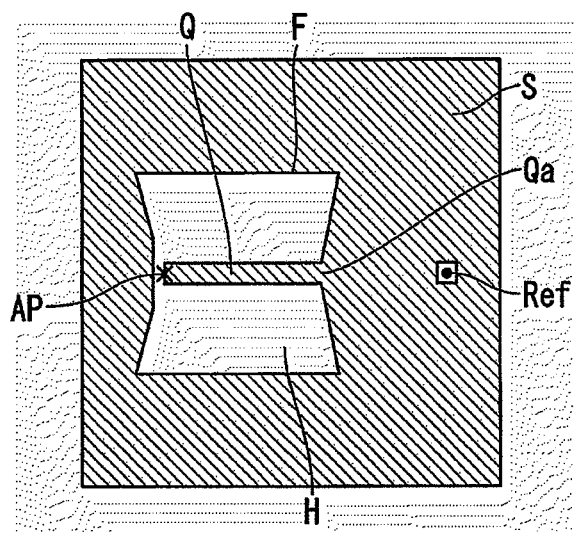
FIG. 2 is a plan view illustrating a sample piece before being extracted from a sample in the charged particle beam apparatus according to the embodiment of the present invention.

FIG. 2 is a plan view illustrating the sample piece Q that is formed by irradiating the surface of a sample S (hatched portion) with a focused ion beam and which is not yet extracted from the sample S, in the charged particle beam apparatus 10 according to the embodiment of the present invention. Reference symbol F denotes a processing range of a focused ion beam, i.e., a scanning range of a focused ion beam, and a portion (white portion) inside the processing range is a processing region H which is sputtered by the focused ion beam and thus etched. Reference symbol Ref denotes a reference mark (reference point) indicating a position at which the sample piece Q is formed (i.e. a portion not etched but left). For example, the reference mark (reference point) Ref is a fine hole of 30 nm (for example, a square hole being 1 μm long at each side thereof) that is formed in a deposition film by a focused ion beam and which can be easily recognized due to its high contrast in an image formed by a focused ion beam or an electron beam. The deposition film is used for coarse detection of the position of the sample piece Q, and the fine hole is used for finely controlled positioning. In the sample S, most of the periphery of a sample piece Q, for example, at both sides and a lower end of the sample piece Q, is etched away but a support portion Qa connected to the sample S remains. The sample piece Q is cantilevered to the sample S by the support portion Qa. The sample piece Q is a minute sample piece having a length (dimension in the longitudinal direction) of, for example, about 10 μm, 15 μm, or 20 μm, and a width (thickness) of about 500 nm, 1 μm, 2 μm, or 3 μm.

The sample chamber 11 is constructed such that the interior thereof can be vacuumed to a desired vacuum state by an air exhauster (not shown) and can be maintained at the desired vacuum state.

The stage 12 holds the sample S. The stage 12 includes a holder fixing base 12a that holds the sample piece holder P. The holder fixing base 12a may have a structure capable of supporting a plurality of sample piece holders P mounted thereon.

Figures 3, 4:
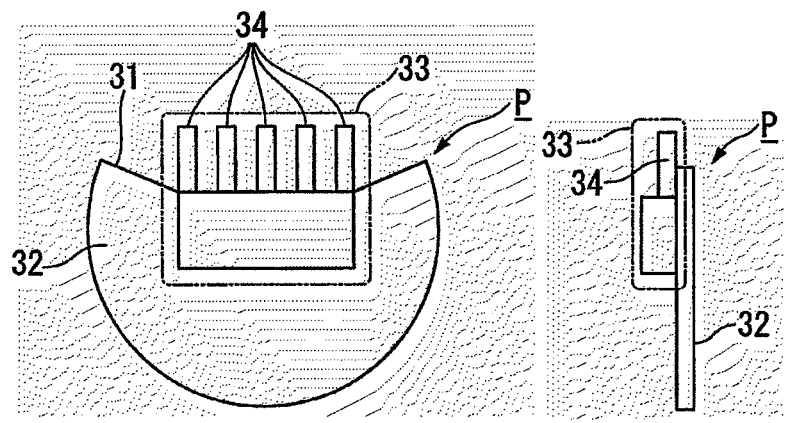
FIG. 3 is a plan view illustrating a sample piece holder of the charged particle beam device according to the embodiment of the present invention.
FIG. 4 is a side view illustrating the sample piece holder of the charged particle beam apparatus according to the embodiment of the present invention.

FIG. 3 is a plan view of the sample piece holder P and FIG. 4 is a side view of the sample piece holder P. The sample piece holder P includes a substantially semicircular plate-like base portion 32 having a cutout portion 31, and a sample base 33 fixed to the cutout portion 31. The base portion 32 is made of, for example, metal in the form of a circular plate having a diameter of 3 mm and a thickness of 50 μm. The sample base 33 is formed from, for example, a silicon wafer through a semiconductor manufacturing process, and is attached to the cutout portion 31 via a conductive adhesive. The sample base 33 has a comb shape with a plurality of (for example, five, ten, fifteen, twenty, etc.) teeth that are protrusions arranged to be spaced from each other. The sample base 33 has a plurality of columnar portions (hereinafter also referred to as pillars) 34 to which the sample pieces Q are to be transferred.

The columnar portions 34 have respectively different widths. Images of the sample pieces Q transferred to the respective columnar portions 34 and images of the columnar portions 34 are respectively associated with each other, and are stored in the computer 23 in association with the corresponding sample piece holders P. Therefore, even when a large number of sample pieces Q are produced from one sample S, the sample pieces Q can be recognized without fail. Furthermore, an analysis target sample piece Q to undergo a subsequent transmission electron microscopic analysis or the like can be accurately aligned with the exact position in the sample S, at which the analysis target sample piece Q is extracted from the sample S. Each columnar portion 34 has a tip portion having a thickness of 10 μm or less or a thickness of 5 μm or less, and holds the sample piece Q attached to the tip portion.

The base portion 32 is not limited to the circular plate shape having a diameter of 3 mm and a thickness of 50 μm as described above, but may be a rectangular plate shape having a length of 5 mm, a height of 2 mm, a thickness of 50 μm. That is, the shape of the base portion 32 may be a shape that can be mounted on the stage 12 to be introduced into a transmission electron microscope in a subsequent process, or a shape by which all of the sample pieces Q mounted on the sample base 33 can be disposed within a movable range of the stage 12. When the base portion 32 has the shape described above, all the sample pieces Q mounted on the sample base 33 can be observed with a transmission electron microscope (TEM).

The stage driving mechanism 13 is housed inside the sample chamber 11 in a state of being connected to the stage 12, and moves the stage 12 along a predetermined axis in accordance with a control signal output from the computer 23. The stage driving mechanism 13 includes a moving mechanism 13a that moves the stage 12 in a direction parallel to at least X and Y axes that are in parallel with a horizontal plane and which are orthogonal to each other and in a direction parallel to a Z axis orthogonal to each of the X and Y axes. The stage driving mechanism 13 includes a tiling mechanism 13b that tilts the stage 12 about the X axis or the Y axis and a rotating mechanism 13c that rotates the stage 12 about the Z axis.

The focused ion beam irradiation optical system 14 is fixed to the sample chamber 11 in a state in which a beam emission portion (not shown) thereof is disposed inside the sample chamber 11 and is arranged to face the stage 12 disposed within an irradiation region, directly from above the stage 12, and in a state in which an optical axis thereof is in parallel with a vertical direction. Thereby, it is possible to irradiate the irradiation targets such as the sample S placed on the stage 12, the sample piece Q, and the needle 18 staying within the irradiation region, with a focused ion beam emitted downward in the vertical direction, i.e., emitted from directly above the irradiation targets. Further, the charged particle beam apparatus 10 may be equipped with a different ion beam irradiation optical system instead of the focused ion beam irradiation optical system 14 described above. The ion beam irradiation optical system is not limited to an optical system that generates a focused beam. The ion beam irradiation optical system may be, for example, a projection type ion beam irradiation optical system that is equipped with a stencil mask having a standard opening and being disposed in an optical system and which forms a shaped beam having a shape identical to the shape of the opening of the stencil mask. With the use of the projection type ion beam irradiation optical system, it is possible to accurately form a shaped beam having a shape corresponding to a processing region around a sample piece Q and to shorten a process time.

The focused ion beam irradiation optical system 14 includes an ion source 14a that generates ions and an ion optical system 14b that focuses and deflects the ions emitted from the ion source 14a. The ion source 14a and the ion optical system 14b are controlled in accordance with a control signal output from the computer 23. Further, irradiation positions, irradiation conditions, etc. of a focused ion beam are controlled by the computer 23. The ion source 14a is, for example, a liquid metal ion source or a plasma type ion source, which uses liquid gallium or the like, a field ionization type gas ion source, or the like. The ion optical system 14b includes, for example, a first electrostatic lens such as a condenser lens, an electrostatic deflector, a second electrostatic lens such as an objective lens, and the like. In the case where a plasma type ion source is used as the ion source 14a, high processing speed can be realized due to a large current beam. Therefore, a plasma type ion source is suitable for sampling sample pieces from a large sample S.

The electron beam irradiation optical system 15 is fixed to the sample chamber 11 in a state in which a beam emission portion (not shown) thereof is disposed inside the sample chamber 11 and is oriented toward the stage 12 disposed within an irradiation region while being inclined at a predetermined angle (for example, 60°) with respect to the vertical direction, and in which an optical axis thereof is in parallel with the inclined direction. Thereby, it is possible to irradiate irradiation targets such as the sample S fixed to the state 12, the sample piece Q, and the needle 18 staying within the irradiation region, with an electron beam emitted obliquely from above the irradiation targets.

The electron beam irradiation optical system 15 includes an electron source 15a that generates electrons and an electron optical system 15b that focuses and deflects the electrons emitted from the electron source 15a. The electron source 15a and the electron optical system 15b are controlled in accordance with a control signal output from the computer 23. Further, irradiation positions and irradiation conditions of the electron beam are controlled by the computer 23. The electron optical system 15b includes, for example, an electromagnetic lens, a deflector, and the like.

Alternatively, the positions of the electron beam irradiation optical system 15 and the focused ion beam irradiation optical system 14 may be switched so that the electron beam irradiation optical system 15 may be arranged in the vertical direction and the focused ion beam irradiation optical system 14 may be inclined at a predetermined angle with respect to the vertical direction.

The detector 16 detects the intensity (i.e., amount) of secondary charged particles (i.e., secondary electrons and secondary ions) R emitted from the irradiation targets such as the sample S, the needle 18, and the like when the irradiation targets are irradiated by a focused ion beam or an electron beam, and outputs information of the detected amount of the secondary charged particles R. The detector 16 is disposed at a position where the amount of the secondary charged particles R can be detected inside the sample chamber 11. For example, the detector 16 may be disposed at a position obliquely above the irradiation target such as the sample S disposed within the irradiation region, and is fixed to the sample chamber 11.

The gas supply unit 17 is fixed to the sample chamber 11, has a gas ejection unit (also referred to as a nozzle) disposed inside the sample chamber 11, and is arranged to face the stage 12. The gas supply unit 17 can supply the sample S with an etching gas that selectively promotes etching of the sample S when a focused ion beam is irradiated to the sample S, in accordance with the material of the sample S, or with a deposition gas that forms a deposition film of a metal or an insulator on the surface of the sample S. For example, when an etching gas such as xenon fluoride for etching a silicon-based sample S or water for etching an organic sample S is supplied to the sample S while a focused image beam is being irradiated to the sample 5, an etching rate is material-selectively promoted. Further, for example, when a deposition gas containing platinum, carbon, tungsten or the like is supplied to the sample S while a focused ion beam is being irradiated to the sample S, a solid component decomposed from the deposition gas can be accumulated (deposited) on the surface of the sample S. Specific examples of the deposition gas include: carbon-containing gases such as phenanthrene, naphthalene, and pyrene; platinum-containing gases such as trimethyl ethylcyclopentadienyl platinum; and tungsten-containing gases such as tungsten hexacarbonyl. Depending on the supplied gas, it is also possible to perform etching or deposition with the supplied gas even in the case where an electron beam is irradiated to the sample S. However as the deposition gas used in the charged particle beam apparatus 10 of the present invention, a carbon-containing gas such as phenanthrene, naphthalene, or pyrene is most suitable in terms of deposition speed and reliable adhesion to the sample piece Q and the needle 18. Any one of those gases is preferably used.

The needle driving mechanism 19 is housed inside the sample chamber 11 in a state where the needle 18 is attached thereto, and displaces the needle 18 in accordance with a control signal output from the computer 23. The needle driving mechanism 19 is integrally provided with the stage 12, and thus moves in company with the stage 12 when the stage 12 is rotated about a tilt axis (i.e., the X axis or the Y axis) by the tilting mechanism 13b. The needle driving mechanism 19 includes a moving mechanism (not shown) that moves the needle 18 in a direction parallel to each of the three-dimensional coordinate axes and a rotating mechanism (not shown) that rotates the needle 18 about the central axis of the needle 18. Moreover, the three-dimensional coordinate axes are independent from a three-dimensional rectangular coordinate system of the sample stage 12. In a three-dimensional rectangular coordinate system with two-dimensional coordinate axes parallel to the surface of the stage 12, when the surface of the stage is in a tilted state or a rotated state, the coordinate system is tilted or rotated.

The computer 23 controls at least the stage driving mechanism 13, the focused ion beam irradiation optical system 14, the electron beam irradiation optical system 15, the gas supply unit 17, and the needle driving mechanism 19.

The computer 23 is disposed outside the sample chamber 11, and is connected with the display device 22 and the input device 24 such as a mouse or a keyboard which outputs a signal in accordance with the input of an operator.

The computer 23 controls the overall operation of the charged particle beam device 10 in accordance with a signal output from the input device 24 or a signal generated through a preset automatic operation control process or the like.

The computer 23 converts the detection amount of the secondary charged particles R detected by the detector 16 into a luminance signal associated with a corresponding irradiation position while scanning irradiation positions of a charged particle beam and generates image data indicating the shape of the irradiation target by using the two-dimensional distribution of the detection amounts. In absorption current image mode, the computer 23 detects an absorption current flowing into the needle 18 while scanning the irradiation positions of the charged particle beam, thereby generating absorption current image data indicating the shape of the needle 18, based on the two-dimensional distribution (absorption current image) of the absorption current. The computer 23 causes the display device 22 to display image data of each image and screens for executing operations such as enlargement, reduction, movement, and rotation of the image data. In addition, the computer 23 causes the display device 22 to display a screen for various settings, such as mode selection and process settings, for automatic sequence control.

The charged particle beam apparatus 10 according to the embodiment of the present invention has the construction described above, and the operation of the charged particle beam apparatus 10 will be described below.

Hereinafter, the operation of automatic sampling performed by the computer 23, i.e., the operation of automatically transferring the sample piece Q formed by processing the sample S with the charged particle beam (focused ion beam) to the sample piece holder P will be sequentially described. The operation includes an initial setting process, a sample piece pickup process, and a sample piece mounting process.

<Initial Setting Process>

Figure 5:
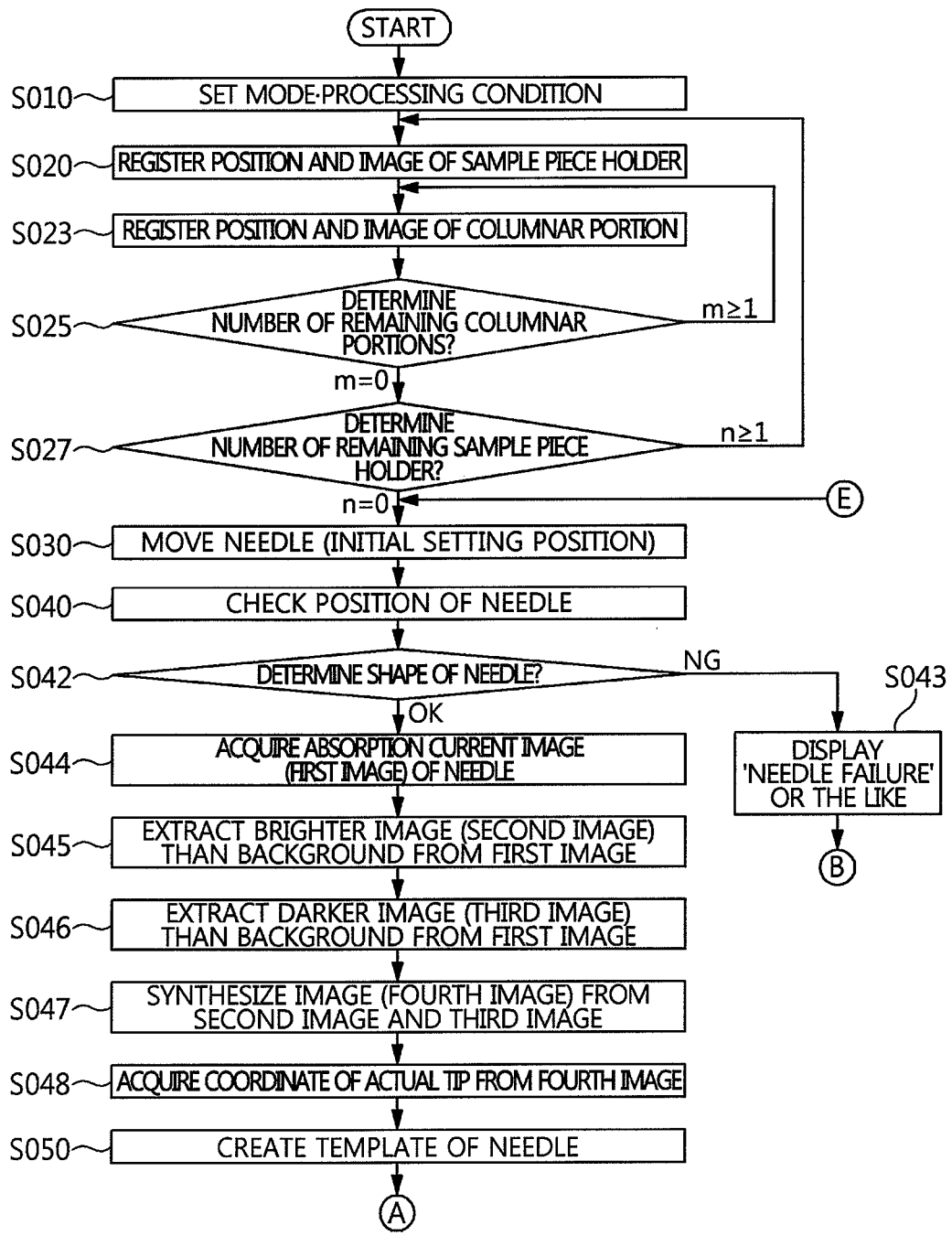
FIG. 5 is a flowchart illustrating the operation of the charged particle beam apparatus according to the embodiment of the present invention and illustrating, particularly, an initial setting process.

FIG. 5 is a flowchart illustrating the flow of an initial setting process of the automatic sampling operation performed by the charged particle beam apparatus 10 according to the embodiment of the present invention. First, at the start of the automatic sequence, the computer 23 performs a mode selection such as whether to perform a posture control mode to be described later, condition setting for setting observation conditions for template matching and process conditions (processing positions, dimensions, number of items, etc.), needle tip shape checking, and the like in Step S010.

Next, the computer 23 creates a template of the columnar portion 34 in Step S020 to Step S027. In regards to the creation of the template, the computer 23 first performs position registration for the sample piece holder P installed on the holder fixing base 12a based on information input by an operator in Step S020. The computer 23 creates the template of the columnar portion 34 at the beginning of a sampling process. The computer 23 creates a template for each columnar portion 34. The computer 23 obtains stage coordinates of each columnar portion 34, creates the template of each columnar portion 34, then stores the stage coordinates and the templates in association with each other, and uses the stored information when determining the shape of the columnar portion 34 through template matching (i.e., overlapping a template and an image). The computer 23 records in advance images, edge information extracted from the images, and the like, as the templates of the columnar portions 34 used for template matching. The computer 23 can recognize the accurate position of the columnar portion 34 in a subsequent process by performing the template matching after moving the stage 12 and by determining the shape of the columnar portion 34 by scores of the template matching. Using observation conditions such as contrast and magnification that are the same as those set for template creation, as observation conditions for template matching, is desirable because accurate template matching can be performed thereby.

When multiple sample piece holders P are installed on the holder fixing base 12a and multiple columnar portions 34 are provided in each sample piece holder P, unique recognition code numbers for the respective sample piece holders P and unique recognition code numbers for the respective columnar portions 34 provided in each sample piece holder P may be determined in advance, and the computer 23 may record the unique recognition code numbers in association with the coordinates and template information of the respective columnar portions 34.

Alternatively, the computer 23 also may record the coordinates of portions (extracted portions) at which the sample pieces Q are extracted from the sample S and image information of the surrounding sample surface besides the recognition code numbers, the coordinates of each columnar portion 34, and the template information of each columnar portion 34.

Alternatively, in the case of irregular samples such as rocks, ores, and biological samples, the computer 23 may record a low magnification wide visual field image, the position coordinates of the extracted portion, and the image as a set of information items and may record the information as recognition information. This recognition information may be stored in association with a lamellate sample S, or with a transmission electron microscope (TEM) image and the extracted position of the sample S.

The computer 23 performs position registration for the sample piece holders P prior to the movement of the sample pieces Q to be described later, thereby preliminarily confirming that the sample base 33 having a proper shape actually exists.

In the position registration processing, the computer 23 first causes the stage driving mechanism 13 to drive the stage 12 as a coarse adjustment operation, and aligns an irradiation region with a position at which the sample base 33 is attached to the sample piece holder P. Next, as a fine adjustment operation, the computer 23 extracts the positions of the multiple columnar portions 34 constituting the sample base 33 from image data of each image formed through irradiation of charged particle beams (a focused ion beam and an electron beam), by using the templates created from design shapes (CAD information) of the sample base 33. Then, the computer 23 registers (records) the coordinates of the extracted positions and the images of the respective extracted columnar portions 34 as attachment positions of the sample pieces Q in Step S023. At this point, the images of the respective columnar portions 34 are compared with design drawings, CAD drawings, or the images of standard columnar portions 34, which are preliminarily prepared, to check deformation, defect, or absence of each columnar portion 34. When a certain columnar portion 34 is defective, the computer 23 records the position coordinates and the image of the defective columnar portion, and information indicating that the columnar portion 34 is defective.

Next, it is determined whether there remains no columnar portion 34 to be registered in the sample piece holder P that currently undergoes the registration processing in Step S025. When the determination result is "NO", i.e., when the number of remaining columnar portions 34 to be registered is one or more, the processing is returned to Step S023 described above, and Step S023 and Step S025 are repeatedly performed until the number m of remaining columnar portions 34 to be further registered becomes zero. On the other hand, when the determination result is "YES", that is, when the number m of remaining columnar portions 34 to be registered is zero, the processing proceeds to Step S027.

When a plurality of sample piece holders S is installed on the holder fixing base 12a, the position coordinates of the respective sample piece holders P and image data of the corresponding sample piece holders P are stored together with the code numbers of the respective sample piece holders P. In addition, the position coordinates of the respective columnar portions 34 in each sample piece holder P, the corresponding code numbers thereof, and the image data thereof are also recorded (registered). The computer 23 may perform this position registration processing a predetermined number of times corresponding to the number of the sample pieces Q to be automatically sampled.

Next, the computer 23 determines whether there remains no sample piece holder P to be registered in Step S027. When the determination result is "NO", that is, when the number of remaining sample piece holders P to be registered is one or more, the processing is returned to Step S020 described above, and Step S020 to Step S027 are repeatedly performed until the number of remaining sample piece holders P to be registered becomes zero. On the other hand, when the determination result is "YES", that is, when the number n of remaining sample piece holders P to be registered is zero, the processing proceeds to Step S030.

Thereby, when several tens of sample pieces Q are automatically produced from one sample S, since the positions of multiple sample piece holders P are registered for each holder fixing base 12a and the positions of the respective columnar portions 34 are registered in the form of an image, it is possible to immediately draw a specific sample piece holder P to which the several tens of sample pieces Q are to be attached and a specific columnar portion 34, to a position within a field of view of a charged particle beam.

In addition, in the position registration processing (Step S020 and Step S023), when the sample piece holder P itself or the columnar portion 34 is deformed or broken or when the sample piece Q is not attached, "unusable" (notation indicating that the sample piece Q is not attached) or the like is registered in association with the position coordinates, the image data, and the code number of the sample piece holder P or the columnar portion 34. As a result, the computer 23 can skip the sample piece holder P or the columnar portion 34 registered as being "unusable" at the time of transferring the sample piece Q and can move the next normal sample piece holder P or the next normal columnar portion 34 to the observation field of view.

Next, the computer 23 creates a template of the needle 18 (Step S030 to Step S050). The template is used for image matching when one accurately brings the needle (to be described later) close to the sample piece.

In the template creation process, first, the computer 23 causes the stage driving mechanism 13 to move the stage 12. Subsequently, the computer 23 causes the needle driving mechanism 19 to move the needle 18 to the initial setting position in Step S030. The initial setting position is a point (coincidence point) that can be irradiated with both of the focused ion beam and the electron beam and is a focal point on which both of the focused ion beam and the electron beam can be focused. Furthermore, the initial setting position is a predetermined position at which any complicated structure such as the sample S, which can be misrecognized as the needle, does not exist, in the background of the image of the needle 18, after the preceding movement of the stage is performed. This coincidence point is a position at which a same object can be observed at different angles through irradiation of a focused ion beam and an electron beam.

Next, the computer 23 recognizes the position of the needle 18 by using an absorption image mode in which an electron beam is emitted in Step S040.

The computer 23 detects an absorption current flowing into the needle 18 by irradiating the needle 18 with an electron beam and generates absorption current image data. At this time, since the absorption current image has no background structure which can be misrecognized as the needle 18, the needle 18 can be recognized without being affected by the background image. The computer 23 acquires absorption current image data through irradiation of an electron beam. The reason why the template is formed by using the absorption current image is described below. When the needle approaches a sample piece, some shapes, such as a processed shape of the sample piece and a pattern formed on the surface of a sample, which can be misrecognized as the needle, are highly likely to exist in the background of the needle. Therefore, there is a high risk of misrecognition in the case of using a secondary electron image. For this reason, an absorption current image that is not affected by the background image is used to prevent false recognition. Since a secondary electron image is susceptible to a background image and has a high risk of false recognition, a secondary electron image is not suitable as a template image. As such, since a carbon deposition film attached to the tip of the needle cannot be recognized from an absorption current image, it is difficult to recognize the actual tip of the needle. However, an absorption current image is suitable in terms of pattern matching with a template.

Next, the computer 23 determines the shape of the needle 18 in Step S042.

Figures 19, 20:
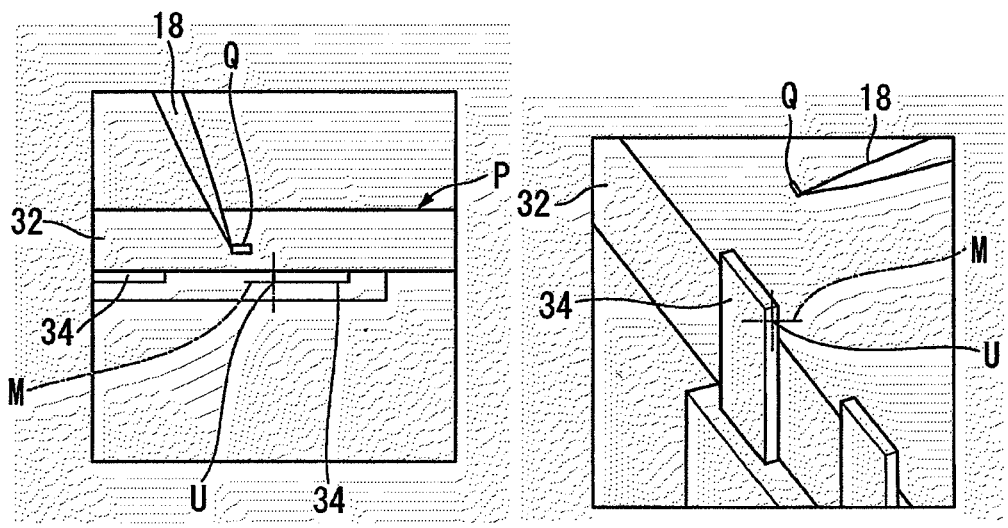
FIG. 19 is a diagram illustrating a sample piece attachment position on a columnar portion in an image formed by a focused ion beam of the charged particle beam apparatus according to the embodiment of the present invention.
FIG. 20 is a diagram illustrating a sample piece attachment position on a columnar portion in an image formed by an electron beam of the charged particle beam apparatus according to the embodiment of the present invention.

When a sample piece Q is not attached to the needle 18 due to any reason such as deformation or breakage of the tip of the needle 18 (NG in Step S042), the processing proceeds to Step S300 shown in FIG. 20 after performing Step S043. That is, the automatic sampling operation ends without performing Step S050 and subsequent steps. That is, when the shape of the tip of the needle is abnormal, the subsequent steps are not performed but an operator replaces the defective needle with a new one. In the needle shape determination of Step S042, for example, when the tip of the needle is deviated, by a distance of 100 μm or more, from a predetermined position within a field of view having a length of 200 μm at each side, the shape of the needle is determined as being abnormal. Further, when the shape of the needle is determined as being abnormal in Step S042, the message "needle failure" or the like is displayed on the display device 22 in Step S043, thereby warning an operator of the situation. The needle 18 determined as being defective may be replaced with a new one. However, when the defect of the needle 18 is minor, a focused ion beam may be irradiated to the tip of the needle 18 to reshape the needle 18.

In Step S042, when the needle 18 has a predetermined normal shape, the next step, Step S044, is performed.

Here, the state of the tip of the needle will be described.

FIG. 6A is an enlarged schematic diagram of the tip of the needle for describing a state in which a residue of a carbon deposition film DM is attached to the tip of the needle 18 (tungsten needle). The tip of the needle 18 is managed not to be cut or deformed by a focused ion beam so that the needle 18 can be repetitively used for a plurality of times of sampling. During multiple times of sampling, a residue of a carbon deposition film DM is likely to adhere to the tip of the needle 18 that is holding the sample piece Q. With the samplings repeated, the residue of the carbon deposition film DM at the tip of the needle gradually increases to have a shape slightly protruding from the position of the tip of the tungsten needle. Therefore, the coordinates of the actual tip of the needle 18 are not the coordinates of the true tip W of the tungsten needle (original needle 18) but are the coordinates of the tip C of the residue of the carbon deposition film DM. The reason why the template is formed by using an absorption current image will be described below. When the needle 18 approaches the sample piece Q, shapes, such as a processed shape of a sample piece Q and a pattern on the surface of a sample, which can be misrecognized as the needle 18, are highly likely to exist in the background image of the needle 18. Therefore, when a secondary electron image is used, there is a high risk of misrecognition. For this reason, an absorption current image that is not affected by the background image is used to prevent misrecognition. Since a secondary electron image is easily affected by the background image, a secondary electron image easily leads to misrecognition. Therefore, a secondary electron image is not suitable as a template image. As described above, since a carbon deposition film DM attached to the tip of the needle cannot be recognized on an absorption current image, it is difficult to find the actual tip of the needle from an absorption current image. However, an absorption current image is suitable for pattern matching with a template.

FIG. 6B is a schematic diagram illustrating an absorption current image of a tip portion of the needle to which a carbon deposition film DM is attached. Even though there are complicated patterns in the background of an image, the needle 18 can be clearly recognized without being affected by the shapes in the background. Since an electron beam signal that irradiates the background of the needle is not reflected on an image, the background is expressed in a uniform gray tone of a noise level. On the other hand, the carbon deposition film DM appears to be somewhat darker than the background gray tone, and thus the tip of the carbon deposition film DM cannot be clearly discerned on an absorption current image. Since it is difficult to recognize the position of the actual tip of the needle to which a carbon deposition film DM is attached in an absorption current image, if the needle 18 is moved by relying only on the absorption current image, there is a high possibility that the tip of the needle collides with the sample piece Q.

Therefore, the coordinates of the actual tip of the needle 18 can be obtained from the coordinates C of the tip of the carbon deposition, film DM in a manner described below. Here, the image of FIG. 6B will be referred to as a first image.

The process of acquiring an absorption current image (first image) of the needle 18 corresponds to Step S044.

Next, image processing is performed on the first image of FIG. 6B to extract a region brighter than the background in Step S045.

FIG. 7A is a schematic diagram illustrating a region that is brighter than the background, the region being extracted by performing image processing on the first image of FIG. 6B. When a brightness difference between the background and the needle 18 is small, image contrast may be enhanced to increase the brightness difference between the background and the needle. In this way, an image in which a region (part of the needle 18) brighter than the background is emphasized is obtained, and this image is referred to as a second image herein. The second image is stored in the computer 23.

Next, a region darker than the brightness of the background in the first image of FIG. 6B is extracted in Step S046.

Figure 7B:
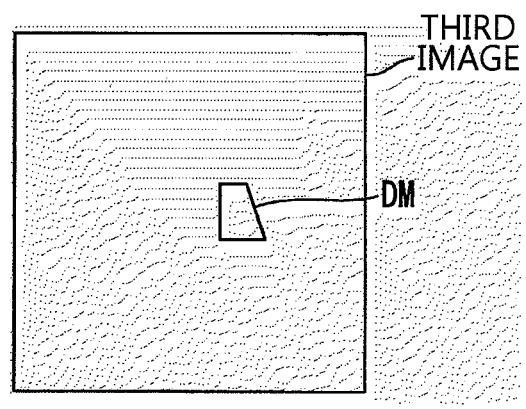

FIG. 7B is a schematic diagram illustrating a region that is darker than the background, the region being extracted by performing image processing on the first image of FIG. 6B. Only the carbon deposition film DM at the tip of the needle is extracted and shown. When a brightness difference between the background and the carbon deposition film DM is small, image contrast may be enhanced to increase the brightness difference between the background and the carbon deposition film DM in image data. In this way, an image in which a region darker than the background is emphasized is obtained. Here, this image is referred to as a third image, and the third image is stored in the computer 23.

Next, an image is synthesized from the second image and the third image stored in the computer 23 in Step S047.

Figure 8:
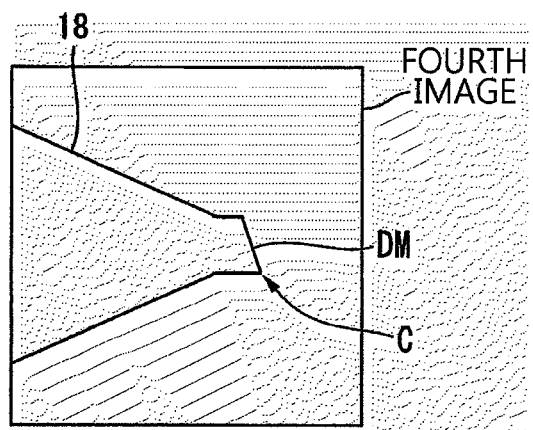
FIG. 8 is a schematic diagram illustrating a fourth image synthesized from the second image and the third image illustrated in FIGS. 7A and 7B.

FIG. 8 is a schematic diagram of a synthesized display image. In order to make an object in the image clearly seen, only the outline of the area of the needle 18 in the second image and the outline of the carbon deposition film DM in the third image are displayed by a line, and the background, the needle 18, and a portion except for the periphery of the carbon deposition film DM are displayed to be transparent. Alternatively, only the background may be displayed to be transparent, and the needle 18 and the carbon deposition film DM may be displayed in the same color or the same tone. As described above, since the second image and the third image are originally based on the first image, as long as only either one of the second image and the third image is not deformed, for example, enlarged, reduced, or rotated, the synthesized image has a shape on which the first image is reflected. Here, the synthesized image is referred to as a fourth image, and the fourth image is stored in the computer. Since the fourth image is acquired by performing the process of adjusting the contrast and emphasizing the outline based on the first image, the needle shapes are exactly the same in the first image and the fourth image, the outline of the needle is clearer in the fourth image, and the tip of the carbon deposition film DM is more clearly seen in the fourth image than that in the first image.

Next, from the fourth image, the tip of the carbon deposition film DM, i.e., the coordinates of the actual tip of the needle 18 on which the carbon deposition film DM is deposited are obtained in Step S048.

The fourth image is read from the computer 23 and displayed to determine the coordinates of the actual tip of the needle 18. The point C which protrudes most in the axial direction of the needle 18 is the actual tip of the needle and is automatically determined through image recognition, and the coordinates of the tip are stored in the computer 23.

Next, in order to further improve the accuracy of template matching, an absorption current image of the tip of the needle, which is formed by using the same observation field of view as that used in Step S044, is used as a reference image, a template image is formed by extracting only a portion including the tip of the needle from reference image data based on the coordinates of the needle tip obtained in Step S048, and the template image is registered in the computer 23 in association with the reference coordinates (needle tip coordinates) of the needle tip, which are obtained in Step S048 (Step S050).

Next, the computer 23 performs the following processing as a process of bringing the needle 18 close to the sample piece Q.

In Step S050, although the observation field of view that is the same as that used in Step S044 is used, the present invention is not limited thereto. In the case where a beam scanning standard is managed, the field of view used in Step S050 is not limited to the same field of view. Further, although it is described that the template includes the tip portion of the needle in the description of Step S050, a region that does not include the tip of the needle can be used as the template as long as the actual coordinates are associated with the reference coordinates. Although a secondary electron image is taken as an example in FIG. 7, a reflected electron image also can be used to identify the coordinates of the tip C of the carbon deposition film DM.

Since the computer 23 uses image data actually acquired before the needle 18 is moved as reference image data, highly accurate pattern matching can be performed regardless of the shapes of the individual needles 18. Furthermore, since the computer 23 acquires image data in a state where there is no complicated structure in the background, the accurate coordinates of the actual needle tip can be obtained. In addition, it is possible to acquire a template by which the shape of the needle 18 can be clearly discerned while preventing the influence of the background.

When acquiring image data of each image, the computer 23 uses image acquisition conditions such as suitable magnification, luminance, contrast, and the like that are previously recorded, in order to increase the recognition accuracy of an object.

Further, the sequence of the process (Step S020 to Step S027) of creating the templates of the columnar portions 34 and the process (Step S030 to Step S050) of creating the template of the needle 18 can be reversed. However, when the process (Step S030 to Step S050) of preparing the template of the needle is performed ahead, the flow E returning from Step S280 to be described later is also interlocked.

<Sample Piece Pickup Process>

Figure 9:
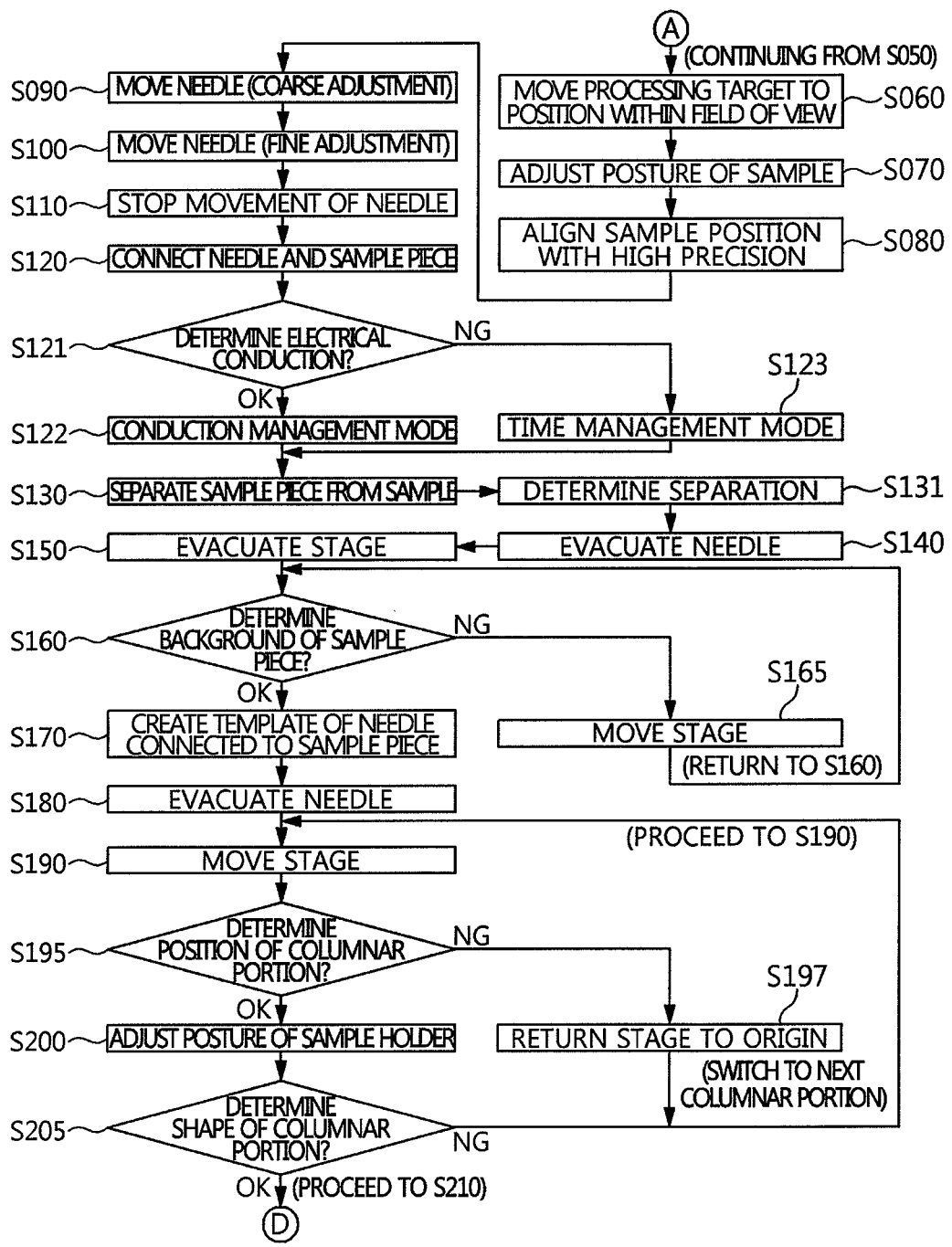
FIG. 9 is a flowchart illustrating the operation of the charged particle beam apparatus according to the embodiment of the present invention and illustrating, particularly, a sample piece pickup process.

FIG. 9 is a flowchart illustrating the flow of a process of picking up the sample piece Q from the sample S during the automatic sampling operation performed by the charged particle beam apparatus 10 according to the embodiment of the present invention. Here, the term "pickup" means to separate and extract the sample piece Q from the sample S by using a focused ion beam or a needle.

First, the computer 23 causes the stage driving mechanism 13 to move the stage 12 such that a target sample piece Q is disposed within the field of view of a charged particle beam. The stage driving mechanism 13 may be operated with reference to the position coordinates of a target reference mark Ref.

Next, the computer 23 uses image data of the charged particle beam to recognize the reference mark Ref formed on the sample S in advance. With the use of the recognized reference mark Ref, the computer 23 recognizes the position of the sample piece Q based on the relative positional relationship between a known reference mark Ref and the sample piece Q, and moves the stage such that the sample piece Q enters the observation field of view in Step S060.

Next, the computer 23 causes the stage driving mechanism 13 to drive the stage 12, thereby rotating the stage 12 about the Z axis by an angle corresponding to a posture control mode such that the sample piece Q is in a predetermined posture (for example, a posture suitable for extraction by the needle 18, etc.) in Step S070.

Next, the computer 23 recognizes the reference mark Ref using the image data of the charged particle beam, recognizes the position of the sample piece Q by referring to the relative positional relationship between the known reference mark Ref and the sample piece Q, and adjusts the position of the sample piece Q in Step S080. Next, the computer 23 performs the following processing as a process of bringing the needle 18 close to the sample piece Q.

The computer 23 performs a needle movement (coarse adjustment) for moving the needle 18 by using the needle driving mechanism 19 in Step S090. The computer 23 recognizes the reference marks Ref (see FIG. 2) using image data of images of the sample S respectively formed by a focused ion beam and an electron beam. The computer 23 sets a movement target position AP of the needle 18 using the recognized reference marks Ref.

Here, the movement target position AP is set to a position close to the sample piece Q. The movement target position AP is set to, for example, a position close to one side of the sample piece Q, on the opposite side of the support portion Qa. The computer 23 obtains a positional relationship of the movement target position AP with respect to a processing range F of the sample piece Q when forming the sample piece Q. The computer 23 records information on the relative positional relationship between the processing range F and the reference mark Ref when forming the sample piece Q through irradiation of a focused ion beam. The computer 23 moves the tip of the needle 18 toward the movement target position AP in a three-dimensional space by using the recognized reference mark Ref and using the relative positional relationship among the reference mark Ref, the processing range F, and the movement target position AP (see FIG. 2). The computer 23 first moves the needle 18 in the X direction and the Y direction and then moves the needle 18 in the Z direction when three-dimensionally moving the needle 18.

When moving the needle 18, the computer 23 can precisely and accurately determine the three-dimensional positional relationship between the needle 18 and the sample piece Q, using the reference mark Ref formed on the sample S during an automatic process of forming the sample piece Q and observing the sample piece from different directions by using an electron beam and a focused ion beam, and thus can appropriately move the needle 18.

Although the above description describes that the computer 23 moves the tip of the needle 18 toward the movement target position AP in a three-dimensional space, using the reference mark Ref and using a relative positional relationship among the reference mark Ref, the processing range F, and the movement target position AP, the movement of the tip of the needle is not limited thereto. Alternatively, the computer 23 may move the tip of the needle 18 toward the movement target position AP in a three-dimensional space by using a relative positional relationship between the reference mark Ref and the movement target position AP but without using a positional relationship with the processing range F.

Next, the computer 23 performs a needle movement process (fine adjustment) of moving the needle 18 using the needle driving mechanism 19 in Step S100. The computer 23 repeatedly performs template matching by using the template created in Step S050, and moves the needle 18 in a three-dimensional space from the movement target position AP to a connection processing position, by using the needle tip coordinates obtained in Step S047 as the tip position of the needle 18 in a SEM image while irradiating an irradiation region in which the movement target position AP is included with a charged particle beam.

Next, the computer 23 performs a process of stopping the movement of the needle 18 in Step S110.

Figures 10, 11:
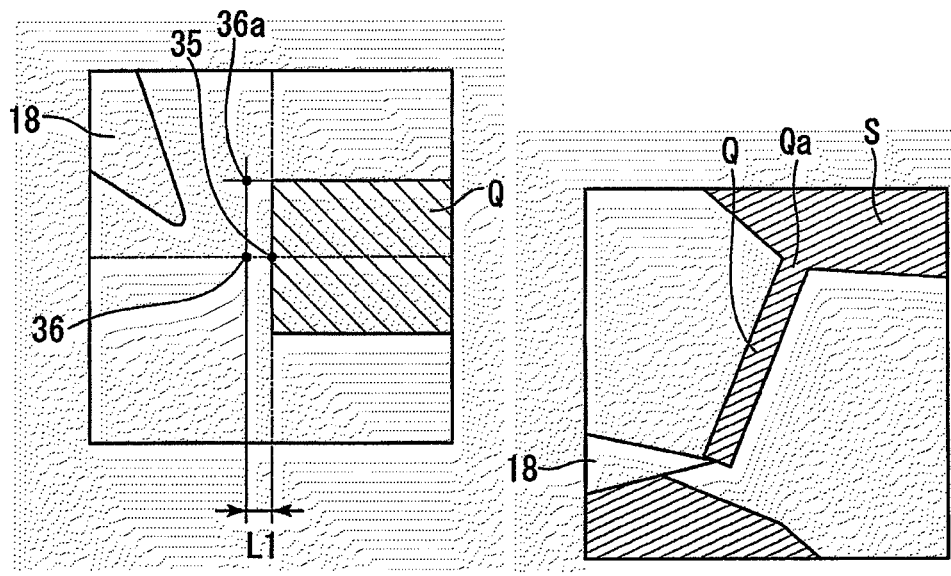
FIG. 10 is a schematic diagram illustrating a position at which the needle stops moving when the needle of the charged particle beam apparatus according to the embodiment of the present invention is connected to a sample piece.
FIG. 11 is a diagram illustrating the tip of the needle and the sample piece in an image formed by a focused ion beam of the charged particle beam apparatus according to the embodiment of the present invention.

FIG. 10 is a diagram for describing a positional relationship between the needle and the sample piece when the needle is connected to the sample piece, in which an end portion of the sample piece Q is enlarged. In FIG. 10, the end portion (end surface) of the sample piece Q to which the needle 18 is to be connected is arranged at an SIM image center 35, and a position which is at a predetermined distance L1 from the SIM image center 35, for example, a center position of the width of the sample piece Q is set as the connection processing position 36. The connection processing position may be a position (reference numeral 36a in FIG. 10) on a line extended from the end surface of the sample piece Q. In this case, the position is a convenient position because a deposition film can be easily deposited at the position. The computer 23 sets the upper limit of the predetermined distance L1 to 1 μm, and more preferably sets the predetermined interval to be 100 nm or more and 400 nm or less. When the predetermined interval is less than 100 nm, it is difficult to cut only the deposition film when the needle 18 is separated from the sample piece Q in a later process. That is, there is a risk that the needle 18 is also cut as well as the deposition film is cut. When the needle 18 is cut, the needle 18 is shortened and the tip of the needle is deformed to be thick. When this is repeated, the needle 18 has to be exchanged, which contradicts the object of the present invention which is to repeatedly perform sampling without stopping. On the contrary, when the predetermined interval exceeds 400 nm, the needle and the sample piece cannot be sufficiently connected, which increases a risk of failing to extract the sample piece Q, thereby hindering repeated sampling.

In addition, although the position in the depth direction cannot be illustrated in FIG. 10, the position in the depth direction is in advance set to a position at a depth corresponding to half the width of the sample piece Q. However, the position in the depth direction is not limited to this position. The three-dimensional coordinates of the connection processing position 36 are stored in the computer 23.

The computer 23 designates the preset connection processing position 36. The computer 23 operates the needle driving mechanism 19, based on the three-dimensional coordinates of the tip of the needle 18 and the connection processing position 36 in the same SIM image or SEM image, and moves the needle 18 to the predetermined connection processing position 36. The computer 23 stops the operation of the needle driving mechanism 19 when the position of the tip of the needle coincides with the connection processing position 36.

Figures 12, 13:
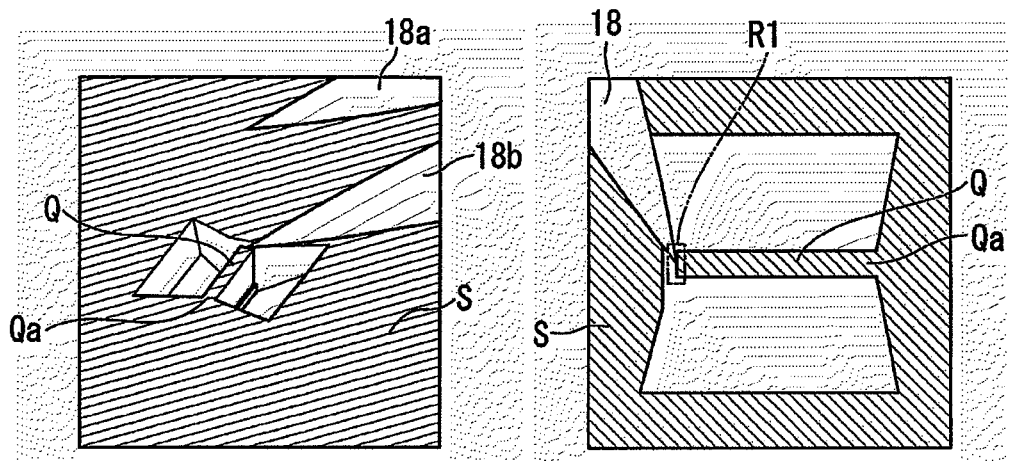
FIG. 12 is a diagram illustrating the tip of the needle and the sample piece in an image formed by an electron beam of the charged particle beam apparatus according to the embodiment of the present invention.
FIG. 13 is a diagram illustrating a processing range including a connection processing position at which the needle and the sample piece are connected with each other, within an image formed by a focused ion beam of the charged particle beam apparatus according to the embodiment of the present invention.

FIGS. 11 and 12 illustrate a state in which the needle 18 approaches the sample piece Q. FIG. 11 is a diagram illustrating an image formed by using a focused ion beam of the charged particle beam apparatus 10 according to the embodiment of the present invention, and FIG. 12 is a diagram illustrating an image formed by using an electron beam. FIG. 12 illustrates the states of the needle 18 before and after fine adjustment of the needle. In FIG. 12, a needle 18a is the needle 18 that is disposed at the movement target position and a needle 18b is the needle 18 disposed at the connection processing position 36 after the fine adjustment of the needle 18 is performed. The needles 18a and 18b are the same needle 18. FIGS. 11 and 12 illustrate images respectively formed by a focused ion beam and an electron beam. FIGS. 11 and 12 are different from each other in the observation direction and the observation magnification but are the same in the observation target and the needle 18.

By using such a method of moving the needle 18, the needle 18 can be brought close to and stopped at the connection processing position 36 in the vicinity of the sample piece Q accurately and quickly.

Next, the computer 23 performs a process of connecting the needle 18 to the sample piece Q in Step S120. The computer 23 performs a process of irradiating, with a focused ion beam, an irradiation region including a processing range R1 at the connection processing position 36 while supplying a carbon-based gas serving as a deposition gas to the end surfaces of the sample piece Q and the needle 18 for a predetermined deposition process time by using the gas supply unit 17. In this way, the computer 23 connects the sample piece Q and the needle 18 using the deposition film.

Figure 14:
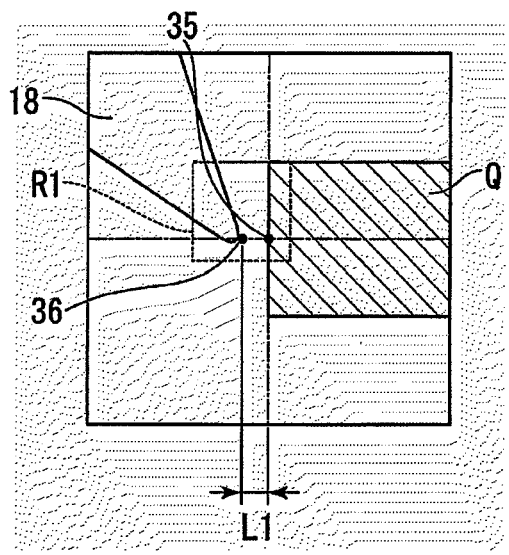
FIG. 14 is a schematic diagram illustrating a positional relationship between the needle and the sample piece in the charged particle beam apparatus according to the embodiment of the present invention when the sample piece is connected to the needle.

In Step S120, since the computer 23 connects the needle 18 and the sample piece Q using the deposition film in a state in which the needle 18 and the sample piece Q are positioned with a gap therebetween rather than a state in which the needle 18 and the sample piece Q are in direct contact with each other. Therefore, it is possible to prevent the needle 18 from being accidentally cut by a focused ion beam when the needle 18 and the sample piece Q are separated from each other by the focused ion beam in a later process. In addition, there is another advantage of preventing problems such as damage of the needle 18 caused by direct contact between the needle 18 and the sample piece Q. Furthermore, even through the needle 18 vibrates, it is possible to suppress the vibration from being transmitted to the sample piece Q. Further, even when the movement of the sample piece Q occurs due to the creep phenomenon of the sample S, excessive strain between the needle 18 and the sample piece Q can be suppressed. FIG. 13 illustrates this state. FIG. 13 is a diagram illustrating the processing range R1 (deposition film formation region) including the connection processing position at which the needle 18 and the sample piece Q are connected to each other, in image data formed by a focused ion beam irradiated by the charged particle beam apparatus 10 according to the embodiment of the present invention. FIG. 14 is an enlarged explanatory view of FIG. 13, which makes it easy to understand the positional relationship among the needle 18, the sample piece Q, and the deposition film formation region (for example, the processing range R1). The needle 18 approaches the connection processing position spaced from the sample piece Q by the predetermined distance L1 and stops there. The needle 18, the sample piece Q, and the deposition film formation region (for example, the processing range R1) are set such that the deposition film is formed to straddle the needle 18 and the sample piece Q. The deposition film is also formed in the gap having the predetermined distance L1, and the needle 18 and the sample piece Q are connected with each other by a deposition film.

When connecting the needle 18 to the sample piece Q, the computer 23 makes the sample piece Q connected to the needle 18 take a certain connection posture which is determined depending on an approach mode previously selected in Step S010, when the sample piece Q connected to the needle 18 is later transferred to the sample piece holder P. The computer 23 sets relative connection postures of the needle 18 and the sample piece Q for each of a plurality of (for example, three) different approach modes to be described later.

When connecting the needle 18 and the sample piece Q in Step S120, the computer 23 determines whether or not the needle 18 and the sample piece Q are electrically connected by the deposition film so as to be conductive, based on a signal output from the needle electrical conduction sensor 21.

In Step S121, the computer 23 determines whether or not electrical conduction between the needle 18 and the sample piece Q is detected in a predetermined deposition process time for which the process of Step S120 is continued.

When electrical conduction between the needle 18 and the sample piece Q is detected in the predetermined deposition process time (i.e., OK in Step S121), the computer 23 determines that the sample piece Q and the needle 18 are connected by the deposition film, regardless of whether the predetermined deposition process time has elapsed, and stops the formation of the deposition film. The subsequent processing is performed in a conduction management mode (Step S122). The conduction management mode refers to a mode in which detection of electrical conduction by the needle electrical conduction sensor 21 is valid when the computer determines whether the needle 18 and an object are connected or separated. In the conduction management mode, when the needle electrical conduction sensor 21 detects electrical conduction between the needle 18 and an object, the computer determines that the needle 18 is connected with the object. On the contrary, when the needle electrical conduction sensor 21 detects no electrical conduction between the needle and the object, the computer determines that the needle 18 and the object are separated from each other.

When electrical conduction between the needle 18 and the sample piece Q is not detected within the predetermined deposition process time (NG in Step S121), the computer 23 continuously executes the processing of Step S120 for a prescribed normal time which is longer than the predetermined deposition process time by a predetermined time. Then, the computer determines that the sample piece Q and the needle 18 are connected by the deposition film after the processing of Step S120 is continuously performed for the prescribed normal time and then stops the formation of the deposition film. Next, the computer performs the subsequent processing in a time management mode (Step S123). The time management mode refers to a mode in which detection of electrical conduction by the needle electrical conduction sensor 21 is invalid in the determination of the connection or separation between the needle 18 and the object. In the time management mode, in the case where the process of connecting the needle 18 and the object is performed for the prescribed normal time or longer, it is determined that the object is non-conductive but the needle 18 and the object are connected by the deposition film. Further, in the case where the process of separating the needle 18 and the object is performed for the prescribed normal time or longer, it is determined that the needle 18 and the object are separated from each other.

The computer 23 can inform an operator of a state in which the conduction management mode or the time management mode is set, a state in which the time management mode is set and the conduction management mode is not set, or other states by displaying information indicating the state on the display device 22 or making a warning sound. Alternatively, the state may be recorded as information such as a data log, which is generated during the automatic sampling operation.

Next, the computer 23 performs processing of cutting the supporting portion Qa that connects the sample piece Q and the sample S in Step S130. The computer 23 designates a preset cutting position T1 within the supporting portion Qa using the reference mark Ref formed on the sample S.

Figure 15:
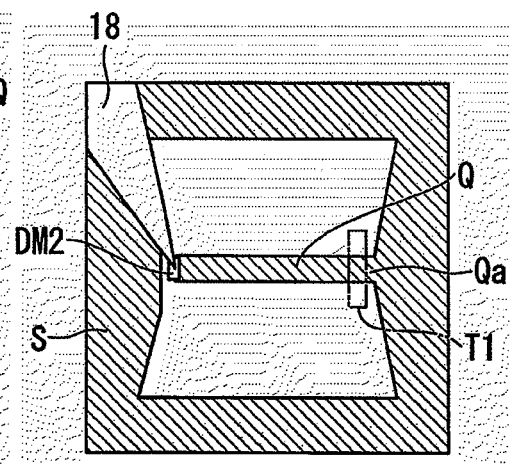
FIG. 15 is a diagram illustrating a cutting position T1 in a sample and a sample piece support portion, in an image formed by a focused ion beam of the charged particle beam apparatus according to the embodiment of the present invention.

The computer 23 separates the sample piece Q from the sample S by directing a focused ion beam to the cutting position T1 for a predetermined time. FIG. 15 illustrates this state, and is a diagram illustrating the cutting position T1 at the supporting portion Qa between the sample S and the sample piece Q, in the image data formed by a focused ion beam of the charged particle beam device 10 according to the embodiment of the present invention.

Figure 16:
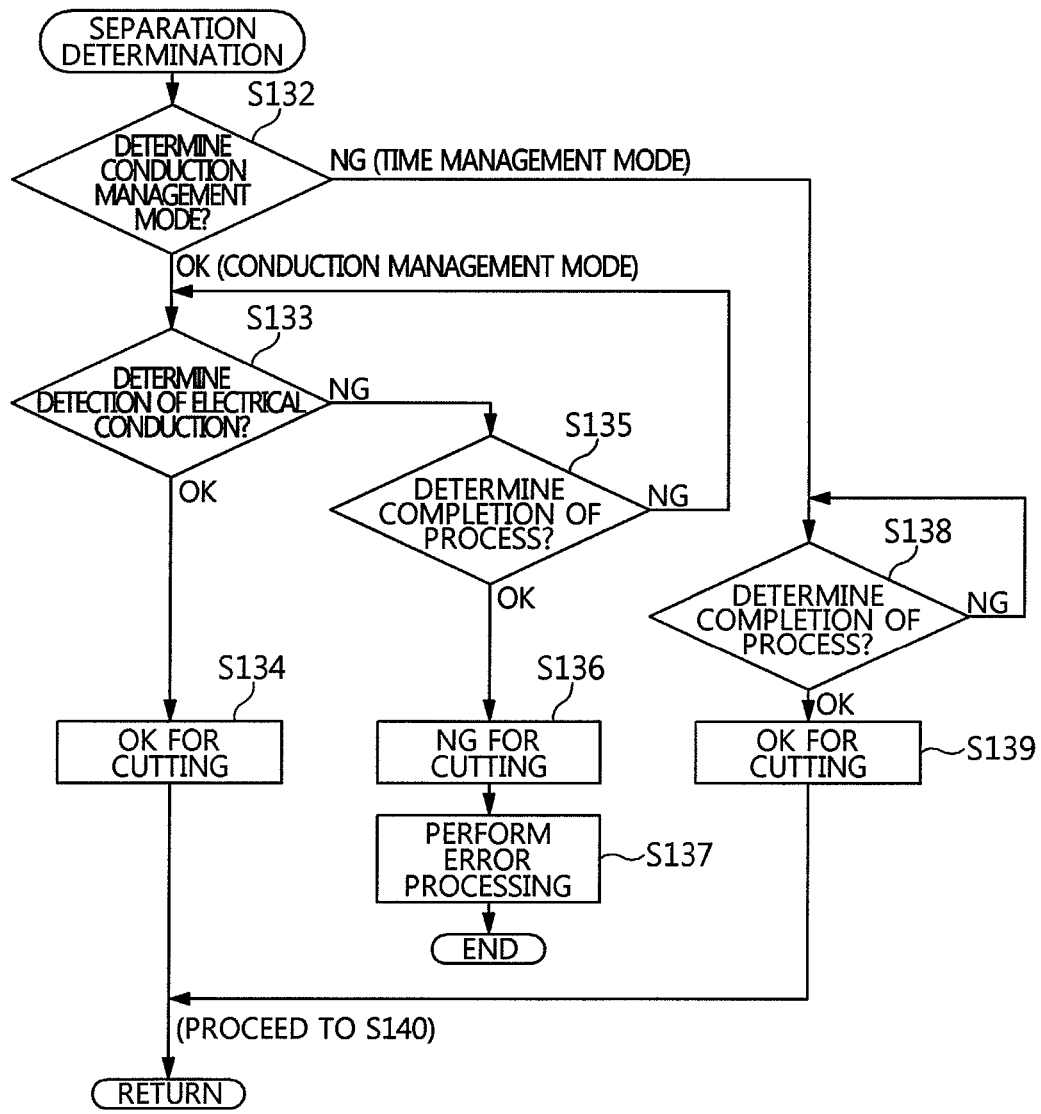
FIG. 16 is a flowchart illustrating the operation of the charged particle beam apparatus according to the embodiment of the present invention and, specifically, illustrating a separation determination process of FIG. 9.

Next, in Step S131, the computer determines whether or not the sample piece Q is separated from the sample S by using different methods according to the modes: the conduction management mode (Step S122) and the time management mode (Step S123). FIG. 16 is a flowchart illustrating the process flow of Step S131.

First, it is determined whether the conduction management mode is set or the time management mode is set in Step S132. When the conduction management mode is set (OK in Step S132), the computer 23 determines whether the sample piece Q is cut away from the sample S by detecting electrical conduction between the sample and the needle 18 based on a signal output from the nee electrical conduction sensor 21. Meanwhile, when the time management mode is set (NG in Step S132), the computer determines whether the sample piece Q is cut away from the sample S by determining whether a cutting process is performed for a predetermined cutting process time.

In Step S133, in the conduction management mode, the computer 23 determines whether or not electrical conduction is not detected between the sample S and the needle 18 within the predetermined cutting process time for which the processing of Step S130 is continued, based on a signal output from the needle electrical conduction sensor 21. When electrical conduction is not detected between the sample S and the needle 18 (OK in Step S133), the computer 23 determines that the sample piece Q is cut away from the sample S (OK for cutting), regardless of the elapse of the predetermined cutting process time. At this point, the computer 23 stops the cutting process, and performs the subsequent processing (Step S140 and subsequent steps), in Step S134. Meanwhile, when electrical conduction is detected between the sample S and the needle 18 (NG in Step S133), the computer 23 switches processing to perform Step S135.

In Step S135, the computer 23 determines whether or not the cutting process planned to be continued for the predetermined cutting process time is completed, i.e., whether or not the process of cutting the supporting portion Qa at the cutting position T1 between the sample and the sample piece Q is completed. When it is determined that the cutting process planned to be continued for the predetermined cutting process time is not completed (NG in Step S135), the computer 23 returns the processing to Step S133. Meanwhile, when electrical conduction between the sample S and the needle 18 is still detected by the needle electrical conduction sensor 21 although the cutting process planned to be continued for the predetermined cutting process time is completed (OK in Step S135), the computer 23 determines that the sample piece Q is not cut away from the sample S (Step S136). When it is determined that the sample piece Q is not cut away from the sample S (NG for cutting), the computer 23 informs an operator of such a situation by displaying information indicating the situation on the display device 22 or by making a warning sound (error processing). Then, the computer interrupts the operation of the apparatus so that the subsequent processing (i.e., Step S140 and subsequent steps) is not performed. In this case, the computer 23 performs processing such that a deposition film DM2 connecting the sample piece Q and the needle 18 is irradiated and cut by a focused ion beam. That is, the computer 23 can separate the sample piece Q and the needle 18 in this way and drive the needle 18 to be returned to an initial position in Step S060. The needle 18 returned to the initial position performs sampling a next sample piece Q.

In addition, in Step S138, the computer 23 determines whether or not the sample piece Q is cut away from the sample S by determining whether or not the cutting process planned to be continued for a normal time (i.e., time longer than the predetermined cutting process time by a predetermined time), which is set for the time management mode, is completed. The computer 23 determines that the sample piece Q is not cut away from the sample S when the cutting process planned to be continued for the normal time which is preset for the time management mode is not completed (NG in Step S138), and repeatedly executes the determination process until the cutting process planned to be continued for the normal time is completed. That is, in the case of determining that the sample piece Q is not cut away from the sample S according to the determination result that the cutting process planned to be continued for the normal time set for the time management mode is not completed, the error processing that is performed in the conduction management mode is not performed but the determination process is repeatedly performed until the cutting process planned to be continued for the normal time is completed. On the contrary, when the cutting process performed for the normal time which is set for the time management is completed (OK in Step S138), the computer 23 determines that the sample piece Q is cut away from the sample S (OK for cutting), and then performs the subsequent processing (Step S140 and subsequent steps thereof) in Step S139.

Figures 17, 18:
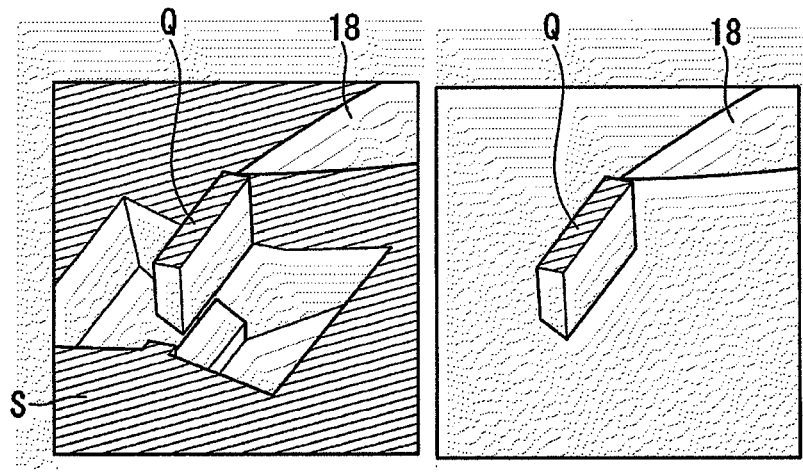
FIG. 17 is a diagram illustrating a state in which the needle connected with the sample piece is evacuated (moved away) in an image formed by an electron beam of the charged particle beam apparatus according to the embodiment of the present invention.
FIG. 18 is a diagram illustrating a state in which a stage is evacuated from the needle connected with the sample piece in an image formed by an electron beam of the charged particle beam apparatus according to the embodiment of the present invention.

Next, the computer 23 executes a needle evacuation process in Step S140. The computer 23 raises the needle 18 in the vertical direction (that is, the positive direction of the Z direction) by a predetermined distance (for example, 5 μm) by using the needle driving mechanism 19. FIG. 17 illustrates this state, and is a diagram illustrating a state in which the needle 18 connected to the sample piece Q is evacuated, in the image data formed by an electron beam of the charged particle beam apparatus 10 according to the embodiment of the present invention.

Next, the computer 23 performs a stage evacuation process in Step S150. As illustrated in FIG. 17, the computer 23 causes the stage driving mechanism 13 to move the stage 12 by a predetermined distance. For example, the computer 12 lowers the stage 12 in the vertical direction by 1 mm, 3 mm, or 5 mm (i.e., the negative direction of the Z direction). After lowering the stage 12 by the predetermined distance, the computer 23 moves the nozzle 17a of the gas supply unit 17 away from the stage 12. For example, the computer 23 raises the nozzle 17a in the vertical direction so that the nozzle 17 is disposed at a standby position which is directly above the stage 12. FIG. 18 illustrates this state, and is a diagram illustrating a state in which the stage 12 is evacuated from the needle 18 connected to the sample piece Q, in image data formed by an electron beam of the charged particle beam apparatus 10 according to the embodiment of the present invention.

Next, the computer 23 operates the stage driving mechanism 13 such that there is no structure in the background of the needle 18 and the sample piece Q connected to each other. This is to recognize without fail the edges (outlines) of the needle 18 and the sample piece Q from the image data of the sample piece Q formed by each of the focused ion beam and the electron beam, at the time of preparing templates of the needle 18 and the sample piece Q in a subsequent process (step). The computer 23 executes processing of moving the stage 12 by a predetermined distance. Then, the computer 23 determines whether or not there is a problem with the background of the sample piece Q in Step S160. When it is determined that there is no problem with the background, the processing proceeds to the next step, i.e., Step S170. When there is a problem with the background, the stage 12 is moved again by a predetermined amount in Step S165, and the processing is returned to the background determination process of Step S160. The background determination process is repeated until the background has no problem.

The computer 23 creates templates of the needle 18 and the sample piece Q in Step S170. The computer 23 creates the templates of the needle 18 and the sample piece Q that are in a rotated posture (i.e., a posture in which the sample piece Q is connected to the columnar portion 34 of the sample base 33) in which the needle 18 to which the sample piece Q is fixed is rotated as necessary. Thereby, in accordance with the rotation of the needle 18, the computer 23 three-dimensionally recognizes the edges (outlines) of the needle 18 and the sample piece Q from the image data formed by each of the focused ion beam and the electron beam. In an approach mode in which the rotation angle of the needle 18 is 0°, the computer 23 may recognize the edges (outlines) of the needle 18 and the sample piece Q from the image data formed by the focused ion beam without requiring an electron beam.

When the computer 23 instructs the stage driving mechanism 13 and the needle driving mechanism 19 to move the stage 12 to a position where there is no structure in the background of the needle 18 and the sample piece Q, the computer first searches for the needle 18 by using a low observation magnification when the needle 18 has not reached the position as instructed. When failing to find the needle 18, the computer 23 initializes the coordinates and moves the needle 18 to the initial position.

In the template creation processing Step S170, first, the computer 23 acquires templates (reference image data) of the sample piece Q and the tip of the needle 18 connected to the sample piece Q, for template matching. The computer 23 irradiates the needle 18 with charged particle beams (each of a focused ion beam and an electron beam) while scanning an irradiation position. The computer 23 acquires image data from each of a plurality of different directions in which the secondary charged particles R (secondary electrons etc.) are emitted from the needles 18, by irradiating the needle with charged particle beams. The computer 23 acquires image data through irradiation of the focused ion beam and irradiation of the electron beam. The computer 23 records image data acquired from two different directions as templates (reference image data).

Since the computer 23 uses actual image data of the sample piece Q and the needle 18 connected to the sample piece Q, which are actually processed by a focused ion beam, as the reference image data, highly accurate pattern matching can be performed regardless of the shapes of the sample piece Q and the needle 18.

In order to increase the recognition accuracy of the shapes of the sample piece Q and the needle 18 connected to the sample piece Q when acquiring each of the image data, the computer 23 uses image acquisition conditions such as an appropriate magnification, luminance, contrast, etc. which are previously recorded.

In the template creation processing Step S170, when the time management mode is set in Step S123, the computer 23 automatically enhances the contrast of image data used for recognition of the edges (outlines) of the needle 18 and the sample piece Q in comparison with the contrast of image data used in the conduction management mode of Step S122. This processing has an advantage of preventing contrast deterioration which occurs when the sample piece Q is non-conductive, which improves recognition of the edges (outlines).

Next, the computer 23 performs needle evacuation processing in Step S180. This is to prevent the needle from coming into unintentional contact with the stage 12 during the subsequent stage movement processing. The computer 23 moves the needle 18 by a predetermined distance by using the needle driving mechanism 19. For example, the needle 18 is raised in the vertical direction (that is, the positive direction of the Z direction). Alternatively, the needle 18 may stay on the spot and the stage 12 may be moved by a predetermined distance. For example, the stage 12 may be lowered in the vertical direction (that is, the negative direction of the Z direction). The needle evacuation direction is not limited to the vertical direction as described above but it may be the axial direction of the needle or a direction of a predetermined position for evacuation of the needle. The predetermined position may be a position at which the sample piece Q connected to the tip of the needle is not in contact with any structure inside the sample chamber or is unlikely to be irradiated with a focused ion beam.

Next, the computer 23 moves the stage 12 by using the stage driving mechanism 13 so that a specific sample piece holder P registered in Step S020 falls within an observation field of view of a charged particle beam in Step S190. FIGS. 19 and 20 illustrate this state. Particularly, FIG. 19 is a schematic diagram of an image formed by a focused ion beam generated by the charged particle beam apparatus 10 according to the embodiment of the present invention. Specifically, FIG. 19 illustrates an attachment position on the columnar portion 34, at which the sample piece Q is attached to the columnar portion 34. FIG. 20 is a schematic diagram of an image formed by an electron beam, and illustrates an attachment position U on the columnar portion 34, at which the sample piece Q is attached to the columnar portion 34.

Here, it is determined whether or not a columnar portion 34 of a target sample piece holder P falls within a region of the observation field of view in Step S195. When the target columnar portion 34 is disposed within the observation field of view, the processing proceeds to the next step, i.e., Step S200. When the target columnar portion 34 is not disposed within the observation field of view, that is, when the stage is not correctly operated with respect to specified coordinates, the stage coordinates designated immediately before are initialized and the stage is returned to the origin position of the stage 12 in Step S197. Then, the coordinates of the target columnar portion 34 which is required to be registered in advance are designated, the stage 12 is driven in Step S190, and the processing is repeated until the columnar portion 34 falls within the observation field of view.

Next, the computer 23 moves the stage 12 by using the stage driving mechanism 13 to adjust a horizontal position of the sample piece holder P, and then rotates and tilts the stage 12 by an angle corresponding to a desired posture control mode so that the sample piece holder P is positioned in a predetermined posture in Step S200.

Through Step S200, the postures of the sample piece Q and the sample piece holder P can be adjusted so that the surface (end surface) of the original sample S is parallel or perpendicular to the end surface of the columnar portion 34. In particular, given that the sample piece Q fixed to the columnar portion 34 is thinned by a focused ion beam, it is preferable that the postures of the sample piece Q and the sample piece holder P are adjusted such that the surface (end surface) of the original sample S becomes perpendicular to the irradiation axis of the focused ion beam. Alternatively, the postures of the sample piece Q and the sample piece holder P may be adjusted such that the surface (end surface) of the sample piece Q to be fixed to the columnar portion 34 is perpendicular to the columnar portion 34 and is disposed on the downstream side in the direction in which the focused ion beam is incident.

Here, it is determined whether or not the shape of the columnar portion 34 of the sample piece holder P is normal in Step S205. An objective of the shape determination of the columnar shape 34 performed in Step S205 is to check whether a specific columnar portion 34 is accidently deformed, damaged, or absent due to any accidental contact or the like after the image of the columnar portion 34 is registered in Step S023. When a columnar portion 34 is determined as having a shape with no problem and as being normal in Step S205, the processing proceeds to the next step, i.e., Step S210. Conversely, when the columnar portion 34 is determined as being defective, the processing is returned to Step S190 in which the stage is moved so that the next columnar portion 34 falls within the observation field of view.

When it is determined that a designated columnar portion is not disposed in the observation field of view although the computer 23 instructs the stage driving mechanism 13 to move the stage 12 such that the designated columnar portion 34 falls within the observation field of view, the computer 23 initializes the coordinates of the position and moves the stage 12 to an initial position thereof.

Next, the computer 23 moves the nozzle 17a of the gas supply unit 17 to a position close to a focused ion beam irradiation position. For example, the nozzle 17a is lowered in the vertical direction toward the processing position from the standby position that is directly above the stage 12.

<Sample Piece Mounting Process>

Here, the term "sample piece mounting process" refers to a process of transferring the sample piece Q that is extracted from the sample to the sample piece holder P.

Figure 21:
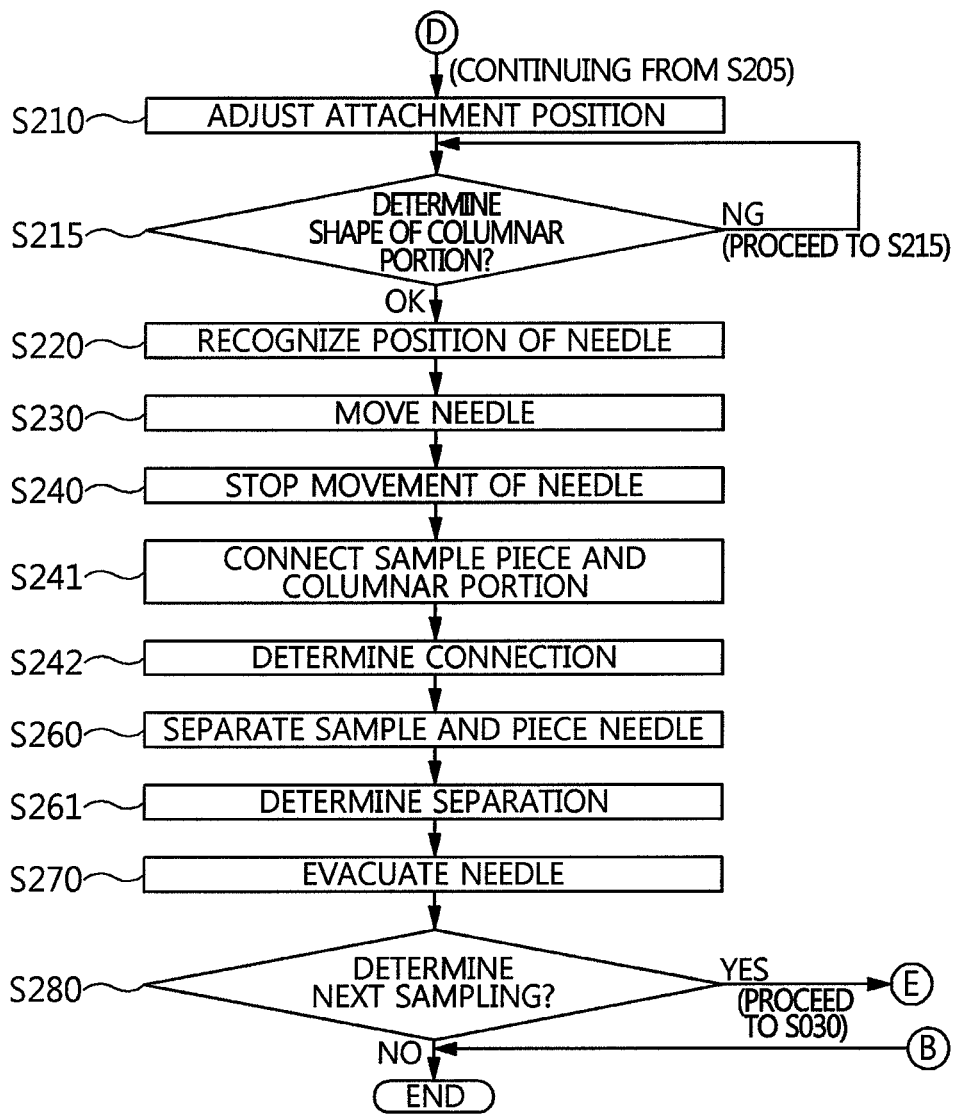
FIG. 21 is a flowchart illustrating the operation of the charged particle beam apparatus according to the embodiment of the present invention and, specifically, illustrating a sample piece mounting process.

FIG. 21 is a flowchart illustrating the flow of the process of mounting (transferring) a sample piece Q to a predetermined columnar portion 34 of a predetermined sample piece holder P during the automatic sampling operation of the charged particle beam device 10 according to the embodiment of the present invention 7.

By using image data of images respectively formed by a focused ion beam and an electron beam, in Step S210, the computer 23 recognizes a transfer position of a sample piece Q recorded in Step S020. The computer 23 performs template matching of a columnar portion 34. The computer 23 performs the template matching in order to confirm that the columnar portion 34 appearing in a region of the observation field of view among a plurality of columnar portions 34 of a comb-shaped sample base 33 is a previously designated columnar portion 34. The computer 23 performs template matching with respect to the image data of images respectively formed by a focused ion beam and an electron beam, using the templates of the respective columnar portions 34 created in the template preparation process (i.e., Step S020) of the columnar portions 34.

In Step S215, the computer 23 determines whether or not a problem such as absence of the columnar portion 34 or the like is found during the template matching for each columnar portion 34, which is performed after the movement of the stage 12. When a problem is found in the shape of the columnar portion 34 (NG), the columnar portion 34 to which the sample piece Q is to be transferred is skipped and the process is performed with respect to the next columnar portion 34 adjacent to the columnar portion 34 which has been determined as having a problem. Thus, the next columnar portion 34 undergoes template matching for defect checking. Through this process, a columnar portion 34 to which a sample piece Q can be transferred is determined. When there is no problem with the shape of the columnar portion 34, the processing proceeds to the next step, i.e., Step S220.

Further, the computer 23 may extract an edge (outline) from image data of a predetermined region (a region including at least a columnar portion 34), and may use this edge pattern as a template. Further, when an edge (outline) cannot be extracted from the image data of the predetermined region (region including at least a columnar portion 34), the computer 23 acquires new image data. The extracted edge may be displayed on the display device 22 and then undergo template matching with an image formed by irradiating a region corresponding to the observation field of view with a focused ion beam.

The computer 23 causes the stage driving mechanism 13 to drive the stage 12 such that the attachment position of the sample piece, which is recognized through irradiation of an electron beam, coincides with the attachment position recognized through irradiation of a focused ion beam. The computer 23 causes the stage driving mechanism 13 to drive the stage 12 such that the attachment position U of the sample piece Q coincides with the field center (processing position) of a field of view.

Next, the computer 23 performs Step S220 to Step S250, as a process of bringing the sample piece Q connected to the needle 18 into contact with the sample piece holder P.

First, the computer 23 recognizes the position of the needle 18 in Step S220. The computer 23 detects the absorption current flowing into the needle 18 by irradiating the needle 18 with charged particle beams, and generates absorption current image data. The computer 23 obtains absorption current image data formed through irradiation of a focused ion beam and absorption current image data formed through irradiation of an electron beam irradiation. The computer 23 detects the position of the tip of the needle 18 in a three-dimensional space using the absorption current image data obtained from two different directions.

The computer 23 causes the stage driving mechanism 13 to drive the stage 12 by using the detected position of the tip of the needle 18 and may set the position of the tip of the needle 18 as the center position (field center) of a preset field of view.

Next, the computer 23 performs a sample piece mounting process. First, the computer 23 performs template matching in order to accurately recognize the position of the sample piece Q connected to the needle 18. The computer 23 performs template matching with image data obtained through irradiation of a focused ion beam and image data formed through irradiation of an electron beam, by using the templates of the needle 18 and sample piece Q connected to each other, which are previously created in the template preparation process (Step S170) of the needle 18 and sample piece Q.

When extracting an edge (outline) from a predetermined region (including at least the needle 18 and the sample piece Q) in the image data during the template matching, the computer 23 displays the extracted edge on the display device 22. Further, in the case where the edge (outline) cannot be extracted from the predetermined region (region including at least the needle 18 and the sample piece Q) in the image data during the template matching, the computer 23 acquires new image data.

Then, the computer 23 measures the distance between the sample piece Q and the columnar portion 34, based on the result of the template matching using the templates of the needle 18 and the sample pieces Q and the template of the columnar portion 34 that is a target to which the sample piece Q is to be attached, in image data formed through irradiation of a focused ion beam and image data formed through irradiation of an electron beam.

Then, the computer 23 finally transfers the sample piece Q to the columnar portion 34 that is a target to which the sample piece Q is to be attached, by moving the sample piece Q along a plane parallel to the stage 12.

In this template matching process Step S220, when the time management mode is set in Step S123, the computer 23 automatically enhances the contrast of image data used for recognition of the edge (outline) of a predetermined region (i.e., a region including at least the needle 18 and the sample piece Q) in comparison with the image data used in the conduction management mode.

In this sample piece mounting process, the computer 23 first performs a needle movement process of moving the needle 18 by using the needle driving mechanism 19 in Step S230. Based on the template matching using the templates of the needle 18 and the sample piece Q and the template of the columnar portion 34 in the image data formed through irradiation of the focused ion beam and the image data formed through irradiation of the electron beam, the computer 23 measures the distance between the sample piece Q and the columnar portion 34. The computer 23 moves the needle 18 in a three-dimensional space in accordance with the measured distance so that the needle 18 can face the attachment position where the sample piece Q is to be attached to the columnar portion 34.

Next, the computer 23 stops the needle 18 from moving when there is a predetermined gap L2 between the columnar portion 34 and the sample piece Q in Step S240. The computer 23 sets the gap L2 to 1 µm or less, and preferably the gap L2 is set to be 100 nm or more and 500 nm or less.

Although the gap L2 is 500 nm or more, the sample piece can be connected to the columnar portion. However, it is undesirable because a connection time required for connecting the columnar portion 34 with the sample piece Q using a deposition film excessively increases. Therefore, the gap of 1 µm is not desirable. As the gap L2 is decreased, the connection time required for connecting the columnar portion 34 with the sample piece Q using the deposition film is shortened. However, it is important that the columnar portion and the sample piece are not in direct contact with each other.

When providing the gap L2 between the columnar portion 34 and the sample piece Q, the computer 23 may provide the gap L2 by detecting absorption current images of the columnar portion 34 and the needle 18.

The computer 23 checks whether or not the sample piece Q is cut away from the needle 18 after the sample piece Q is transferred to the columnar portion 34, by detecting electrical conduction between the columnar portion 34 and the needle 18.

Figure 22:
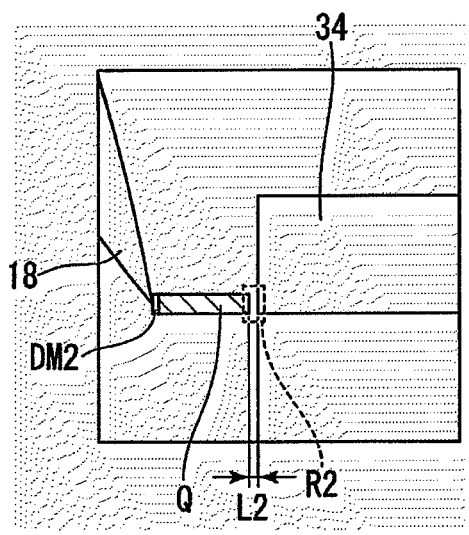
FIG. 22 is a diagram illustrating the needle that has stopped moving to stay around the sample piece attachment position on a sample base, in an image formed by a focused ion beam of the charged particle beam apparatus according to the embodiment of the present invention.
Figure 23:
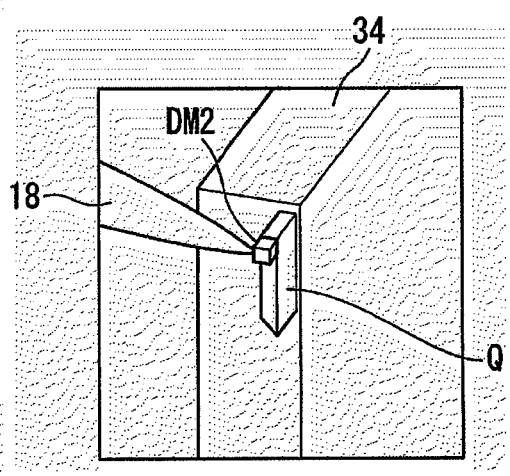
FIG. 23 is a diagram illustrating the needle that has stopped moving to stay around the sample piece attachment position on the sample base, in an image formed by an electron beam of the charged particle beam apparatus according to the embodiment of the present invention.

Next, the computer 23 performs a process of connecting the sample piece Q connected to the needle 18 to the columnar portion 34 in Step S24. FIGS. 22 and 23 are schematic diagrams of enhanced-magnification images as compared with FIGS. 19 and 20, respectively. The computer 23 arranges the sample piece Q such that one side of the sample piece Q and one side of the columnar portion 34 are in a straight line as illustrated in FIG. 22 and an upper end surface of the sample piece Q and an upper end surface of the columnar portion 34 are flush with each other as illustrated in FIG. 23. Thus, when the gap L2 equals a predetermined value, operation of the needle driving mechanism 19 is stopped. In a state in which the sample piece Q has stopped moving at the attachment position while having the gap L2 between itself and the columnar portion 34, the computer 23 sets a deposition processing range R2 in which an end portion of the columnar portion 34 is disposed, in the image (see FIG. 21) formed by the focused ion beam. The computer 23 irradiates an irradiation region including the processing range R2 with a focused ion beam for a predetermined time while supplying gas to the surfaces of the sample piece Q and the columnar portion 34 by using the gas supply part 17. Through this operation, a deposition film is formed in a region to which the focused ion beam is directed, and the gap L2 is filled with the deposition film, so that the sample piece Q is connected to the columnar portion 34. In the process of fixing the sample piece Q to the columnar portion 34 using the deposition process, the computer 23 stops the deposition when it is determined that connection between the columnar portion 34 and the needle 18 is completed.

Figure 24:
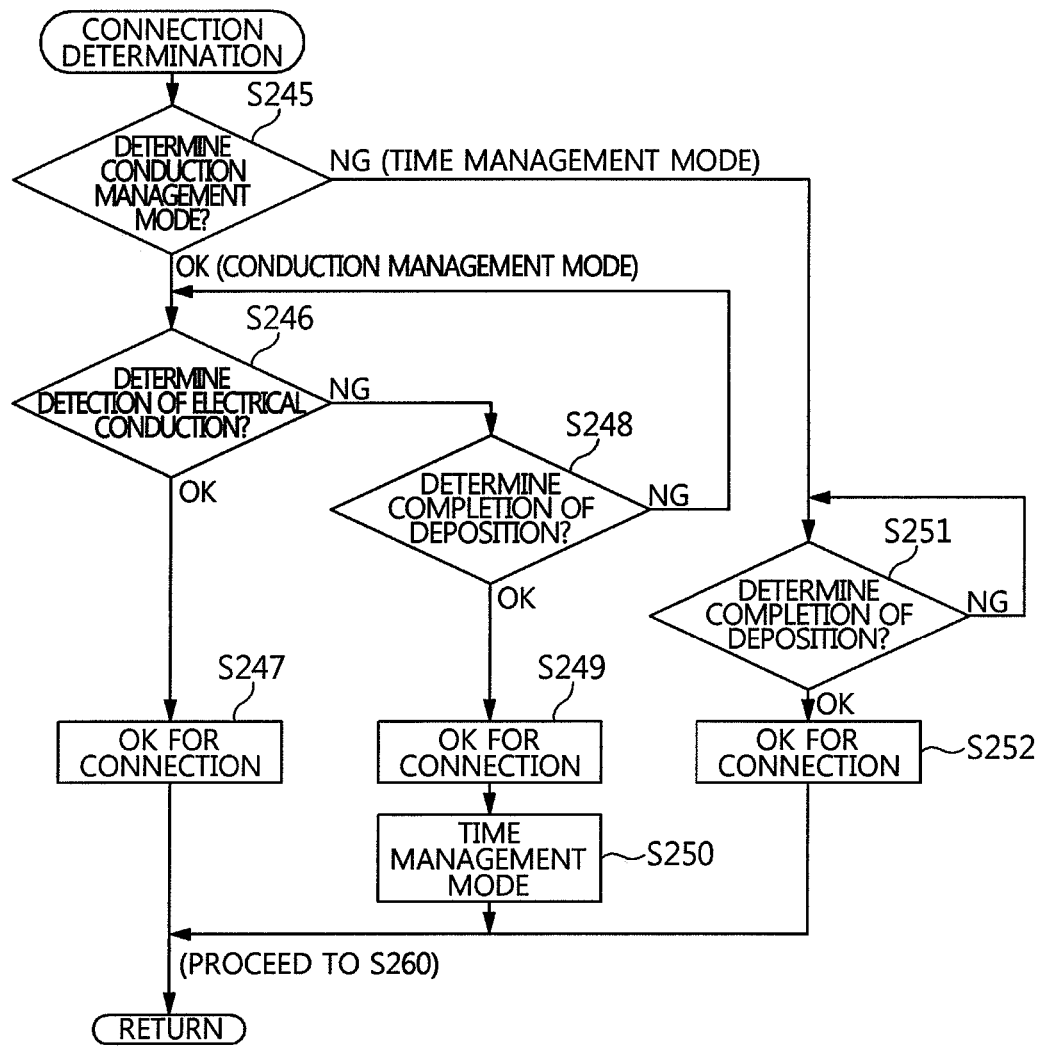
FIG. 24 is a flowchart illustrating the operation of the charged particle beam apparatus according to the embodiment of the present invention and, specifically, illustrating a connection determination process of FIG. 21.

The computer 23 determines whether or not connection between the sample piece Q and the columnar portion 34 is completed, using different methods according to modes. For example, the processing performed when the conduction management mode is set (Step S122) and the processing performed when the time management mode is set (Step S123) differ from each other. FIG. 24 is a flowchart illustrating the flow of Step S242.

First, in Step S245, the computer 23 determines whether the conduction management mode is set or the time management is set. When the conduction management modes is set (OK in Step S245), the computer 23 determines whether or not connection between the sample piece q and the columnar portion 34 is completed by detecting electrical conduction between the columnar portion 34 and the needle 18 based on a signal output from the needle electrical conduction sensor 21. On the other hand, when the time management mode is set (NG in Step S245), the computer determines whether or not connection between the sample piece Q and the columnar portion 34 is completed by determining whether or not formation of the deposition film planned to be continued for a predetermined deposition process time is completed.

In the conduction management mode, in Step S246, the computer 23 determines whether or not electrical conduction between the columnar portion 34 and the needle 18 is detected within a predetermined time during which the processing of Step S241 is continuously performed, based on the signal output from the needle electrical conduction sensor 21. The computer 23 performs the processing of Step S246 in a manner described below in the conduction management mode. The needle electrical conduction sensor 21 is equipped with an ohmmeter installed between the needle 18 and the stage 12 to detect electrical conduction between the needle 18 and the stage 12. When the needle 18 and the stage 12 are spaced from each other (i.e. there is the gap L2 between the needle 18 and the stage 12), electrical resistance is infinite. However, as both of the needle 18 and the stage 12 become gradually covered with a conductive deposition film and thus the gap L2 becomes gradually filled with the conductive deposition film, the electrical resistance value between the needle 18 and the stage 12 gradually decreases. The computer 23 determines that the needle 18 and the stage 12 are electrically connected when the electrical resistance value is equal to or lower than a predetermined electrical resistance value. Further, from a previous study, the computer 23 may determine that the deposition film has sufficient mechanical strength and the sample piece Q is reliably connected the columnar portion 34 when the electrical resistance value between the needle 18 and the stage 12 reaches the predetermined electrical resistance value.

Meanwhile, when electrical conduction between the columnar portion 34 and the needle 18 is detected (OK in Step S246), the computer 23 determines that the columnar portion 34 and the sample piece Q attached to the needle 18 are connected to each other by the deposition film (OK for connection), regardless of whether a predetermined deposition process time has elapsed or not, then stops the formation of the deposition film, and executes the subsequent processing (i.e., processing of Step S260 and subsequent steps thereof) in Step S247. On the other hand, when no electrical conduction between the columnar portion 34 and the needle 18 is detected (NG in Step S246), the processing proceeds to Step S248.

In Step S248, the computer 23 determines whether or not the deposition film is formed for the normal time (for example, a time longer than the predetermined deposition process time by a predetermined time). When the formation of the deposition film planned to be continued for the normal time is not completed (NG in Step S248), the processing is returned to Step S246. When the formation of the deposition film planned to be continued for the normal time is completed (OK in Step S248) in a state in which electrical conduction between the columnar portion 34 and the needle 18 is not detected by the needle electrical conduction sensor 21, the computer 23 determines that the columnar portion 34 is non-conductive but the columnar portion 34 and the sample piece Q attached to the needle 18 are connected by the deposition film (OK for connection) in Step S249. When it is determined that the columnar portion 34 and the sample piece Q are connected by the deposition film (OK for connection) in the state in which electrical conduction between the columnar portion 34 and the needle 18 is not detected, the subsequent processing (processing of Step S260 and subsequent steps thereof) is switched to the time management mode from the conduction management mode in Step S250. The computer 23 may inform an operator of the mode switching from the conduction management mode to the time management mode by using the display device or a warning sound. Alternatively, it may be recorded as information such as data log generated during the automatic sampling operation.

In addition, in Step S251, the computer 23 determines whether or not the columnar portion 34 and the sample piece Q attached to the needle 18 are connected by the deposition film by determining whether or not the formation of the deposition film planned to be continued for the normal time (for example, a time longer than the predetermined deposition process time by a predetermined time) is completed.

When the computer 23 determines that the columnar portion 34 and the sample piece Q are not connected when the formation of the deposition film planned to be continued for the normal time is not completed (NG in Step S251) in the time management mode, the computer 23 repeatedly performs the determination process of determining whether the columnar portion 34 and the sample piece Q are connected until the formation of the deposition film planned to be continued for the normal time is completed. On the contrary, when the formation of the deposition film planned to be continued for the normal time set for the time management mode is completed (OK in Step S251), the computer 23 determines that the columnar portion 34 and the sample piece Q attached to the needle 18 are connected (OK for connection), and executes the subsequent processing (processing of Step S260 and subsequent steps) in Step S252.

The electrical characteristic detected by the needle electrical conduction sensor 21 may not be limited to electrical resistance but current or voltage also may be detected as the electrical characteristic between the columnar portion 34 and the sample piece Q. When the predetermined electrical characteristic (electrical resistance value, current value, potential, or the like) is not obtained within a predetermined time, the time for forming the deposition film is extended. Optimal deposition times during which an optimal deposition film can be formed are obtained in advance in accordance with the gap L2 between the columnar portion 34 and the sample piece Q, irradiation beam condition, and gas species for a deposition film, and the formation of a deposition film is stopped when the predetermined optimal deposition time elapses.

Figures 25, 26:
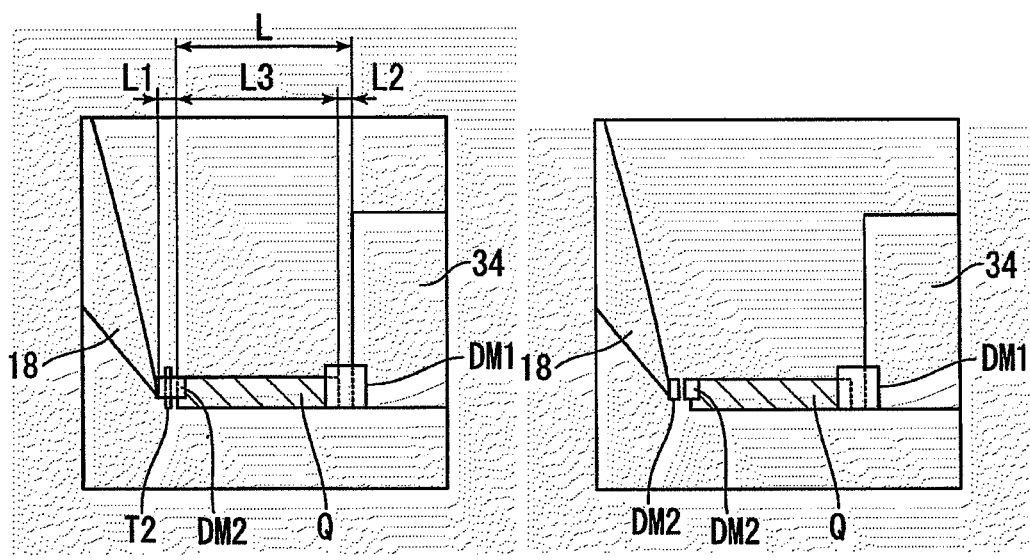
FIG. 25 is a diagram illustrating a processing range in which the sample piece connected with the needle is connected to the sample base, in an image formed by a focused ion beam of the charged particle beam apparatus according to the embodiment of the present invention.
FIG. 26 is a diagram illustrating a cutting position at which a deposition film that connects the needle and the sample piece is cut, in an image formed by a focused ion beam of the charged particle beam apparatus according to the embodiment of the present invention.

The computer 23 stops the gas supply and the irradiation of the focused ion beam when the connection between the sample piece Q and the columnar portion 34 is confirmed. FIG. 25 illustrates this state, and is a diagram illustrating the deposition film DM1 that connects the sample piece Q connected with the needle 18 and the columnar portion 34, in the image data formed by the focused ion beam of the charged particle beam apparatus 10 according to the embodiment of the present invention.

Next, the computer 23 cuts the deposition film DM2 that connects the needle 18 and the sample piece Q to separate the sample piece Q from the needle 18 in Step S260.

FIG. 25 illustrates this state. FIG. 25 is a diagram illustrating the cutting position T2 at which the deposition film DM2 connecting the needle 18 and the sample piece Q is cut, in the image data formed by a focused ion beam of the charged particle beam apparatus 10 according to the embodiment of the present invention. The computer 23 sets a position spaced from the side surface of the columnar portion 34 by a first distance as the cutting position T2, in which the first distance is the sum (L+L1/2) of the predetermined distance L, which is the sum (L2+L3) of the gap L2 between the side surface of the columnar portion 34 and the side surface of the sample piece Q and a size L3 of the sample piece Q, and half the predetermined distance L1 (see FIG. 25) that is the size of the gap between the needle 18 and the sample piece Q. Further, the cutting position T2 may be a position spaced from the side surface of the columnar portion 34 by a second distance that is the sum (L+L1) of the predetermined distance L and the size L1 of the gap between the needle 18 and the sample piece Q. In this case, the deposition film DM2 (carbon deposition film) remaining at the tip of the needle has a small size, and thus the frequency of cleanings (to be described later) of the needle 18 is reduced, which is preferable for continuous automatic sampling.

The computer 23 can separate the needle 18 from the sample piece Q by irradiating the cutting position T2 with a focused ion beam for a predetermined time. The computer 23 separates the needle 18 from the sample piece Q without cutting the needle 18 by irradiating the cutting position T2 with a focused ion beam for a predetermined time so as to cut only the deposition film DM2. In Step S260, it is important to cut only the deposition film DM2. Thereby, the needle 18 that is once mounted can be repeatedly used without being replaced for a long period of time, so automatic sampling can be repeated continuously and unattended. FIG. 26 illustrates this state, and is a diagram illustrating a state in which the needle 18 is separated from the sample piece Q, which can be observed from the image data of the focused ion beam irradiated by the charged particle beam apparatus 10 according to the embodiment of the present invention. Residue of the deposition film DM2 is attached to the tip of the needle.

Figure 27:
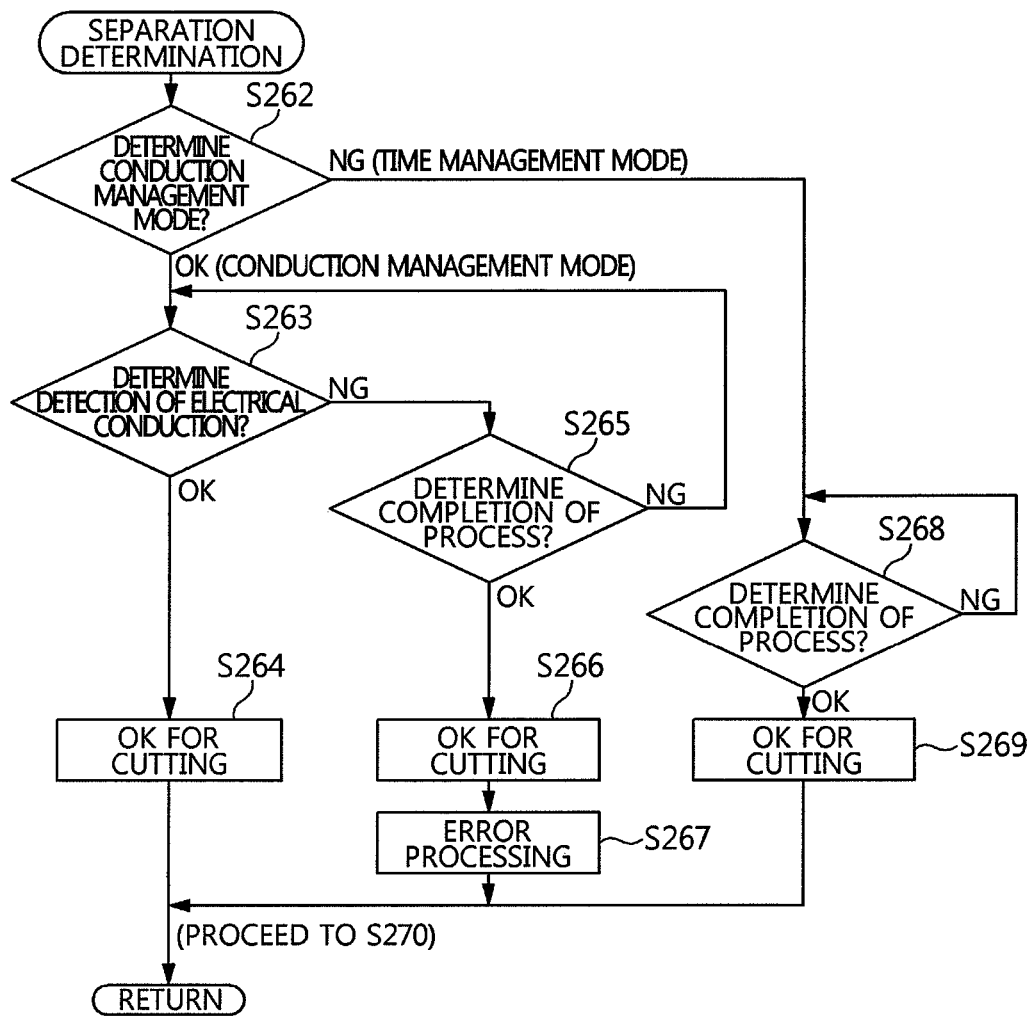
FIG. 27 is a flowchart illustrating the operation of the charged particle beam apparatus according to the embodiment of the present invention and, specifically, illustrating a separation determination process of FIG. 21.

In Step S261, the computer 23 determines whether or not the needle 18 is cut away from the sample piece Q by performing different processes according to the modes: the conduction management mode set in Step S122 and the time management mode set in Step S213 or S250. FIG. 27 is a flowchart illustrating the process flow of Step S261.

First, the computer 23 determines whether the conduction management mode is set or the time management mode is set, in Step S262. When the conduction management mode is set (OK in Step S262), the computer 23 determines whether or not the needle 18 is cut away from the sample piece holder P by detecting electrical conduction between the sample piece holder P and the needle 18 based on a signal output from the needle electrical conduction sensor 21. When the time management mode is set (NG in Step S262), the computer 23 determines whether or not the needle 18 is cut away from the sample piece holder P by determining whether or not the cutting process planned to be continued for a predetermined time is completed.

In the conduction management mode, in Step S263, the computer 23 determines whether or not the electrical conduction between the sample piece holder P and the needle 18 is not detected within the predetermined time during which the processing of Step S260 is continued, based on a signal output from the needle electrical conduction sensor 21. When the electrical conduction between the sample piece holder P and the needle 18 is not detected (OK), the computer 23 determines that the needle 19 is cut away from the sample piece holder P (OK for cutting) regardless of whether the predetermined time has elapsed or not. In this case, the computer 23 stops the cutting process and executes the subsequent processing (processing of Step S270 and subsequent processes thereof) in Step S264. On the contrary, the electrical conduction between the sample piece holder P and the needle 18 is detected (NG in Step S263), the computer 23 performs the processing of Step S265.

In Step S265, the computer 23 determines whether or not the cutting process planned to be continued for a predetermined time is completed, i.e., whether or not a process in which the cutting position T2 within the deposition film DM2 between the needle 18 and the sample piece Q is irradiated by a focused ion beam for a predetermined time is completed. When it is determined that the cutting process planned to be continued for the predetermined time is not completed (NG in Step S265), the computer 23 returns the processing to Step S263. Meanwhile, when the cutting process planned to be continued for the predetermined time is completed (OK in Step S265) but the electrical conduction between the sample piece holder P and the needle 18 is detected by the needle electrical conduction sensor 21, the computer 23 determines that the needle 18 is not cut away from the sample base 33 (NG for cutting) in Step S266. When it is determined that the needle 18 is not cut away from the sample piece holder P (NG for cutting), the computer 23 informs an operator of the state in which the separation between the needle 18 and the sample piece Q is not completed, by using the display device 22 or making a warning sound (error processing), and then interrupts the subsequent processing (Step S270 and subsequent steps thereof).

In addition, in Step S268, the computer 23 determines whether or not the needle 18 is cut away from the sample piece holder P by determining whether or not the cutting process planned to be continued for the normal time, which is a time longer than the predetermined cutting process time by a predetermined time and which is set for the time management mode, is completed. In the case where it is determined that the cutting process planned to be performed for the normal time set for the time management mode is completed (NG in Step S268), the computer 23 determines that the needle 18 is not been cut away from the sample piece holder P and continuously performs the determination process until the cutting process planned to be continued for the normal time is completed. In the case where the computer 23 determines that the needle 18 is not been cut away from the sample piece holder P based on the determination result that the cutting process planned to be continued for the normal time set for the time management mode is not completed, the computer 23 does not perform the error processing which is performed in the conduction management mode but continuously performs the determination process until the cutting process planned to be continued for the normal time is completed. In the case where the cutting process planned to be continued for the normal time set for the time management mode is completed (OK in Step S268), the computer 23 determines that the needle 18 is cut away from the sample piece holder P (OK for cutting) and performs the subsequent processing (Step S270 and subsequent steps thereof) in Step S269.

In addition, when it is determined that the needle 18 is cut away from the sample piece holder P (OK for cutting), the computer 23 records information on operation mode in the form of a carved mark by performing various processes, such as etching or trimming, for example, or by irradiating the columnar portion 34 to which the sample piece Q is connected with a focused ion beam. The information on operation mode refers to information indicating a state in which the conduction management mode or the time management mode is set, information indicating a state in which the conduction management mode is not set but the time management mode is set, or the like.

Figure 28:
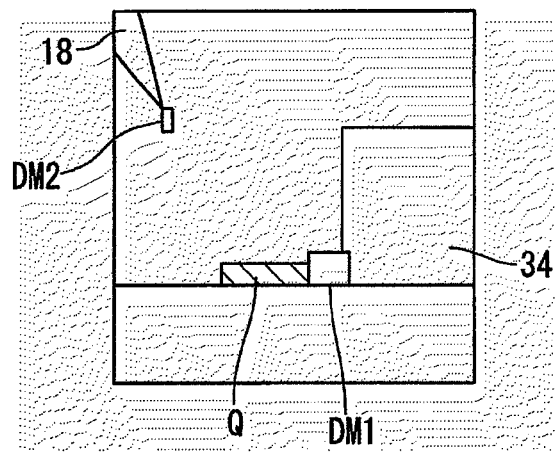
FIG. 28 is a diagram illustrating a state in which the needle is evacuated, in image data obtained by a focused ion beam of the charged particle beam apparatus according to the embodiment of the present invention.
Figure 29:
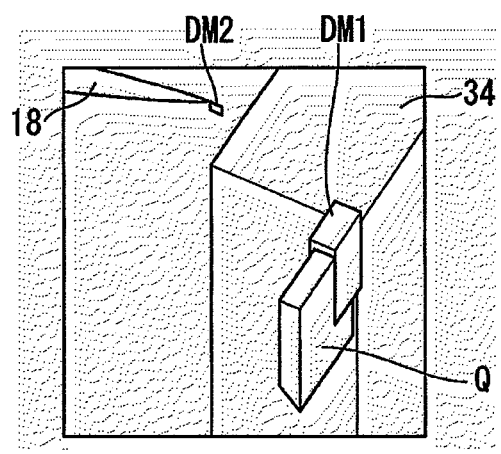
FIG. 29 is a diagram illustrating a state in which the needle is evacuated, in an image obtained by an electron beam of the charged particle beam apparatus according to the embodiment of the present invention.

Next, the computer 23 performs a needle evacuation process in Step S270. The computer 23 causes the needle driving mechanism 19 to move the needle 18 away from the sample piece Q by a predetermined distance. For example, the needle 18 is raised by a distance such as 2 mm, 3 mm, or the like in the vertical direction, i.e., the positive direction of the Z direction. FIGS. 28 and 29 illustrate this state, i.e. the state in which the needle 18 is raised to be disposed directly above the sample piece Q. FIG. 28 is a schematic diagram illustrating this state by using an image formed by a focused ion beam of the charged particle beam apparatus 10 according to the embodiment of the present invention, and FIG. 26 is a schematic diagram illustrating this state by using an image formed by an electron beam.

Next, it is determined whether or not to continue sampling at a different position within the same sample S in Step S280. Since the setting of the number of sample pieces to be sampled is registered in advance in Step S010, the computer 23 checks this data and determines whether or not to perform the next process. When sampling is to be continued, the processing returns to Step S030, and the subsequent processing is continued as described above so that sampling operation can be continuously performed. When sampling is not to be continued, the series of processes ends.

Note that template creation of the needle in Step S050 can be performed immediately after Step S280. In this case, it is not necessary to perform Step S050 at the time of preparing for sampling of the next sample piece, the overall operation process can be simplified.

Thus, the series of automatic sampling operations is completed.

Note that the above-described flow from the start to the end is merely an example, and some steps may be substituted or skipped as long as such substitution or skipping has no obstacle to the overall processing.

By continuously performing the above-described flow from the start to the end, the computer 23 can perform the sampling operation as unattended. With the method described above, it is possible to repeatedly perform sampling without replacing the needle 18. That is, it is possible to continuously sample a large number of sample pieces Q using the same one needle 18.

Thereby, when separating and extracting the sample pieces Q from the sample S, the needle 18 can be repeatedly used without reshaping or replacement in the charged particle beam apparatus 10. That is, a large number of sample pieces Q can be automatically obtained from one sample S, and the sampling can be carried out without manual operation (intervention) of an operator as in the past.

As described above, in the case of using the charged particle beam apparatus 10 according to the embodiment of the present invention, when connecting the needle 18 and the sample piece Q, even though electrical conduction is not detected between the needle 18 and the sample piece Q, since the time management mode is set, the sample piece can be appropriately and efficiently transferred. Furthermore, even in the state in which whether the sample piece Q is conductive or non-conductive is not confirmed, the computer 23 enables appropriate and efficient sampling including the process of connecting or separating the needle 18 and the sample piece Q and the process of connecting or separating the sample piece Q held by the needle 18 and the sample piece holder P. Therefore, it is possible to continuously and automatically perform the sampling operation of extracting the sample piece Q formed by processing the sample S with a focused ion beam and transferring the sample piece Q to the sample piece holder P.

Furthermore, even in the state in which the time management mode is set, the setting of the time management mode is cancelled when electrical conduction between the sample piece Q held by the needle 18 and the sample piece holder P is detected. Therefore, it is possible to prevent efficiency deterioration of each process.

Furthermore, when the connection process of connecting the sample piece Q held by the needle 18 and the sample piece holder P is performed in the state in which the time management mode is not set, since the time management mode is set when electrical conduction is not detected between the needle 18 and the sample piece holder P, each process can be appropriately and efficiently performed even when it is not confirmed whether the sample piece holder P is conductive or non-conductive.

In addition, in the case where the time management mode is set, since the computer 23 enhances the contrast of the image formed through irradiation of a charged particle beam in comparison with the image obtained in the state in which the time management mode is not set. Therefore, image recognition can be easily performed even when the sample piece Q or the sample piece holder is non-conductive.

In addition, the computer 23 can easily provide an operator with information regarding whether the sample piece Q or the sample piece holder is conductive or non-conductive so that at least any one of the following processes can be performed: (a) information indicating that the time management mode is set is stored; (b) the information is output; and (c) the information is recorded on an object (for example, the columnar portion 34) by a focused ion beam.

In addition, since the computer 23 performs mode switching between the time management mode and the conduction management mode based on the signal output from the needle electrical conduction sensor 21, each process can be appropriately and efficiently performed even in the state in which it is not confirmed whether the sample piece Q or the sample piece holder P is conductive or non-conductive. When the computer 23 determines whether the needle 18 and the sample piece Q are connected or separated or whether the sample piece Q held by the needle 18 and the sample piece holder P are connected or separated, the computer 23 can obtain an appropriate determination result due to the presence of the time management mode even in the state in which it is not confirmed whether the sample piece Q or the sample piece holder P is conductive or non-conductive. In the case in which the sample piece Q or the sample piece holder P is conductive, the computer 23 can shorten the time required for the determination by using the conduction management mode and improve the reliability of the determination result.

In addition, since the needle electrical conduction sensor 21 detects at least any one of electrical resistance, current, and potential as the electrical characteristic between the needle 18 and the sample piece Q or the electrical characteristic between the needle 18 and the columnar portion 34, it is possible to accurately detect electrical connection and electrical disconnection between the needle 18 and the sample piece Q or between the needle 18 and the columnar portion 34.

Furthermore, the computer 23 controls the focused ion beam irradiation optical system 14, the electron beam irradiation optical system 15, the stage driving mechanism 13, the needle driving mechanism 19, and the gas supply unit 17, based on the actually acquired templates of at least the sample piece holder P, the needle 18, and the sample piece Q. Therefore, the operation of transferring the sample piece Q to the sample piece holder P can be appropriately automated.

Furthermore, since the templates are created from secondary electron images or absorption current images acquired by scanning a charged particle beam in the state in which there is no structure in the backgrounds of at least the sample piece holder P, the needle 18, and the sample piece Q, reliability of the templates can be improved. Thereby, the accuracy of template matching using the templates can be improved, and the sample piece Q can be accurately transferred to the sample piece holder P, based on the position information obtained through the template matching.

Although it is instructed that no structure exists in the backgrounds of at least the sample piece holder P, the needle 18, and the sample piece Q, when the instruction is not fulfilled, the positions of at least the sample piece holder P, the needle 18, and the sample piece Q are initialized. Therefore, each of the driving mechanisms 13 and 19 can return to a normal state.

Furthermore, since the templates are created for each of a plurality of postures of the sample piece Q when the sample piece Q is transferred to the sample piece holder P, the positional accuracy at the time of transferring the sample piece Q can be improved.

Furthermore, since the distances among the sample piece holder P, the needle 18, and the sample piece Q are measured based on the template matching using the templates of at least the sample piece holder P, the needle 18, and the sample piece Q, the positional accuracy at the time of transferring the sample piece can be further improved.

Furthermore, when it is impossible to extract an edge of a predetermined region in each of the image data of the sample piece holder P, the needle 18, and the sample piece Q, image data is obtained again. Therefore, the templates can be accurately created.

Since the sample piece Q is finally moved to a predetermined position within the sample piece holder P by being moved only within a plane that is in parallel with the surface of the stage 12, the sample piece Q can be properly transferred.

Furthermore, since the sample piece Q held by the needle 18 is shaped before the template thereof is prepared, the accuracy of edge extraction at the time of template formation can be improved, and the shape of the sample piece Q, which is suitable for finish processing to be performed later, can be obtained. Furthermore, since the position for the shaping process is set depending on the distance from the needle 18, it is possible to perform the shaping process with high accuracy.

Furthermore, when the needle 18 holding the sample piece Q is rotated so as to be in a predetermined posture, the positional deviation of the needle 18 can be corrected through eccentricity correction.

Further, with the charged particle beam apparatus 10 according to the embodiment of the present invention, the computer 23 can detect the relative position of the needle 18 with respect to the reference mark Ref when the sample piece Q is formed, and can determine the positional relationship of the needle 18 with respect to the sample piece Q 18. The computer 23 continuously detects the relative position of the needle 18 with respect to the sample piece Q so as to drive the needle 18 in a three-dimensional space, appropriately, i.e., by preventing the needle 18 from coming into contact with other members or equipment.

Furthermore, by using the image data acquired from at least two different directions, the computer 23 can accurately determine the position of the needle 18 in a three-dimensional space. As a result, the computer 23 can appropriately three-dimensionally drive the needle 18.

Furthermore, since the computer 23 uses image data actually generated just before the movement of the needle 18 as templates (reference image data), the template matching can be performed with high matching accuracy regardless of the shape of the needle 18. Thereby, the computer 23 can accurately determine the position of the needle 18 in a three-dimensional space, and can appropriately drive the needle 18 in the three-dimensional space. Furthermore, the computer 23 evacuates the stage 12 and acquires image data or absorption current image data in a state in which there is no complicated structure in the background of the needle 18. Therefore, the computer 23 can acquire a template from which the shape of the needle 18 can be clearly recognized without influence of the background.

Further, since the needle 18 and the sample piece Q are connected by the deposition film rather than being in a direct contact with each other, the computer 23 can prevent the needle 18 from being cut when the needle 18 and the sample piece Q are separated in a later process. Furthermore, even when the needle 18 vibrates, it is possible to suppress the vibration of the needle 18 from being transmitted to the sample piece Q. Furthermore, even when the movement of the sample piece Q occurs due to the creep phenomenon of the sample S, excessive strain between the needle 18 and the sample piece Q can be suppressed.

Furthermore, when the sample piece Q is conductive, in the case where the sample S and the sample piece Q are cut away through a sputtering process, i.e., irradiation of a focused ion beam, the computer 23 can determine whether or not the cutting is actually completed by detecting electrical conduction between the sample S and the needle 18.

Furthermore, since the computer 23 informs an operator of the state in which the separation between the sample S and the sample piece Q is not completed, even in the case where the execution of the processes that are to be automatically performed is stopped, the cause of this interruption can be easily recognized by the operator.

Further, when electrical conduction between the sample piece S and the needle 18 is detected, the computer 23 determines that disconnection between the sample piece S and the sample piece Q is not actually completed and then disconnects the sample piece Q and the needle 18 in preparation for subsequent driving of the needle 18 such as evacuation of the needle 18. As a result, the computer 23 can prevent troubles such as displacement of the sample S or breakage of the needle 18 attributable to driving of the needle 18.

Further, when the sample piece Q is conductive, the computer 23 may drive needle 18 after confirming that disconnection between the sample A and the sample piece Q is actually completed by detecting electrical conduction or non-conduction between the sample piece Q and the needle 18. Thereby, the computer 23 can prevent occurrence of troubles such as breakage of the needle 18 or the sample piece Q or positional deviation of the sample piece Q, attributable to the driving of the needle 18.

Further, since the computer 23 uses actual image data as a template of the needle 18 connected to the sample piece Q, template matching is performed with high matching accuracy regardless of the shape of the needle 18 connected to the sample piece Q. Thereby, the computer 23 can accurately determine the position of the needle 18 connected to the sample piece Q in a three-dimensional space, and can appropriately drive the needle 18 and the sample piece Q in the three-dimensional space.

Further, since the computer 23 obtains the positions of a plurality of columnar portions 34 constituting a sample base 33, using the template of the known sample base 33, it is possible to check whether there is a sample base 33 that is in a proper state prior to the driving of the needle 18.

Further, the computer 23 can indirectly and accurately determine whether the needle 18 and the sample piece Q reach the vicinity of the movement target position, by detecting a change in the absorption current before and after the needle 18 connected to the sample piece Q reaches the irradiation region. Thereby, the computer 23 can stop the movement of the needle 18 and the sample piece Q without a risk that the needle 18 and the sample piece Q come into contact with other members such as the sample base 33 existing at the movement target position, and can prevent occurrence of troubles such as damage caused by the contact.

Furthermore, in the case where the sample piece Q and the sample stage 33 are conductive, when the sample piece Q and the sample base 33 are connected by a deposition film, the computer 23 can accurately reliably determine whether or not the sample piece Q and the sample base 33 are actually connected by detecting electrical conduction or non-conduction between the sample piece Q and the sample stage 33.

Further, when the sample piece Q and the sample stage 33 are conductive, the computer 23 can disconnect the sample piece Q and the needle from each other after confirming that connection between the sample base 33 and the sample piece Q is actually completed and checking electrical conduction or non-conduction between the sample base 33 and the needle 18.

In addition, by matching the actual shape of the needle 18 with an ideal reference shape, the computer 23 can easily recognize the needle 18 through pattern matching when driving the needle 18 in a three-dimensional space, and can precisely detect the position of the needle 18 in the three-dimensional space.

Hereinafter, a first modification of the above-described embodiment will be described.

Figure 30:
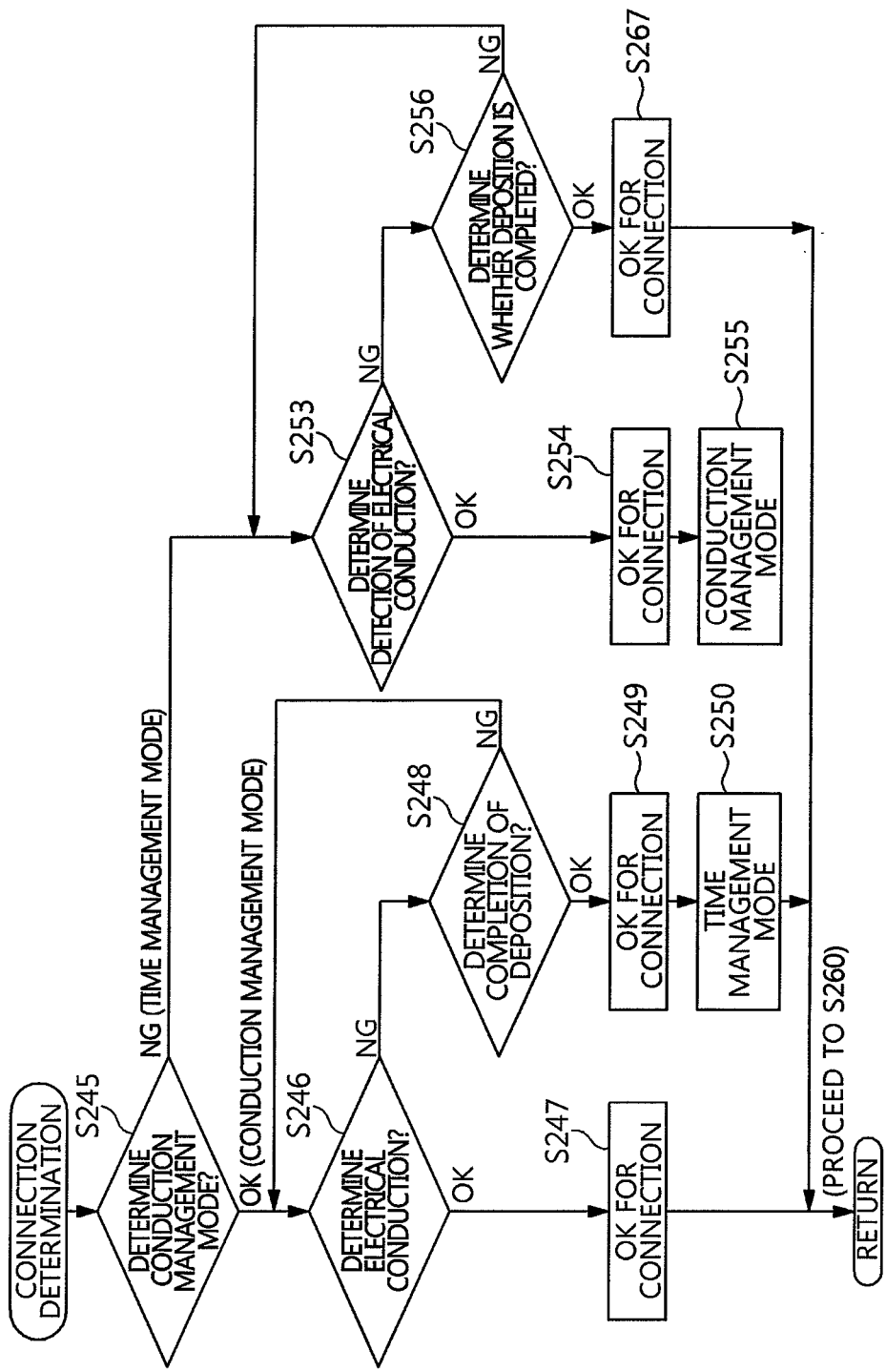
FIG. 30 is a flowchart illustrating the operation of the charged particle beam apparatus according to the embodiment of the present invention and, specifically, illustrating the connection determination process of FIG. 21.

In the above-described embodiment, in Step S242, although the time management mode is set, the computer 23 may first determine whether or not electrical conduction between the columnar portion 34 and the needle 18 is detected within a predetermined time, and then determine whether or not formation of the deposition film planned to be continued for the normal time is completed. FIG. 30 is a flowchart illustrating the process flow of Step S242. The processing (Step S245 to Step S250) of the conduction management mode illustrated in FIG. 30 is the same as the processing (Step S245 to Step S250) of the conduction management mode illustrated in FIG. 24.

In the time management mode, in Step S253, the computer 23 determines whether or not electrical conduction between the columnar portion 34 and the needle 18 is detected within a predetermined time during which the processing of Step S241 is continued, based on a signal output from the needle electrical conduction sensor 21.

In the case where electrical conduction between the columnar portion 34 and the needle 18 is detected (OK in Step S253), the computer 23 determines that the columnar portion 34 and the sample piece Q attached to the needle 18 are connected by the deposition film (OK for connection) regardless of whether a predetermined deposition process time has elapsed and stops the formation of the deposition film in Step S254. Next, the computer 23 switches its operation mode for the subsequent processing, from the time management mode to the conduction management mode. That is, even in the case in which the time management is set due to the fact that the sample piece Q is non-conductive, in the case where detection of electrical conduction by the needle electrical conduction sensor 21 becomes valid with time due to gradual accumulation of the deposition film on the surface of the sample piece Q through the repeated deposition film formation, the computer 23 can set the conduction management mode. On the other hand, when electrical conduction between the columnar portion 34 and the needle 18 is not detected (NG in Step S253), the processing proceeds to Step S256. Additionally, the computer 23 can inform an operator of the mode switching from the time management mode to the conduction manage mode by displaying it on the display device 22 or making a warning sound. Alternatively, the computer 23 may record it as information such as data log generated during the automatic sampling operation.

In Step S256, the computer determines whether or not the columnar portion 34 and the sample piece Q attached to the needle 18 are connected by the deposition film by determining whether or not the formation of the deposition film planned to be continued for the normal time which is a time longer than the predetermined deposition process time by a predetermined time is completed. In the case where the formation of the deposition film planned to be continued for the normal time is not completed (NG in Step S256), the computer 23 determines that the columnar portion 34 and the sample piece Q are not actually connected to each other and repeatedly performs this determination process until the formation of the deposition film planned to be continued for the normal time is completed. Meanwhile, in the case where the formation of the deposition film planned to be continued for the normal time set for the time management mode is completed (OK in Step S256), the computer 23 determines that the columnar portion 34 and the sample piece Q attached to the needle 18 is connected (OK for connection), and performs the subsequent processing (Step S260 and subsequent steps thereof).

Hereinafter, a second modification of the above-described embodiment will be described.

In the above-described embodiment, in the conduction management mode of Step S242, in the case where the formation of the deposition film is completed (OK in Step S248) in the state in which electrical conduction between the columnar portion 334 and the needle 18 is not detected, the computer 23 determines that the columnar portion 34 and the sample piece Q are connected by the deposition film (OK for connection) in Step S249. However, the present invention is not limited thereto.

That is, in the case where the formation of the deposition film is completed (OK in Step S248) in the state in which electrical conduction between the columnar portion 334 and the needle 18 is not detected, the computer 23 may determine that the columnar portion 34 and the sample piece Q are not connected by the deposition film (NG for connection) on the premise that the columnar portion 34 is conductive. In this case, the computer 23 performs a process of cutting the deposition film DM2, by which the sample piece Q and the needle 18 are connected, with the use of a focused ion beam, then performs the process of destroying the sample piece attached to the tip of the needle, and then performs the process of evacuating the needle 18 (Step S270).

Hereinafter, a third modification of the above-described embodiment will be described.

In the above-described embodiment, the needle 18 is not irradiated with a focused ion beam, so that the needle 18 is not likely to be deformed or reduced. Therefore, shaping or replacing of the needle 18 is not necessary. However, the computer 23 can perform a removal process (also referred to as cleaning of the needle 18) of removing a carbon deposition film attached to the tip of the needle 18 at appropriate timing, for example, whenever a predetermined number of samplings are performed, in the case where the automatic sampling operation is repeatedly performed. For example, the cleaning may be performed once for every 10 automatic samplings. Hereinafter, a method of determining the timing for the cleaning of the needle 18 will be described.

As a first method, a secondary electron image of the tip of the needle is acquired through irradiation of an electron beam periodically or before automatic sampling is performed, at a position at which no complex structure exists in the background of the needle. With the use of the secondary electron image, even a carbon deposition film attached to the tip of the needle can be clearly recognized. The secondary electron image is stored in the computer 23.

Next, with the needle 18 being stationed, an absorption current image of the needle 18 is acquired using the same field of view and the same observation magnification as those used to acquire the secondary electron image. In the absorption current image, the carbon deposition film cannot be recognized but only the shape of the needle 18 can be recognized. This absorption current image is also stored in the computer 23.

Here, by subtracting the absorption current image from the secondary electron image, the needle 18 is erased, and the shape of the carbon deposition film protruding from the tip of the needle is emphasized. When the area of the emphasized carbon deposition film exceeds a predetermined area, the carbon deposition film is cleaned away in such a manner that the needle 18 is not cut through irradiation of a focused ion beam. Note that it is not necessary to remove the carbon deposition film when its area is equal to or smaller than the predetermined area.

Next, as a second method, instead of using the area of the emphasized carbon deposition film to determine timing for cleaning, when the length of the carbon deposition film, i.e., a length thereof in the axial direction (longitudinal direction) of the needle 18 is greater than a predetermined value, it may be determined that it is time to perform the cleaning of the needle 18.

Furthermore, as a third method, the image coordinates of the tip of the carbon deposition film on the secondary electron image stored in the computer are recorded. In addition, the image coordinates of the tip of the needle on the absorption current image stored in the computer 23 are also recorded. Here, the length of the carbon deposition film can be calculated from the coordinates of the tip of the carbon deposition film and the coordinates of the tip of the needle 18. When the length of the carbon deposition film is greater than a predetermined value, it may be determined that it is time to perform the cleaning of the needle 18.

Further, as a fourth method, a template of an optimal needle tip shape including a carbon deposition film is created in advance, and the template is superimposed on the secondary electron image of the tip of the needle after sampling is repeated a plurality of times. Portions protruding from the template may be deleted by a focused ion beam.

Further, as a fifth method, instead of using the area of the emphasized carbon deposition film to determine timing for cleaning, when the thickness of the carbon deposition film at the tip of the needle 18 exceeds a predetermined thickness, it is determined that it is time to perform cleaning of the needle 18.

The cleaning may be performed, for example, immediately after Step S280 in FIG. 21.

The cleaning is performed according to the above-mentioned method and the like. Meanwhile, the needle can be replaced at a predetermined time, when a predetermined shape cannot be obtained even after the cleaning is performed, or when the cleaning cannot be performed within a predetermined time. After the needle 18 is replaced, the above processing flow is not changed but a process of preserving the shape of the tip of the needle is performed as described above.

Hereinafter, a fourth modification of the above-described embodiment will be described.

Although, in the above-described embodiment, the needle driving mechanism 19 is unitarily provided with the stage 12, the present invention is not limited thereto. The needle driving mechanism 19 may be provided independently of the stage 12. The needle driving mechanism 19 may be provided independently of tilt-driving of the stage 12 or the like by being fixed to the sample chamber 11 or the like, for example.

Hereinafter, a fifth modification of the above-described embodiment will be described.

In the above-described embodiment, the focused ion beam irradiation optical system 14 has the optical axis aligned with the vertical direction, and the electron beam irradiation optical system 15 has the optical axis inclined with respect to the vertical direction. However, the present invention is not limited thereto. For example, the focused ion beam irradiation optical system 14 may have the optical axis inclined with respect to the vertical direction, and the electron beam irradiation optical system 15 may have the optical axis aligned with the vertical direction.

Hereinafter, a sixth modification of the above-described embodiment will be described.

Although, in the above-described embodiment, the charged particle beam irradiation optical system is composed of the focused ion beam irradiation optical system 14 and the electron beam irradiation optical system 15 to irradiate a target with two different beams, the present invention is not limited thereto. For example, the charged particle beam irradiation optical system may not include the electron beam irradiation optical system 15 but include only the focused ion beam irradiation optical system 14 arranged in the vertical direction. Ions used in this case are negatively charged ions.

In the above-described embodiment, in the above-described several steps, the sample piece holder P, the needle 18, the sample piece Q, and the like are irradiated with the electron beam and the focused ion beam at different angles, so that the images formed by the electron beam and the focused ion beam are acquired. In addition, the positions of the sample piece holder P, the needle 18, the sample piece Q, etc. and the positional relationships among them are then determined. However, only the focused ion beam irradiation optical system 14 may be mounted and only the image of the focused ion beam may be acquired. Herein below, this example will be described.

For example, when determining the positional relationship between the sample piece holder P and the sample piece Q in Step S220, an image of a focused ion beam is acquired in a state in which both the sample piece holder P and the sample piece Q are within in the same field of view for each of the case where the stage 12 is aligned in parallel with the horizontal direction and the case where the stage 12 is inclined at a predetermined angle with respect to the horizontal direction, and the three dimensional positional relationship between the sample piece holder P and the sample piece Q can be determined from the both images. As described above, since the needle driving mechanism 19 can integrally move with the stage 12 in the horizontal direction and the vertical direction, and can be tilted, the relative positional relationship between the sample piece holder P and the sample piece Q is maintained regardless of whether the stage 12 is in a horizontal posture or an inclined posture. Therefore, even when the charged particle beam irradiation optical system is composed of only one optical system (the focused ion beam irradiation optical systems 14), it is possible to observe and process the sample piece Q from two different directions.

Similarly, the registration of the image data of the sample piece holder P in Step S020, the recognition of the position of the needle in Step S040, the acquisition of the template (reference image) of the needle in Step S050, the acquisition of the reference image of the needle 18 connected to the sample piece Q in Step S170, the recognition of the attachment position of the sample piece Q in Step S210, and the stopping of the needle movement in Step S240 may be performed in the same manner.

Also when the sample piece Q and the sample piece holder P are connected in Step S241, when the stage 12 is in a horizontal posture, the sample piece Q is connected to the sample piece holder P by forming a deposition film, in the vertical direction, on the upper end surfaces of the sample piece holder P and the sample piece Q. Furthermore, since it is possible to form the deposition film from different directions by tiling the stage 12, a reliable connection between the sample piece Q and the sample piece holder P can be made.

Hereinafter, a seventh modification of the above-described embodiment will be described.

Although, in the embodiment described above, the computer 23 automatically performs the series of processes from Step S010 to Step S280 as the automatic sampling operation, the present invention is not limited thereto. The computer 23 may replace processing of at least one step among the steps from Step S010 to Step S280 with manual processing performed by an operator.

Further, when performing the automatic sampling operation with respect to a plurality of sample pieces Q, whenever one of the plurality of sample pieces Q, which is to be immediately extracted, is formed on a sample S, the computer 23 may perform the automatic sampling operation with respect to the corresponding sample piece Q that is to be immediately extracted. Meanwhile, the computer 23 also may continuously perform the automatic sampling operation with respect to each of the plurality of sample pieces Q which are to be immediately extracted, after all of the sample pieces Q are formed in the sample.

Hereinafter, an eighth modification of the above-described embodiment will be described.

Although, in the embodiment described above, the computer 23 obtains the position of the columnar portion 34 using the known template of the columnar portion 34, the reference pattern that is created in advance from the image data of the actual columnar portion 34 may be used as the template. Further, the computer 23 may use a pattern created at the time of performing an automatic process of forming the sample base 33 as the template.

Further, in the embodiment described above, the computer 23 may determine the relative positional relationship between the sample base 33 and the needle 18, using the reference mark Ref formed through irradiation of the charged particle beam at the time of forming the columnar portion 34. The computer 23 sequentially detects the relative position of the needle 18 with respect to the position of the sample base 33, thereby driving the needle 18 in a three-dimensional space, appropriately, i.e., by preventing the needle 18 from coming into contact with other members or equipment.

Hereinafter, a ninth modification of the above-described embodiment will be described.

In the above-described embodiment, the processing of from Step S220 to Step S241 for connecting the sample piece Q to the sample piece holder P may be alternatively performed in a manner described below. In other words, the positional relationship (distance) between the columnar portion 34 of the sample piece holder P and the sample piece Q is obtained from the images thereof, and the needle driving mechanism 19 is operated such that the calculated distance between the columnar portion 34 and the sample piece Q becomes equal to a target value.

Figure 31:
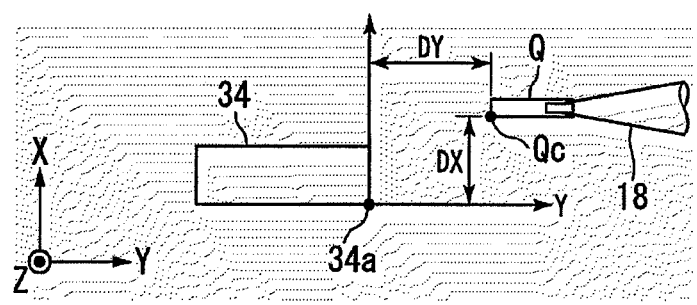
FIG. 31 is an explanatory view illustrating a positional relationship between the columnar portion and the sample piece, based on an image formed by a focused ion beam of the charged particle beam apparatus according to the embodiment of the present invention.
Figure 32:
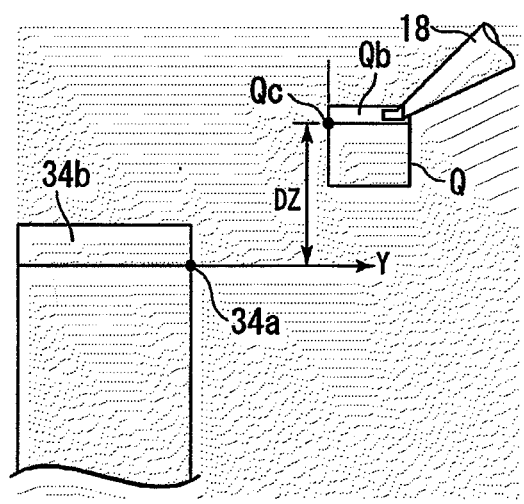
FIG. 32 is an explanatory view illustrating a positional relationship between the columnar portion and the sample piece, based on an image formed by an electron beam, in the charged particle beam apparatus according to the embodiment of the present invention.

In Step S220, the computer 23 recognizes the positional relationships among the needle 18, the sample piece Q, and the columnar portion 34 from secondary particle image data or absorption current image data thereof formed by an electron beam and a focused ion beam. FIGS. 31 and 32 are diagrams schematically illustrating the positional relationship between the columnar portion 34 and the sample piece Q. FIG. 31 is based on an image formed by a focused ion beam and FIG. 32 is based on an image formed by an electron beam. From these figures, the relative positional relationship between the columnar portion 34 and the sample piece Q is measured. As illustrated in FIG. 31, orthogonal three-axis coordinates (coordinates different from the three-axis coordinates of the stage 12) are set with the origin at one corner (for example, the side surface 34a) of the columnar portion 34, and distances DX and DY are measured from the image of FIG. 31 as the distance between the side surface 34a (origin) of the columnar portion 34 and the reference point Qc of the sample piece Q.

A distance DZ is obtained from the image of FIG. 32. However, when it is assumed that the stage is inclined by an angle $\theta$ ($0°<\theta\leq90°$) with respect to the optical axis of the electron beam and the optical axis (vertical direction) of the focused ion beam, the actual distance between the columnar portion 34 and the sample piece Q in the Z axis direction is $DZ/\sin\theta$.

Next, the positional relationship between the columnar portion 34 and the movement stop position of the sample piece Q will be described with reference to FIGS. 31 and 32.

The upper end surface (end face) 34b of the columnar portion 34 and the upper end surface Qb of the sample piece Q are flush with each other and one side surface of the columnar portion 34 and the cross-sectional surface of the sample piece Q are flush with each other, and the columnar portion 34 and the sample piece Q are arranged to have a gap of about 0.5 μm therebetween. That is, by operating the needle driving mechanism 19 such that DX=0, DY=0.5 μm, and DZ=0, it is possible to make the sample piece Q reach the targeted stop position.

In the construction in which the optical axis of the focused ion beam and the optical axis of the electron beam are perpendicular to each other (θ=90°), the distance DZ between the columnar portion 34 and the sample piece Q, which is measured by the electron beam, is an actual distance between the columnar portion 34 and the sample piece Q.

Hereinafter, a tenth modification of the above-described embodiment will be described.

In the above-described embodiment, the needle driving mechanism 19 is operated in Step S230 such that the distance between the columnar portion 34 and the sample piece Q measured from the image of the needle 18 becomes equal to a target value.

The processing of from Step S220 to Step S241 for connecting the sample piece Q to the sample piece holder P in the above-described embodiment may be alternatively performed in a manner described below. In other words, the attachment position at which the sample piece Q is attached to the columnar portion 34 of the sample piece holder P is determined in advance by using the templates, the image of the sample piece Q is aligned with the attachment position through pattern matching, and the needle driving mechanism 19 is operated.

The positional relationship between the movement stop position of the sample piece Q and the columnar portion 34 will be described. The positional relationship is such that the upper end surface 34b of the columnar portion 34 and the upper end surface Qb of the sample piece Q are made to be flush with each other, one side surface of the columnar portion 34 and the cross-sectional surface of the sample piece Q are flush with each other, and a gap of 0.5 μm is provided between the columnar portion 34 and the sample piece Q. The template may be created by extracting the outlines (edges) from an actual secondary electron image or actual absorption current image data of the sample piece holder P or the needle 18 to which sample piece Q is fixed. The template may be a line drawing, a design drawing, or a CAD drawing.

By displaying the columnar portion 34 within the created template to be superimposed on the images of the columnar portion 34 formed in real time by an electron beam and a focused ion beam, and by instructing the needle driving mechanism 19 to operate, the sample piece Q is moved to the movement stop position of the sample piece Q on the template in Step S230. In Step S240, it is confirmed whether images formed by the electron beam and the focused ion beam in real time overlap the movement stop position of the sample piece Q in the predetermined template, and operation of the needle driving mechanism 19 is stopped. In this way, the sample piece Q can be accurately moved to have the predetermined positional relationship with the columnar portion 34 at the predetermined stop position.

Figures 33, 34:
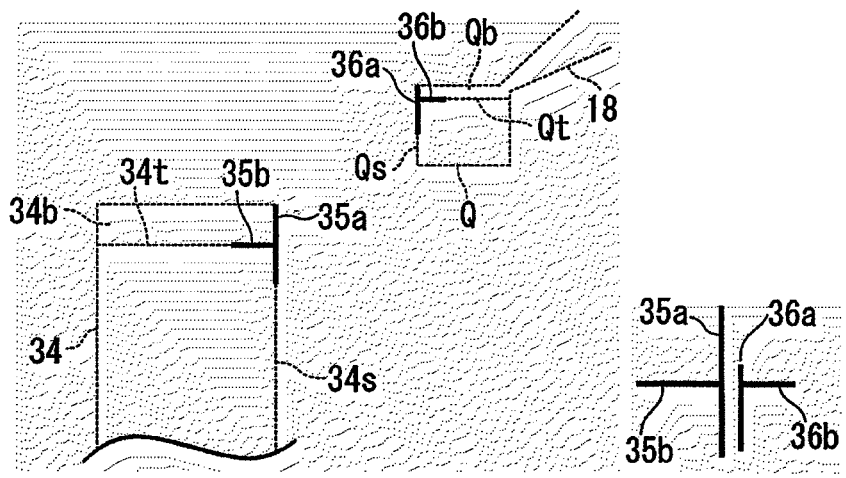
FIG. 33 is an explanatory view illustrating templates created by using the edges of the sample piece and the columnar portion, based on an image formed by an electron beam, in the charged particle beam apparatus according to the embodiment of the present invention.
FIG. 34 is an explanatory view illustrating templates showing a positional relationship between the columnar portion and the sample piece when the columnar portion and the sample piece are connected with each other, in the charged particle beam apparatus according to the embodiment of the present invention.

Further, as another embodiment of the processing of from Step S230 to Step S241, the following may be performed. A line drawing of the edge portion extracted from the secondary particle image or the absorption current image data is limited to only a minimum necessary portion required for positioning the columnar portion 34 and the sample piece Q. FIG. 33 illustrates an example thereof, and the columnar portion 34, the sample piece Q, the outline (drawn in a dotted line), and the extracted edge (drawn in a bold solid line) are illustrated. The to-be-extracted edges of the sample piece Q and the columnar portion 34 are edges 34s and Qs facing each other and parts of edges 34t and Qt at the respective end surfaces 34b and Qb of the columnar portion 34 and the sample piece Q. As the edges of the columnar portion 34, line segments 35a and 35b are sufficient. As the edges of the sample piece Q, line segments 36a and 36b are sufficient. Each line segment is a portion of each edge. With these line segments, for example, a T-shaped template can be created. The stage driving mechanism 13 and the needle driving mechanism 19 are operated to move the corresponding templates thereof. Based on these templates 35a, 35b, 36a, and 36b, the spacing between the columnar portion 34 and the sample piece Q, and the parallelisms and the heights of the columnar portion 34 and the sample piece Q can be determined from the mutual positional relationship. Therefore, the columnar portion 34 and the sample piece Q can be easily aligned. FIG. 34 illustrates a positional relationship between the templates, which corresponds to the predetermined positional relationship between the columnar portion 34 and the sample piece Q, in which the line segments 35a and 36a are parallel to each other at a predetermined interval, and the line segments 35b and 36b are on a straight line. At least one of the stage driving mechanism 13 and the needle driving mechanism 19 is operated and the operated driving mechanism stops when the templates have the positional relationship illustrated in FIG. 30.

In this way, the templates can be used for precise alignment after it is confirmed that the sample piece Q has approached a predetermined columnar portion 34.

Next, as an eleventh modification of the above-described embodiment, another example of the processing of from S220 to S241 will be described.

In the above-described embodiment, the needle 18 is moved in Step S230. When the sample piece Q that has just undergone Step S230 is deviated from a target position by a great distance, the operation described below may be performed.

In Step S220, it is desirable that the sample piece Q is positioned, before the movement, in a region of Y>0 and Z>0 in a three-dimensional rectangular coordinate system having the origin that coincides with the origin of each columnar portion 34. This arrangement is desirable in terms of minimizing the possibility of collision of the sample piece Q with the columnar portion 34 during the movement of the needle 18. Thereby, the sample piece Q can be safely and quickly moved to the target position by simultaneously operating X, Y, and Z driving portions of the needle driving mechanism 19. Meanwhile, when the sample piece Q is positioned, before the movement, in a region of Y<0, when the X, Y, Z driving portions of the needle driving mechanism 19 are simultaneously operated to move the sample piece Q toward the stop position, the sample piece Q is highly likely to collide with the columnar portion 34. Therefore, when the sample piece Q is positioned in the region of Y<0 in Step S220, the needle 18 is guided to the target position avoiding a route on which the columnar portion 34 is disposed. Specifically, the sample piece Q is first moved to a region of Y>0 by driving only the Y-axis of the needle driving mechanism 19 whereby the sample piece Q reaches a predetermined position (for example, a position spaced from the columnar portion 34 by a distance that is twice, three times, five times, or 10 times the width of the target columnar portion 34, etc.), and is then moved toward the final stop position by simultaneously operating the X, Y, and Z driving portions of the needle driving mechanism. In this way, the sample piece Q can be safely and quickly moved while avoiding collision with the columnar portion 34. Meanwhile, when it is confirmed that the X coordinates of the sample piece Q and the columnar portion 34 are the same and the Z coordinate of the sample piece Q is lower than the Z coordinate of the upper end of the columnar portion (Z<0), from the electron beam image and/or the focused ion beam image, the sample piece Q is first moved to a region of Z>0 (for example, the position of Z=2 µm, 3 µm, 5 µm, or 10 µm) and then moved to a predetermined position in the region of Y>0, and finally moved toward the final stop position by simultaneously operating of the X, Y, and Z driving portions of the needle driving mechanism. By moving the sample piece Q in this manner, the sample piece Q can reach the target position without colliding with the columnar portion 34.

Next, a twelfth modification of the above-described embodiment will be described.

In the charged particle beam apparatus 10 according to the present invention, the needle 18 can be pivoted by the needle driving mechanism 19. In the above embodiment, the most basic sampling procedure in which pivoting (axial rotation) of the needle 18 is not used except for the needle trimming has been described. However, in the eleventh modification, an embodiment using axial rotation of the needle 18 will be described.

Since the computer 23 can pivot the needle 18 by operating the needle driving mechanism 19, the computer 23 can control the posture of the sample piece Q as necessary. The computer 23 rotates the sample piece Q extracted from the sample S and fixes the sample piece Q in a state in which the positions of the upper and lower ends and the positions of the right and left ends thereof are adjusted, to the sample piece holder P. The computer 23 fixes the sample piece Q so that the surface of the sample piece Q, which corresponds to the original surface of the sample S from which the sample piece Q is extracted, is parallel or perpendicular to the cross-sectional surface of the columnar portion 34. Thereby, the computer 23 can secure the posture of the sample piece Q, which is suitable for finish processing to be performed later, and reduce the curtain effect or the like occurring in a finish process of lamellating the sample piece Q. The term "curtain effect" refers to a stripe pattern appearing in a direction in which the focused ion beam is irradiated, and results in erroneous interpretation during electron microscopic observation of a processed sample piece. The computer 23 performs eccentricity correction when rotating the needle, thereby correcting the rotation so that the sample piece Q falls within the actual field of view.

Further, the computer 23 shapes the sample piece Q by irradiating the sample piece Q with a focused ion beam as necessary. In particular, it is desirable that the sample piece Q is shaped so that the end face thereof in contact with the columnar portion 34 is substantially parallel to the end face of the columnar portion 34 after the sample piece Q is shaped. The computer 23 performs a shaping process such as cutting a part of the sample piece Q before creating a template to be described later. The computer 23 sets a processing position for the shaping process with reference to the distance from the needle 18. Thereby, the computer 23 facilitates extraction of the edge from the template to be described later, and secures the shape of the sample piece Q suitable for the finish processing to be performed later.

Following Step S150 described above, in regards to the posture control, the computer 23 first drives the needle 18 by using the needle driving mechanism 19, and rotates the needle 18 by an angle corresponding to a posture control mode so that the sample piece Q has a predetermined posture. Here, the posture control mode is a mode in which the sample piece Q is controlled to have a predetermined posture. The needle 18 approaches the sample piece Q while having a predetermined angle with respect to the sample piece Q, and rotates the needle 18 to which the sample piece Q is connected by a predetermined angle, thereby controlling the posture of the sample piece Q. The computer 23 performs eccentricity correction when rotating the needle 18. FIG. 35 to FIG. 40 illustrate these states, and are diagrams illustrating the needle 18 connected to the sample piece Q in a plurality of (for example, three) approach modes.

Figures 35, 36:
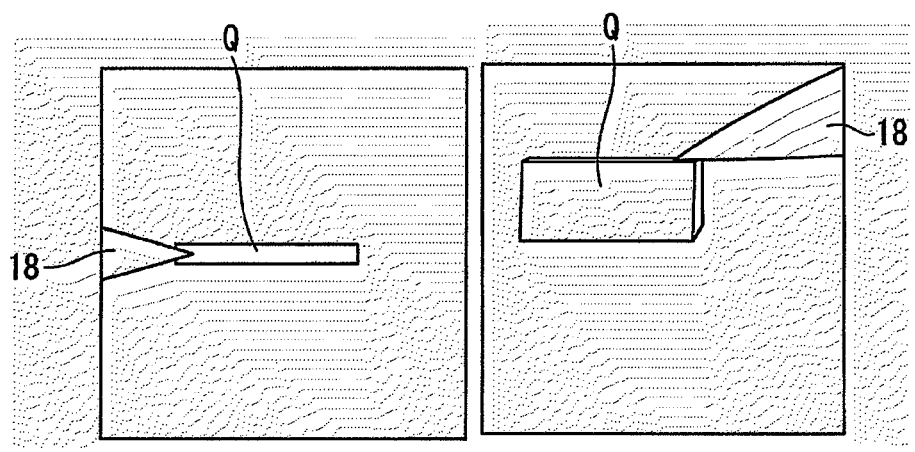
FIG. 35 is a diagram illustrating an approach mode state at a rotation angle of 0° of the needle to which the sample piece is connected, in image data formed by a focused ion beam of the charged particle beam apparatus according to the embodiment of the present invention.
FIG. 36 is a diagram illustrating an approach mode state at a rotation angle of 0° of the needle to which the sample piece is connected, in an image formed by an electron beam of the charged particle beam apparatus according to the embodiment of the present invention.

FIGS. 35 and 36 are diagrams illustrating the states of the needle 18 connected to a sample piece Q in an approach mode in which a rotation angle of the needle 19 is 0°. FIG. 35 illustrates the state of the needle 18 connected to the sample piece Q, in image data formed by a focused ion beam of the charged particle beam apparatus 10 according to the embodiment of the present invention, and FIG. 36 illustrates the state of the needle 18 connected to the sample piece in image data formed by an electron beam. In the approach mode in which the rotation angle of the needle 19 is 0°, the computer 23 sets a posture state suitable for transferring the sample piece Q to the sample piece holder P without rotating the needle 18.

Figure 37:
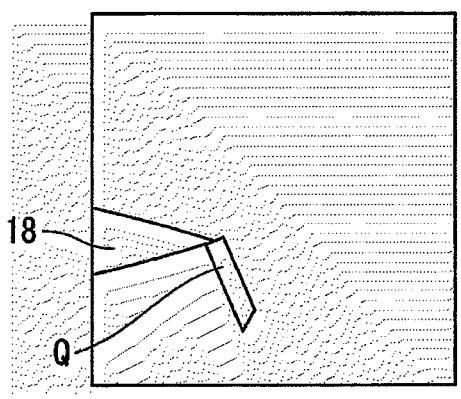
FIG. 37 is a diagram illustrating an approach mode state at a rotation angle of 90° of the needle to which the sample piece is connected, in an image formed by a focused ion beam of the charged particle beam apparatus according to the embodiment of the present invention.
Figure 38:
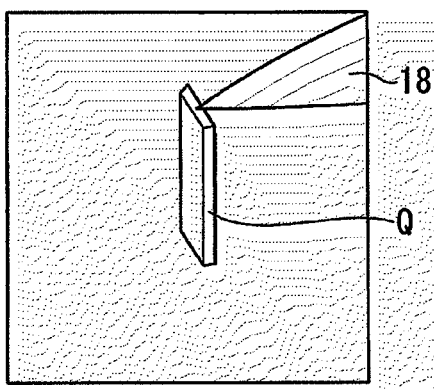
FIG. 38 is a diagram illustrating an approach mode state at a rotation angle of 90° of the needle to which the sample piece is connected, in an image formed by an electron beam of the charged particle beam apparatus according to the embodiment of the present invention.
Figure 41:
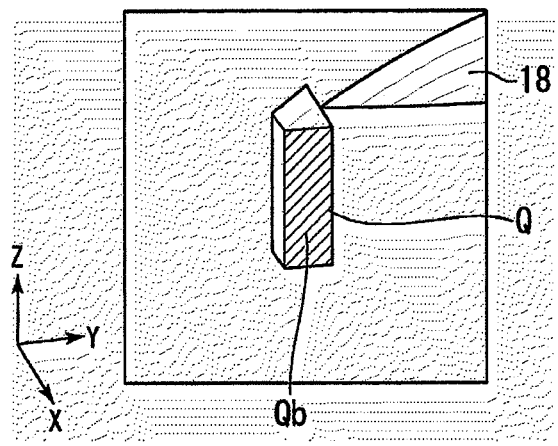
FIG. 41 is an explanatory view for describing preparation of a planar sample piece (lamella) according to one embodiment of the present invention, and is a diagram illustrating an approach mode state at a rotation angle of 90° of the needle to which the sample piece is connected, in an image formed by a focused ion beam of the charged particle beam apparatus according to the present invention.

FIGS. 37 and 38 are diagrams illustrating the states of the needle 18 in an approach mode in which the rotation angle of the needle 18 is 90°. FIG. 41 illustrates the state of the needle 18 connected to the sample piece Q and rotated by 90° in image data formed by a focused ion beam of the charged particle beam apparatus 10 according to the embodiment of the present invention, and FIG. 37 illustrates the state of the needle 18 connected to the sample piece and rotated by 90° in image data formed by an electron beam. In the approach mode in which the needle is rotated by 90°, the computer 23 sets a posture state suitable for transferring the sample piece Q to the sample piece holder P in a state where the needle 18 is rotated by 90°.

Figure 39:
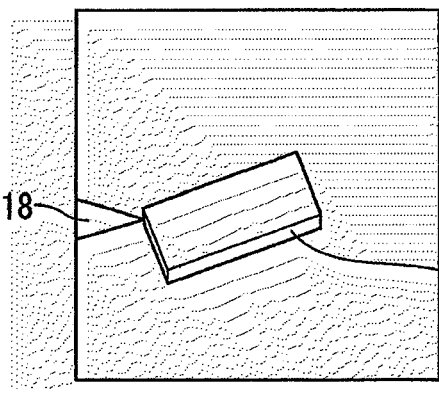
FIG. 39 is a diagram illustrating an approach mode state at a rotation angle of 180° of the needle to which the sample piece is connected, in an image formed by a focused ion beam of the charged particle beam apparatus according to the embodiment of the present invention.
Figure 40:
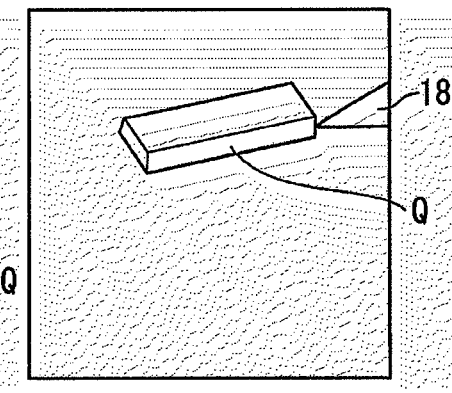
FIG. 40 is a diagram illustrating an approach mode state at a rotation angle of 180° of the needle to which the sample piece is connected, in an image formed by an electron beam of the charged particle beam apparatus according to the embodiment of the present invention.

FIGS. 39 and 40 are diagrams illustrating the states of the needle 18 connected to the sample piece Q in an approach mode in which the rotation angle of the needle 18 is 180°. FIG. 39 illustrates the state of the needle 18 connected to the sample piece Q and rotated by 180° in image data formed by a focused ion beam of the charged particle beam apparatus 10 according to the embodiment of the present invention and FIG. 40 illustrates the state of the needle 18 connected to the sample piece Q and rotated by 180° in image data formed by an electron beam. In the approach mode in which the needle 18 is rotated by a rotation angle of 180°, the computer 23 sets a posture state suitable for transferring the sample piece Q to the sample piece holder P in a state where the needle 18 is rotated by 180°.

The relative connection posture between the needle 18 and the sample piece Q is set to a connection posture suitable for each approach mode when the needle 18 is connected to the sample piece Q in the sample piece pickup process described above.

Next, a thirteenth modification of the above-described embodiment will be described.

In the twelfth modification, an embodiment in which a planar sample piece is manufactured by utilizing the fact that the needle 18 can be rotated by the needle driving mechanism 19 in the charged particle beam device 10 will be described.

The term "planar sample piece (lamella)" refers to a sample piece that is produced by lamellating a sample piece separated and extracted from an original sample and is formed to be parallel to the surface of the original sample in order to observe a surface inside the original sample.

FIG. 41 is a diagram illustrating a state in which a separated and extracted sample piece Q is fixed to the tip of the needle 18. FIG. 45 schematically illustrates an image formed by an electron beam. When fixing the needle 18 to the sample piece Q, the sample piece Q is fixed using the method illustrated in FIGS. 5 to 8. When the rotation axis of the needle 18 is inclined by 45° with respect to the XY plane in FIG. 1, the posture of the sample piece Q is changed such that the upper end surface Qb of the sample piece Q separated and extracted from the original sample is rotated from the horizontal plane (XY plane in FIG. 1) to a plane perpendicular to the XY plane by rotating the needle 18 by 90°.

Figure 42:
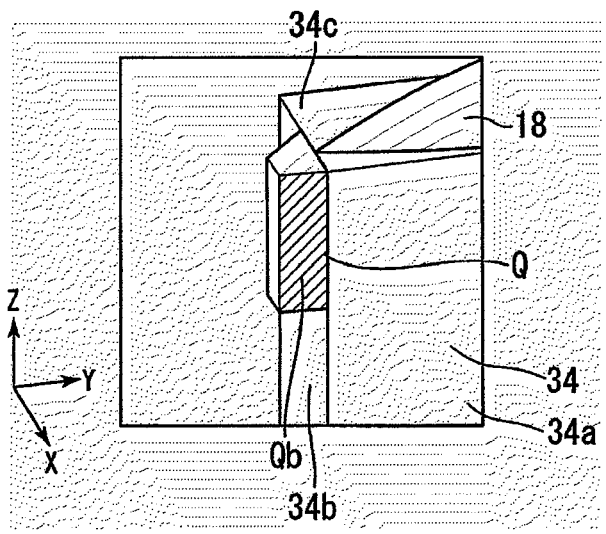
FIG. 42 is an explanatory view for describing preparation of a planar sample piece according to one embodiment of the present invention, and is a diagram illustrating a state in which the separated sample piece is in contact with the sample piece holder.

FIG. 42 is a diagram illustrating a state in which the sample piece Q fixed to the tip of the needle 18 is moved so as to be in contact with the columnar portion 34 of the sample piece holder P. One side surface 34a of the columnar portion 34 is a surface perpendicular to the irradiation direction of an electron beam when observed with a transmission electron microscope, and one side surface (end face) 34b is a surface parallel to the irradiation direction of the electron beam. One side surface (upper end surface 34c) of the columnar portion 34 is a surface perpendicular to the irradiation direction of a focused ion beam in FIG. 1, and is the top surface of the columnar portion 34.

In the present embodiment, the upper end surface Qb of the sample piece Q whose posture is controlled by the needle is moved so as to be parallel to and preferably so as to be flush with the side surface 34a of the columnar portion 34 of the sample piece holder P, and the cross-sectional surface of the sample piece Q is brought into surface contact with the sample piece holder. After it is confirmed that the sample piece is in contact with the sample piece holder, a deposition film is formed on the upper end surface 34c of the columnar portion 34, specifically at a portion where the sample piece and the sample piece holder are in contact with each other. That is, the deposition film is formed to straddle the sample piece and the sample piece holder.

Figure 43:
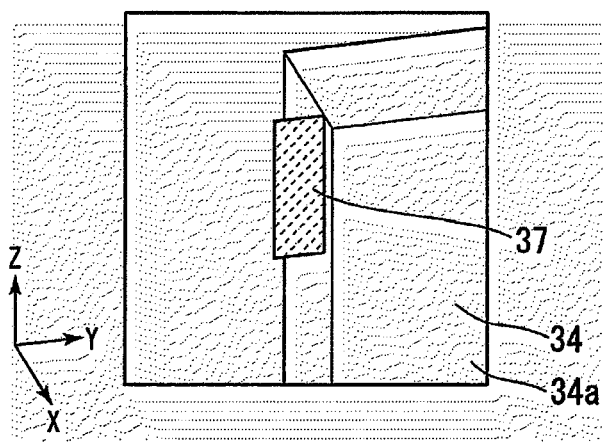
FIG. 43 is an explanatory view for describing preparation of a planar sample piece according to one embodiment of the present invention, and is a diagram illustrating a state in which the planar sample piece can be prepared by lamellating the sample piece fixed to the sample holder.

FIG. 43 is a schematic diagram illustrating a state in which a planar sample piece 37 is manufactured by irradiating a sample piece Q fixed to a sample piece holder with a focused ion beam. The planar sample piece 37 disposed at a predetermined sample depth from the sample surface is manufactured through a process in which a distance from the upper end surface Qb of the sample piece Q to a position where the planar sample piece 37 is to be formed is obtained, and a focused ion beam is directed to the sample piece Q, so that the planar sample piece, which is parallel to the upper end surface Qb of the sample piece Q and has a predetermined thickness, is formed. By preparing such a planar sample piece, it is possible to be aware of the structure and composition distribution inside the sample in parallel with the surface of the sample.

The method for preparing the planar sample piece is not limited thereto. When the sample piece holder is mounted on a mechanism that can be tilted within a range of from 0° to 90°, it is possible to prepare a planar sample piece by rotating the sample stage and tilting the sample holder without rotating a probe. Alternatively, when the needle is inclined at an angle within a range of from 0° to 90° other than an angle of 45°, it is possible to prepare a planar sample piece by appropriately setting the inclination angle of the sample piece holder.

In this way, a planar sample piece can be prepared and a planar surface that is parallel to the surface of a sample at a predetermined depth from the sample surface can be observed with an electron microscope.

In the present embodiment, the extracted and separated sample piece is placed on one side surface of the columnar portion. Although fixing the sample piece to the upper end surface of the columnar portion can be considered, it is preferable that the sample piece is fixed to one side surface of the columnar portion for the following reason: when the sample piece undergoes a lamellation process using a focused ion beam, the focused ion beam hits the upper end surface of the columnar portion, and sputtering particles generated from the site adhere to a lamellate portion of the sample piece, which makes the formed planar sample piece unsuitable for microscopic observation.

Hereinafter, other embodiments will be described.

(a1) A charged particle beam apparatus that is a charged particle beam apparatus for automatically preparing a sample piece from a sample, the charged particle beam apparatus including at least:

a plurality of charged particle beam irradiation optical systems (beam irradiation optical systems), each emitting a charged particle beam;

a sample stage configured to move with the sample placed thereon;

a sample piece transferring device having a needle to be connected to the sample piece to be separated and extracted from the sample and transporting the sample piece;

a holder fixing base configured to hold a sample piece holder having a columnar portion to which the sample piece is to be transferred;

a gas supply unit configured to supply a gas for formation of a deposition film in a state in which the charged particle beam is irradiated; and a computer configured to measure an electric characteristic between the sample piece and the columnar portion and control at least the charged particle beam irradiation optical systems, the sample piece transferring device, and the gas supply unit such that the deposition film is formed to straddle the columnar portion and the sample piece that is stationed with a gap between the sample piece and the columnar portion until the measured electric characteristic reaches a predetermined electric characteristic value.

(a2) A charged particle beam apparatus that is a charged particle beam apparatus for automatically preparing a sample piece from a sample, the charged particle beam apparatus including at least:

a plurality of charged particle beam irradiation optical systems (beam irradiation optical systems), each irradiating a charged particle beam;

a sample stage that moves with the sample placed thereon;

a sample piece transferring device having a needle to be connected to the sample piece to be separated and extracted from the sample and transporting the sample piece;

a holder fixing base configured to a sample piece holder having a columnar portion to which the sample piece is to be transferred;

a gas supply unit configured to supply a gas for formation of a deposition film in a state in which the charged particle beam is irradiated; and a computer configured to measure an electric characteristic between the sample piece and the columnar portion and control at least the charged particle beam irradiation optical systems, the sample piece transferring device, and the gas supply unit such that the deposition film is formed to straddle the columnar portion and the sample piece that is stationed with a gap between the columnar portion and the sample piece for a predetermined time.

(a3) A charged particle beam apparatus that is a charged particle beam apparatus for automatically preparing a sample piece from a sample, the charged particle beam apparatus including at least:

a focused ion beam irradiation optical systems (beam irradiation optical system) configured to irradiate a focused ion beam;

a sample stage that moves with the sample placed thereon;

a sample piece transferring device having a needle to be connected to the sample piece to be separated and extracted from the sample and transporting the sample piece;

a holder fixing base configured to hold a sample piece holder having a columnar portion to which the sample piece is to be transferred;

a gas supply unit configured to supply a gas for formation of a deposition film in a state in which the focused ion beam is irradiated; and a computer configured to measure an electric characteristic between the sample piece and the columnar portion and control at least the focused ion beam irradiation optical system, the sample piece transferring device, and the gas supply unit such that the deposition film is formed to straddle the columnar portion and the sample piece that is stationed with a gap between the columnar portion and the sample piece until the measured electric characteristic reaches a predetermined electric characteristic value.

(a4) A charged particle beam apparatus that is a charged particle beam apparatus for automatically preparing a sample piece from a sample, the charged particle beam apparatus including at least:

a focused ion beam irradiation optical systems (beam irradiation optical system) configured to irradiate a focused ion beam;

a sample stage configured to move with the sample placed thereon;

a sample piece transferring device having a needle to be connected to the sample piece to be separated and extracted from the sample and transporting the sample piece;

a holder fixing base configured to hold a sample piece holder having a columnar portion to which the sample piece is to be transferred;

a gas supply unit configured to supply a gas for formation of a deposition film in a state in which the focused ion beam is irradiated; and a computer configured to measure an electric characteristic between the sample piece and the columnar portion and control at least the focused ion beam irradiation optical system, the sample piece transferring device, and the gas supply unit such that the deposition film is formed to straddle the columnar portion and the sample piece that is stationed with a gap between the columnar portion and the sample piece for a predetermined time.

(a5) In the charged particle beam apparatus according to (a1) or (a2), the charged particle beam includes at least a focused ion beam and an electron beam.

(A6) In the charged particle beam apparatus according to any one of (a1) to (a4), the electrical characteristic is at least one of an electrical resistance, a current, and an electrical potential.

(a7) In the charged particle beam apparatus according to any one of (a1) to (a6), the computer moves the sample piece such that the gap between the sample piece and the columnar portion is reduced when the electrical characteristic does not reach a predetermined electrical characteristic value in a predetermined deposition film formation time and controls at least the beam irradiation optical system, the sample piece transferring device, and the gas supply unit such that the deposition film is formed to straddle the columnar portion and the sample piece that is stationed.

(a8) In the charged particle beam apparatus according to any one of (a1) to (a6), the computer controls at least the beam irradiation optical system and the gas supply unit such that formation of the deposition film is stopped when the electrical characteristic between the sample piece and the columnar portion satisfies a predetermined electrical characteristic value in a predetermined deposition film formation time.

(a9) In the charged particle beam apparatus according to (a1) or (a3), the gap has a size of 1 μm or less.

(a10) In the charged particle beam apparatus according to (a9), the gap has a size of 100 nm or more and 200 nm or less.

(b1) A charged particle beam apparatus that is a charged particle beam apparatus for automatically preparing a sample piece from a sample, the charged particle beam apparatus including:

a charged particle beam irradiation optical system configured to irradiate a charged particle beam;

a sample stage configured to move with the sample placed thereon;

a sample piece transferring device configured to hold and transport the sample piece separated and extracted from the sample;

a holder fixing base configured to hold a sample piece holder having a columnar portion to which the sample piece is to be transferred; and a computer configured to create a template of the columnar portion based on an image of the columnar portion acquired by scanning the charged particle beam and to control the charged particle beam irradiation optical system and the sample piece transferring device with reference to position information obtained through template matching using the template such that the sample piece is transferred to the columnar portion.

(b2) In the charged particle beam apparatus described (b1), the sample piece holder includes a plurality of columnar portions spaced from each other as the columnar portion, and the computer creates templates of the respective columnar portions based on the images of the respective columnar portions.

(b3) In the charged particle beam apparatus described in (b2), the computer performs a determination process of determining whether or not a shape of a target columnar portion selected among the plurality of columnar portions matches a predetermined shape that is previously registered, through template matching using the templates of the respective columnar portions, wherein when the shape of the target columnar portion does not match the predetermined shape, the computer sets another columnar portion as a new target columnar portion and performs the determination process with respect to the new target columnar portion, and wherein when the shape of the target columnar portion matches the predetermined shape, the computer controls movement of the charged particle beam irradiation optical system and either the sample piece transferring device or the sample stage such that the sample piece is transferred the target columnar portion.

(b4) In the charged particle beam apparatus according to (b2) or (b3), when controlling movement of the sample stage such that the target columnar portion among the plurality of columnar portions is disposed at a predetermined position, the computer initializes a position of the sample stage when it is determined that the target columnar portion is not disposed at the predetermined position.

(b5) In the charged particle beam apparatus described in (b4), when controlling the movement of the sample stage such that the target columnar portion among the plurality of columnar portions is disposed at the predetermined position, the computer performs a shape determination process of determining whether the shape of the target columnar shape is normal or abnormal after the sample stage is moved, wherein when the shape of the target columnar shape is abnormal, the computer sets another columnar portion as a new target columnar portion, controls the movement of the sample stage such that the new target columnar portion is disposed at the predetermined position, and performs the shape determination process.

(b6) In the charged particle beam apparatus according to any one of (b1) to (b5), the computer creates a template of the columnar portions prior to separating and extracting the sample piece from the sample.

(b7) In the charged particle beam apparatus described in (b3), the computer records images of the respective columnar portions of the plurality of columnar portion, edge information extracted from each image, or design information of each of the plurality of columnar portions as the templates, and determines whether or not the shape of the target columnar portion matches the predetermined shape in accordance with scores of template matching using the templates.

(b8) In the charged particle beam apparatus according to any one of (b1) to (b7), the computer records an image acquired by irradiating, with the charged particle beam, the columnar portion to which the sample piece is transferred, and position information of the columnar portion to which the sample piece is transferred.

(c1) A charged particle beam apparatus that is a charged particle beam apparatus for automatically preparing a sample piece from a sample, the charged particle beam apparatus including:

a charged particle beam irradiation optical system configured to irradiate a charged particle beam;

a sample stage configured to move with the sample placed thereon;

a sample piece transferring device configured to hold and transport the sample piece separated and extracted from the sample;

a holder fixing base configured to hold a sample piece holder having a columnar portion to which the sample piece is to be transferred;

a gas supply unit configured to supply a gas for formation of a deposition film in a state in which the charged particle beam is irradiated;

a computer configured to control the charged particle beam irradiation optical system and the sample piece transferring device such that the charged particle beam is irradiated to the deposition film attached to the sample piece transferring device after the sample piece transferring device is separated from the sample piece.

(c2) In the charged particle beam apparatus described in (c1), the sample piece transferring device repeats holding and transporting the sample piece separated and extracted from the sample a plurality of times.

(c3) In the charged particle beam apparatus according to (c1) or (c2), the computer repeatedly controls the particle beam irradiation optical system and the sample piece transferring device such that the charged particle beam is irradiated to the deposition film attached to the sample piece transferring device at predetermined timing including at least timing at which the sample piece transferring device is separated from the sample piece.

(c4) In the charged particle beam apparatus according to any one of (c1) to (c3), the computer initializes a position of the sample piece transferring device when the sample piece transferring device is not disposed at a predetermined position, at the time of controlling the sample piece transferring device such that the sample piece transferring device separated from the sample piece is disposed at the predetermined position.

(c5) In the charged particle beam apparatus described in (c4), when the sample piece transferring device is not disposed at the predetermined position even though movement of the sample piece transferring device is controlled after the position of the sample piece transferring device is initialized, the computer stops controlling the sample piece transferring device.

(c6) In the charged particle beam apparatus according to any one of (c1) to (c5), the computer creates a template of the sample piece transferring device based on an image acquired by irradiating the sample piece transferring device with the charged particle beam before the sample piece transferring device is connected to the sample piece, and controls the charged particle beam irradiation optical system and the sample piece transferring device based on outline information obtained through template matching using the template such that the charged particle beam is irradiated to the deposition film attached to the sample piece transferring device.

(c7) In the charged particle beam apparatus according to (c6), a display device that displays the outline information thereon is further included.

(c8) In the charged particle beam apparatus according to any one of (c1) to (c7), the computer performs eccentricity correction when the sample piece transferring device is rotated around a central axis so that the sample piece transferring device has a predetermined posture.

(c9) In the charged particle beam apparatus according to any one of (c1) to (c8), the sample piece transferring device includes a needle or tweezers connected to the sample piece.

In the embodiments described above, the computer 23 also includes a software function unit or a hardware function unit such as an LSI.

Although as the needle 18, a needle-shaped member with a sharp tip has been described in the above-described embodiments, the needle 18 may have a flat chisel shape having a flat tip.

The present invention can be applied to a case where at least the sample piece Q to be extracted is formed of carbon. According to the present invention, it is possible to move an object to a desired position using a template and position coordinates of a needle tip. In other words, when the extracted sample piece Q is transferred to the sample holder P in a state of being fixed to the tip of the needle 18, the needle 18 to which the sample piece Q is fixed can be controlled such that the sample piece Q approaches the sample piece holder P and stops at a position spaced from the sample piece holder P, by using the coordinates of the actual tip (the tip coordinates of the sample piece) acquired from a secondary electron image formed by irradiating an irradiation target with a charged particle beam, and the template of the needle 18 generated from an absorption current image of the needle 18 to which the sample piece Q is attached.

In addition, the present invention can be applied to other apparatuses. For example, in a charged particle beam apparatus that measures an electric characteristic of a minute portion by bringing a probe into contact with the minute portion, particularly in an apparatus which is equipped with a metal probe inside a sample chamber of a scanning electron microscope and uses an electron as a charged particle beam, and in a charged particle beam apparatus that measures an electrical characteristic using a tungsten probe provided with a carbon nanotube at the tip thereof to be brought into contact with a conductive portion of a fine region, it is difficult to recognize the tip of the tungsten probe in a conventional secondary electron image due to the background which may include a wire pattern. For this reason, an absorption current image is used to make it easier to recognize a tungsten probe. However, with the absorption current image, the tip of a carbon nanotube cannot be recognized and thus the carbon nanotube cannot be brought into contact with a critical measurement point. Therefore, in the present invention, the coordinates of the actual tip of the needle 18 are specified by using a secondary electron image, and the templates are created by using an absorption current image. Thereby, the probe provided with the carbon nanotube can be moved to and brought into contact with a specific measurement position.

In addition, the sample piece Q prepared with the use of the charged particle beam apparatus 10 according to the present invention may be introduced into another focused ion beam apparatus and carefully further processed to have a thickness suitable for transmission electron microscopic analysis by an operator. Thus, when the charged particle beam apparatus 10 according to the present invention and a focused ion beam apparatus are used in combination, it is possible to fix a plurality of sample pieces Q to a sample piece holder P unattended during the night time, and the sample pieces Q can be finished as ultrathin specimens for transmission electron microscopic observation by a careful operator during the day time. Therefore, mental and physical burdens of an operator can be greatly reduced as compared with the related art in which a series of operations from sample extraction to lamellation are performed by a single apparatus while relying on an operator's manipulation. Therefore, work efficiency can be improved.

In addition, the above embodiments are presented for illustrative purposes, and are not intended to limit the scope of the present invention. These novel embodiments can be implemented in various other forms, and omissions, substitutions, and changes thereof are possible without departing from the spirit of the invention. These embodiments and modifications thereof are included in the scope or gist of the invention, and are included in the invention described in the following claims and the equivalent scope thereof.

For example, in the charged particle beam apparatus 10 according to the present invention, although the needle 18 has been described as a means for extracting the sample piece Q, the present invention is not limited thereto. The sample piece extracting device may be tweezers that can be finely controlled. When tweezers are used as the sample piece extracting device, the sample piece Q can be extracted without requiring a deposition process and there is no fear of wearing of the tip or the like. Even in the case of using the needle 18 for extraction of the sample piece Q, a connection method of connecting the needle with the sample piece Q is not limited to a deposition process. The connection between the needle and the sample piece Q can be performed in a manner that the needle 18 imparted with electrostatic force is brought into contact with the sample piece Q and thus the sample piece Q is adsorbed onto the needle due to electrostatic force.

What is claimed is:

1. A charged particle beam apparatus for automatically preparing a sample piece from a sample, the charged particle beam apparatus comprising:
    a charged particle beam irradiation optical system configured to radiate a charged particle beam;
    a gas supply unit configured to supply gas to form a deposition film by irradiation with a focused ion beam from the charged particle beam irradiation optical system,
    a sample stage configured to move with the sample placed thereon;
    a sample piece transferring device configured to hold and transport the sample piece separated and extracted from the sample;
    a holder fixing base configured to hold a sample piece holder to which the sample piece is to be transferred;
    an electrical conduction sensor configured to detect electrical conduction between the sample piece transferring device and an object; and
    a computer configured to:
    switch to a time management mode from a conduction management mode, determining, in case the electrical conduction sensor does not detect electrical conduction between the sample piece transferring device and the sample piece when connecting the sample piece transferring device and the sample piece, and
    switch to the conduction management mode from the time management mode in case the electrical conduction sensor detects electrical conduction between the sample piece transferring device and the sample piece holder when connecting the sample piece held by the sample piece transferring device and the sample piece holder while the time management mode is set,
    the time management mode is an algorithm performed by the computer for determining whether or not a process of connection and separation between the sample piece transferring device and the sample piece is completed and whether or not a process of connection between the sample piece held by the sample piece transferring device and the sample piece holder is completed, based on whether or not a predetermined time for each of the processes to continue has elapsed,
    the conduction management mode is an algorithm performed by the computer for determining whether or not a process of connection and separation between the sample piece transferring device and the object is completed, based on whether or not there is electrical conduction between the sample piece transferring device and the object,
    the connection between the sample piece transferring device and the sample piece and the connection between the sample piece and the sample piece holder are made as a result of formation of the deposition film, and
    the separation between the sample piece transferring device and the sample piece is made as a result of radiation of the focused ion beam.

2. The charged particle beam apparatus according to claim 1, wherein the computer cancels the time management mode in case the electrical conduction sensor detects electrical conduction between the sample piece transferring device and the sample piece holder when connecting the sample piece held by the sample piece transferring device and the sample piece holder while the time management mode is set.

3. The charged particle beam apparatus according to claim 1, wherein the computer sets the time management mode in case the electrical conduction sensor does not detect electrical conduction between the sample piece transferring device and the sample piece holder when connecting the sample piece held by the sample pieced transferring device and the sample piece holder while the time management is not set.

4. The charged particle beam apparatus according to claim 1, wherein the computer relatively enhances contrast of the image when an image of the sample piece or the sample piece holder is acquired by irradiation with the charged particle beam while the time management mode is set, compared with while the time management mode is not set.

5. The charged particle beam apparatus according to claim 1, wherein the computer, in case the time management mode is set, performs at least one of storage, output, or formation on an object by irradiation with the charged particle beam of information showing that the time management mode is set.

6. The charged particle beam apparatus according to claim 1, wherein the computer sets a conduction management mode, determining, in case the electrical conduction sensor detects electrical conduction between the sample piece transferring device and the object when connecting the sample piece transferring device and the object, whether or not connection or separation of the sample piece transferring device and the object is completed in a process of connection or separation of the sample piece transferring device and the object, based on whether or not there is electrical conduction between the sample piece transferring device and the object.

7. The charged particle beam apparatus according to claim 1, wherein the sample piece transferring device comprises a needle configured to hold and transport the sample piece separated and extracted from the sample, and a needle driving mechanism configured to drive the needle, and the electrical conduction sensor detects at least any one among electrical resistance, current, and electrical potential as an electrical characteristic between the needle and the sample piece and an electrical characteristic between the needle and the sample piece holder.

8. The charged particle beam apparatus according to claim 7, wherein the computer controls the charged particle beam irradiation optical system, the needle driving mechanism, and the gas supply unit such that, when connecting the sample piece transferring device and the sample piece, after the needle is brought close to the sample piece, the needle and the sample piece are connected by the deposition film, and the computer controls the charged particle beam irradiation optical system, the needle driving mechanism, and the gas supply unit such that, when connecting the sample piece held by the sample piece transferring device and the sample piece holder, after the sample piece held by the needle is brought close to the sample piece holder, the sample piece held by the needle and the sample piece holder are connected by the deposition film.

* * * * *